United States Patent
Kim et al.

(10) Patent No.: US 12,431,388 B2
(45) Date of Patent: Sep. 30, 2025

(54) CONFORMAL TITANIUM SILICON NITRIDE-BASED THIN FILMS AND METHODS OF FORMING SAME

(71) Applicant: Eugenus, Inc., San Jose, CA (US)

(72) Inventors: Hae Young Kim, San Jose, CA (US); Hyunchol Cho, Milpitas, CA (US); Ajit Dhamdhere, San Jose, CA (US); Bunsen B. Nie, Fremont, CA (US)

(73) Assignee: Eugenus, Inc., San Jose, CA (US)

( * ) Notice: Subject to any disclaimer, the term of this patent is extended or adjusted under 35 U.S.C. 154(b) by 799 days.

(21) Appl. No.: 17/714,935

(22) Filed: Apr. 6, 2022

(65) Prior Publication Data
US 2022/0301928 A1    Sep. 22, 2022

Related U.S. Application Data

(63) Continuation-in-part of application No. 16/595,916, filed on Oct. 8, 2019, now Pat. No. 11,361,992.
(Continued)

(51) Int. Cl.
*H01L 21/768* (2006.01)
(52) U.S. Cl.
CPC .............................. *H01L 21/76843* (2013.01)
(58) Field of Classification Search
CPC ......... H01L 21/76843; H01L 21/76877; H01L 21/76846; H01L 21/76861; H01L 21/2855
See application file for complete search history.

(56) References Cited

U.S. PATENT DOCUMENTS 5,654,219 A    8/1997  Huber
6,482,733 B2  11/2002  Raaijmakers et al.
(Continued)

FOREIGN PATENT DOCUMENTS

CN    101819944 A    9/2010
CN    104081531 B    6/2017
(Continued)

OTHER PUBLICATIONS

International Search Report and Written Opinion dated Jan. 5, 2021 in Application No. PCT/US2020/050639 in 16 pages.
International Preliminary Report on Patentability dated Apr. 21, 2022 in Application No. PCT/US2020/050639 in 15 pages.
International Search Report and Written Opinion dated Jun. 16, 2022 in PCT Application No. PCT/US2022/71574 in 13 pages.
International Search Report and Written Opinion dated Jun. 13, 2022 in PCT Application No. PCT/US2022/71578 in 11 pages.
Engberg et al., "Resolving Mass Spectral Overlaps in Atom Probe Tomography by Isotopic Substitutions: Case of TiSi15N", Ultramicroscopy, 2018, vol. 184, Part A, pp. 51-60. https://doi.org/10.1016/j.ultramic.2017.08.004.
(Continued)

*Primary Examiner* — Zandra V Smith
*Assistant Examiner* — John M Parker
(74) *Attorney, Agent, or Firm* — Knobbe, Martens, Olson & Bear, LLP

(57) ABSTRACT

The disclosed technology generally relates to forming a titanium nitride-based thin films, and more particularly to a conformal and smooth titanium nitride-based thin films and methods of forming the same. In one aspect, a method of forming a diffusion barrier comprising TiSiN comprises exposing a semiconductor substrate to one or more first deposition phases alternating with one or more second deposition phases. Exposing the semiconductor substrate to the one or more first deposition phases comprises alternatingly exposing the semiconductor substrate to a titanium (Ti) precursor and a nitrogen (N) precursor. Exposing the semiconductor substrate to the one or more second deposition phases comprises sequentially exposing the semiconductor substrate to the Ti precursor and a silicon (Si) precursor without an intervening exposure to the N precursor therebetween, followed by exposing the semiconductor substrate to the N precursor.

23 Claims, 39 Drawing Sheets

Related U.S. Application Data

(60) Provisional application No. 63/172,002, filed on Apr. 7, 2021, provisional application No. 63/171,970, filed on Apr. 7, 2021.

(56) References Cited

U.S. PATENT DOCUMENTS

| | | |
|---|---|---|
| 6,831,003 B1 | 12/2004 | Huang et al. |
| 6,911,391 B2 * | 6/2005 | Yang .............. H01J 37/3244 |
| | | 438/653 |
| 6,919,273 B1 | 7/2005 | Otsuki et al. |
| 7,514,353 B2 | 4/2009 | Weidman et al. |
| 7,833,906 B2 | 11/2010 | Knapp et al. |
| 9,099,473 B2 | 8/2015 | Kim et al. |
| 9,159,608 B2 | 10/2015 | Park et al. |
| 9,947,667 B2 | 4/2018 | Kang et al. |
| 10,276,583 B2 | 4/2019 | Sharangpani et al. |
| 11,107,985 B2 | 8/2021 | Soncini et al. |
| 11,361,992 B2 | 6/2022 | Mukherjee et al. |
| 11,401,607 B2 | 8/2022 | Vats et al. |
| 11,482,413 B2 | 10/2022 | Jung et al. |
| 11,587,784 B2 | 2/2023 | Jung et al. |
| 11,832,537 B2 | 11/2023 | Heo et al. |
| 11,942,365 B2 | 3/2024 | Vats et al. |
| 12,165,918 B2 | 12/2024 | Mukherjee et al. |
| 2002/0000598 A1 | 1/2002 | Kang et al. |
| 2002/0031911 A1 | 3/2002 | Huang et al. |
| 2002/0084529 A1 | 7/2002 | Dubin et al. |
| 2002/0155700 A1 | 10/2002 | Tai-Ju et al. |
| 2002/0173142 A1 | 11/2002 | Vanhealemeersch et al. |
| 2004/0232467 A1 | 11/2004 | Otsuki et al. |
| 2004/0266175 A1 | 12/2004 | Chen et al. |
| 2005/0124153 A1 | 6/2005 | Cohen |
| 2005/0277290 A1 | 12/2005 | Yang et al. |
| 2006/0003557 A1 | 1/2006 | Pyo |
| 2006/0251800 A1 | 11/2006 | Weidman et al. |
| 2007/0045854 A1 | 3/2007 | Lim et al. |
| 2008/0286899 A1 | 11/2008 | Jung |
| 2009/0226611 A1 | 9/2009 | Suzuki et al. |
| 2010/0151681 A1 | 6/2010 | Knapp et al. |
| 2014/0273452 A1 | 9/2014 | Bloomberg et al. |
| 2015/0050806 A1 | 2/2015 | Park et al. |
| 2015/0279683 A1 | 10/2015 | Harada |
| 2017/0194204 A1 | 7/2017 | Sowa |
| 2017/0373197 A1 | 12/2017 | Sharangpani et al. |
| 2018/0122646 A1 | 5/2018 | Adusumilli et al. |
| 2018/0158917 A1 | 6/2018 | Odnoblyudov et al. |
| 2018/0347040 A1 | 12/2018 | Vats et al. |
| 2018/0350657 A1 | 12/2018 | Vats et al. |
| 2019/0267383 A1 | 8/2019 | Rocklein et al. |
| 2019/0273145 A1 | 9/2019 | Chiu et al. |
| 2019/0304790 A1 | 10/2019 | Mousa et al. |
| 2019/0360120 A1 | 11/2019 | Meldrim et al. |
| 2020/0294789 A1 | 9/2020 | Woodruff et al. |
| 2022/0301929 A1 | 9/2022 | Dhamdhere et al. |
| 2023/0037972 A1 | 2/2023 | Kim et al. |
| 2023/0324786 A1 | 10/2023 | Van Zwol et al. |

FOREIGN PATENT DOCUMENTS

| | | |
|---|---|---|
| CN | 110800083 A | 2/2020 |
| CN | 106992196 B | 12/2021 |
| JP | 2001-217206 A | 8/2001 |
| JP | 2011-513983 A | 4/2011 |
| KR | 10-2006-0079144 A | 7/2006 |
| KR | 10-2047069 B1 | 11/2019 |
| KR | 10-2023-0047970 A | 4/2023 |
| KR | 10-2023-0128998 A | 9/2023 |
| KR | 10-2578481 B1 | 9/2023 |
| TW | 201445001 A | 12/2014 |
| WO | WO 2008/151104 | 12/2008 |
| WO | WO 2021/071628 | 9/2020 |
| WO | WO 2022/217240 A1 | 10/2022 |
| WO | WO 2022/217241 A1 | 10/2022 |
| WO | WO 2023/121814 A1 | 6/2023 |

OTHER PUBLICATIONS

Yazdi et al., "Properties of TiSiN coatings deposited by hybrid HiPIMS and pulsed-DC magnetron co-sputtering", ScienceDirect, Nov. 2014, vol. 109, pp. 43-51.

International Search Report and Written Opinion dated Mar. 7, 2025 in PCT Application No. PCT/US2024/056715 in 10 pages.

Office Action dated Mar. 13, 2024 in Taiwan Application No. 109134681 in 19 pages.

Office Action issued in Japanese Patent Application No. 2022-520984 dated Oct. 22, 2024 in 11 pages.

Office Action dated Jun. 10, 2025 in Taiwan Application No. 111113319 in 10 pages.

Office Action dated Jun. 25, 2025 in Japan Application No. 2022-520985 in 8 pages.

\* cited by examiner

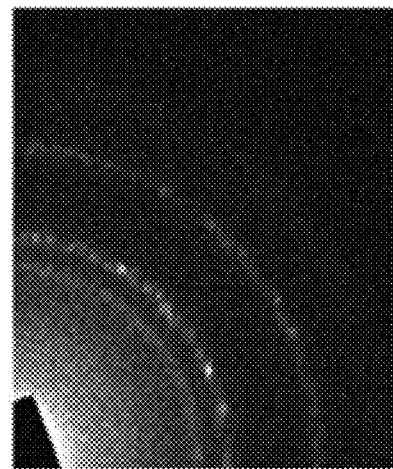
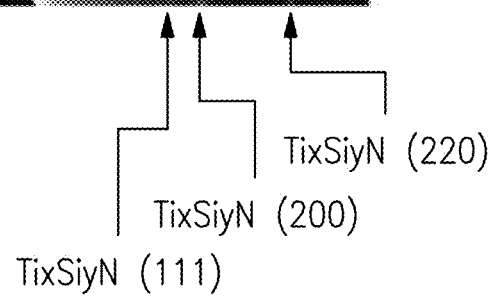
FIG.7C
FIG.7B
FIG.7A

1602 — EXPOSING A SEMICONDUCTOR SUBSTRATE TO ONE OR MORE FIRST DEPOSITION PHASES ALTERNATING WITH AND WITHOUT OVERLAPPING WITH ONE OR MORE SECOND DEPOSITION PHASES

1604 — WHEREIN EXPOSING THE SEMICONDUCTOR SUBSTRATE TO THE ONE OR MORE FIRST DEPOSITION PHASES COMPRISES ALTERNATINGLY EXPOSING THE SEMICONDUCTOR SUBSTRATE TO A TITANIUM (Ti) PRECURSOR AND A NITROGEN (N) PRECURSOR

1606 — WHEREIN EXPOSING THE SEMICONDUCTOR SUBSTRATE TO THE ONE OR MORE SECOND DEPOSITION PHASES COMPRISES EXPOSING THE SEMICONDUCTOR SUBSTRATE TO THE Ti PRECURSOR FOR A Ti PRECURSOR EXPOSURE DURATION, FOLLOWED BY A SILICON (Si) PRECURSOR FOR A Si PRECURSOR EXPOSURE DURATION, FOLLOWED BY THE N PRECURSOR, WHERIN A RATIO OF THE Si PRECURSOR EXPOSURE DURATION TO THE Ti PRECURSOR EXPOSURE DURATION IS BETWEEN 2 AND 130.

FIG.16

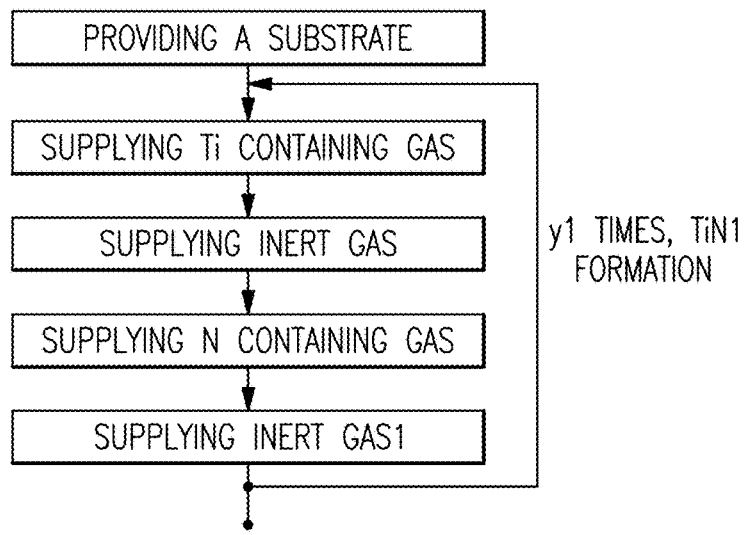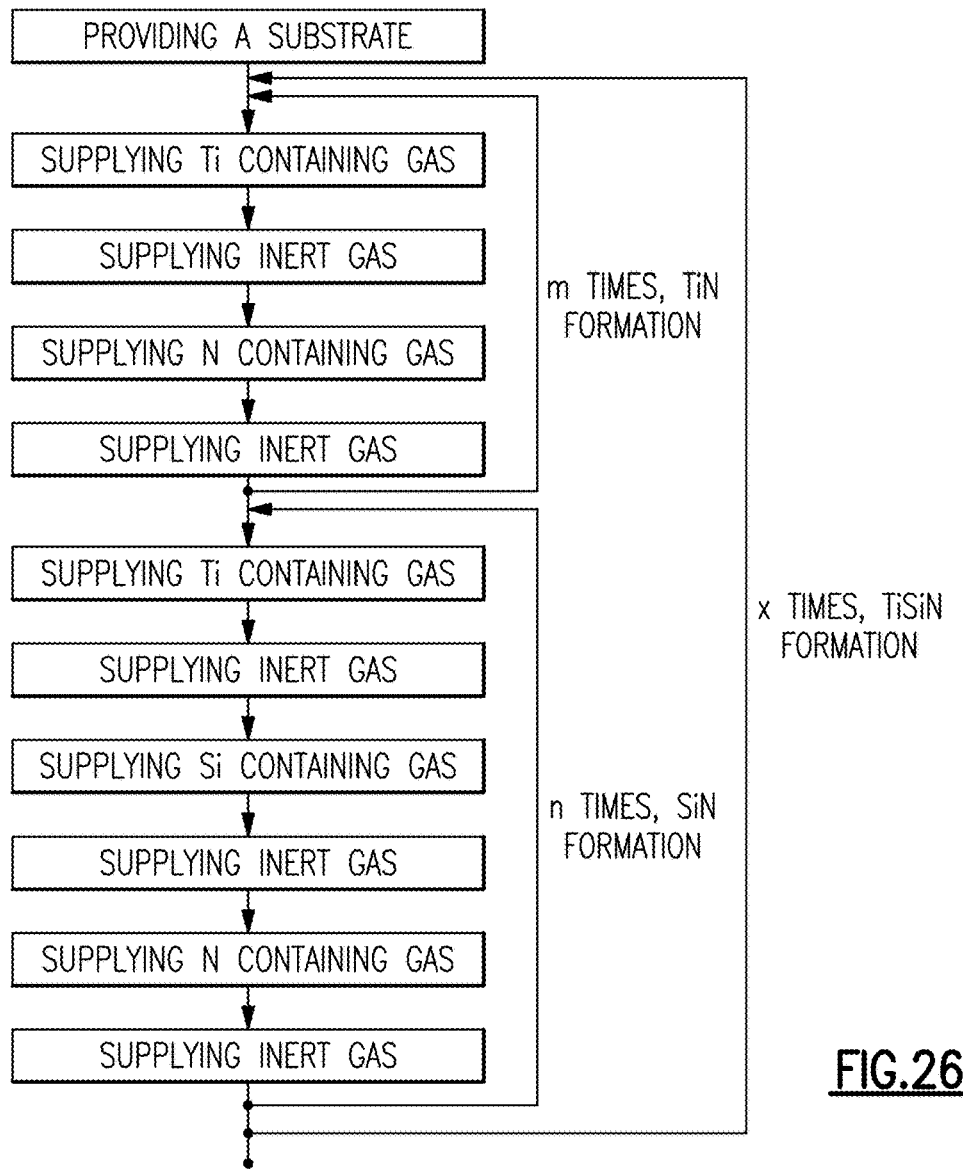
FIG.26C

2902 — forming a diffusion barrier comprising TiSiN by exposing a semiconductor substrate to one or more first deposition phases alternating with one or more second deposition phases, the diffusion barrier having:
    a modulus exceeding 290 GPa and a Si content exceeding 2.7 atomic % by exposing a semiconductor substrate to one or more first deposition phases alternating with one or more second deposition phases; or
    a hardness exceeding 20 GPa and a Si content exceeding 2.7 atomic %; or
    a crystalline texture such that a grazing incidence X-ray diffraction spectrum of the diffusion barrier exhibits a ratio of an area of under a (002) peak and a sum of areas under (111) and (222) peaks exceeding 0.4 and a Si content exceeding 2.7 atomic %; or
    a nanocrystalline structure having an average grain size that is less than about 6.5 nm and a Si content exceeding 2.7%

2904 — exposing the semiconductor substrate to the one or more first deposition phases comprises alternatingly exposing the semiconductor substrate to a titanium (Ti) precursor and a nitrogen (N) precursor 2906 — exposing the semiconductor substrate to the one or more second deposition phases comprises sequentially exposing the semiconductor substrate to the Ti precursor, followed by a silicon (Si) precursor, followed by the N precursor

FIG. 29

CONFORMAL TITANIUM SILICON NITRIDE-BASED THIN FILMS AND METHODS OF FORMING SAME

INCORPORATION BY REFERENCE TO ANY PRIORITY APPLICATIONS

Any and all applications for which a foreign or domestic priority claim is identified in the Application Data Sheet as filed with the present application are hereby incorporated by reference under 37 CFR 1.57.

This application is a continuation in part of U.S. application Ser. No. 16/595,916, filed Oct. 8, 2019, entitled "CONFORMAL TITANIUM NITRIDE-BASED THIN FILMS AND METHODS OF FORMING THE SAME," and claims the priority benefit under 35 U.S.C. § 119(e) to U.S. Provisional Application No. 63/171,970, filed Apr. 7, 2021, entitled "CONFORMAL TITANIUM NITRIDE-BASED THIN FILMS AND METHODS OF FORMING THE SAME," and claims the priority benefit under 35 U.S.C. § 119(e) to U.S. Provisional Application No. 63/172,002, filed Apr. 7, 2021, entitled "CONFORMAL TITANIUM NITRIDE-BASED THIN FILMS AND METHODS OF FORMING THE SAME," the content of each which is hereby expressly incorporated by reference in its entirety.

BACKGROUND

Field

The disclosed technology generally relates to forming a titanium nitride-based thin films, and more particularly to a conformal and smooth titanium nitride-based thin films.

Description of the Related Art

Thin films based on titanium nitride (TiN) have been widely used in fabrication of various structures in integrated circuits (ICs). For example, TiN has been used in diffusion barriers, various electrodes and metallization structures. Such wide usage of TiN in IC fabrication can be attributed to its structural, thermal and electrical properties. As the dimensions of various IC structures shrink, TiN is formed on features having increasingly smaller dimensions and complex topologies. For example, as the technology node scales to 10 nm node and beyond, there is a need for thin films, e.g., diffusion barriers, that can conformally line high aspect ratio trenches and vias having dimensions as small as few nanometers. While techniques such as physical vapor deposition (PVD) and chemical vapor deposition (CVD) have been used in the IC industry to form TiN diffusion barriers, the increased need for conformality of TiN films to be deposited in smaller trenches or vias may eventually limit their usage. On the other hand, while atomic layer deposition (ALD) has been demonstrated for conformal deposition of TiN films, some electrical properties (e.g., conductivity) and physical properties (e.g., surface roughness) of the film may be inferior compared to TiN films formed using other methods such as physical vapor deposition (PVD). Thus, there is a need for deposition methods for forming TiN-based films with superior properties, including barrier characteristics, surface smoothness and step coverage, relative to TiN films formed by, e.g., PVD and CVD, for use in IC fabrication.

SUMMARY

In one aspect, a method of forming a diffusion barrier comprising TiSiN comprises exposing a semiconductor substrate to one or more first deposition phases alternating with and without overlapping with one or more second deposition phases. Exposing the semiconductor substrate to the one or more first deposition phases comprises alternatingly exposing the semiconductor substrate to a titanium (Ti) precursor and a nitrogen (N) precursor. Exposing the semiconductor substrate to the one or more second deposition phases comprises sequentially exposing the semiconductor substrate to the Ti precursor and a silicon (Si) precursor without an intervening exposure to the N precursor therebetween, followed by exposing the semiconductor substrate to the N precursor.

In another aspect, a method of forming a diffusion barrier comprising TiSiN comprises exposing a semiconductor substrate to one or more first deposition phases alternating with and without overlapping with one or more second deposition phases. Exposing the semiconductor substrate to the one or more first deposition phases comprises alternatingly exposing the semiconductor substrate to a titanium (Ti) precursor and a nitrogen (N) precursor. Exposing the semiconductor substrate to the one or more second deposition phases comprises sequentially exposing the semiconductor substrate to the Ti precursor, followed by a silicon (Si) precursor, followed by the N precursor.

In another aspect, a method of forming a diffusion barrier comprising TiSiN comprises exposing a semiconductor substrate to one or more first deposition phases alternating with and without overlapping with one or more second deposition phases. Exposing the semiconductor substrate to the one or more first deposition phases comprises alternatingly exposing the semiconductor substrate to a titanium (Ti) precursor and a nitrogen (N) precursor. Exposing the semiconductor substrate to the one or more second deposition phases comprises exposing the semiconductor substrate to the Ti precursor for a Ti precursor exposure duration, followed by a silicon (Si) precursor for a Si precursor exposure duration, followed by the N precursor. A ratio of the Si precursor exposure duration to the Ti precursor exposure duration is between 2 and 130.

In another aspect, a method of forming a diffusion barrier comprising TiSiN comprises exposing a semiconductor substrate to one or more first deposition phases alternating with and without overlapping with one or more second deposition phases. Exposing the semiconductor substrate to the one or more first deposition phases comprises alternatingly exposing the semiconductor substrate to a titanium (Ti) precursor and a nitrogen (N) precursor. Exposing the semiconductor substrate to the one or more second deposition phases comprises exposing the semiconductor substrate to the Ti precursor, a silicon (Si) precursor and the N precursor. Exposing the semiconductor to one or more of the Ti precursor, the Si precursor and the N precursor during the one or more second deposition phases comprises undersaturating a major surface of the semiconductor substrate.

In another aspect, a method comprises forming a diffusion barrier comprising TiSiN having a modulus exceeding 290 GPa and a Si content exceeding 2.7 atomic % by exposing a semiconductor substrate to one or more first deposition phases alternating with one or more second deposition phases. Exposing the semiconductor substrate to the one or more first deposition phases comprises alternatingly exposing the semiconductor substrate to a titanium (Ti) precursor and a nitrogen (N) precursor. Exposing the semiconductor substrate to the one or more second deposition phases comprises sequentially exposing the semiconductor substrate to the Ti precursor, followed by a silicon (Si) precursor, followed by the N precursor.

In another aspect, a method comprises forming a diffusion barrier comprising TiSiN having a hardness exceeding 20 GPa and a Si content exceeding 2.7 atomic % by exposing a semiconductor substrate to one or more first deposition phases alternating with one or more second deposition phases. Exposing the semiconductor substrate to the one or more first deposition phases comprises alternatingly exposing the semiconductor substrate to a titanium (Ti) precursor and a nitrogen (N) precursor. Exposing the semiconductor substrate to the one or more second deposition phases comprises sequentially exposing the semiconductor substrate to the Ti precursor, followed by a silicon (Si) precursor, followed by the N precursor.

In another aspect, a method comprises forming a diffusion barrier comprising TiSiN having a crystalline texture such that a grazing incidence X-ray diffraction spectrum of the diffusion barrier exhibits a ratio of an area of under a (002) peak and a sum of areas under (111) and (222) peaks exceeding 0.4 and a Si content exceeding 2.7 atomic % by exposing a semiconductor substrate to one or more first deposition phases alternating with one or more second deposition phases. Exposing the semiconductor substrate to the one or more first deposition phases comprises alternatingly exposing the semiconductor substrate to a titanium (Ti) precursor and a nitrogen (N) precursor. Exposing the semiconductor substrate to the one or more second deposition phases comprises sequentially exposing the semiconductor substrate to the Ti precursor, followed by a silicon (Si) precursor, followed by the N precursor.

In another aspect, a method comprises forming a diffusion barrier comprising TiSiN having a nanocrystalline structure having an average grain size that is less than about 6.5 nm and a Si content exceeding 2.7% by exposing a semiconductor substrate to one or more first deposition phases alternating with one or more second deposition phases. Exposing the semiconductor substrate to the one or more first deposition phases comprises alternatingly exposing the semiconductor substrate to a titanium (Ti) precursor and a nitrogen (N) precursor. Exposing the semiconductor substrate to the one or more second deposition phases comprises sequentially exposing the semiconductor substrate to the Ti precursor, followed by a silicon (Si) precursor, followed by the N precursor.

In another aspect, a semiconductor structure comprises a semiconductor substrate comprising a plurality trenches or vias formed thereon, wherein the trenches or vias comprise a dielectric sidewall surface and an aspect ratio exceeding 5. A diffusion barrier layer comprising TiSiN conformally lines surfaces of the trenches or vias, wherein the diffusion barrier layer has a Si content of 2.7-9 atomic % and a modulus of 290-350 GPa.

In another aspect, a semiconductor structure comprises a semiconductor substrate comprising a plurality trenches or vias formed thereon, wherein the trenches or vias comprise a dielectric sidewall surface and an aspect ratio exceeding 5. A diffusion barrier layer comprising TiSiN conformally lines surfaces of the trenches or vias, wherein the diffusion barrier layer has a Si content of 2.7-9 atomic % and a hardness of 20-40 GPa.

In another aspect, a semiconductor structure comprises a semiconductor substrate comprising a plurality trenches or vias formed thereon, wherein the trenches or vias comprise a dielectric sidewall surface and an aspect ratio exceeding 5. A diffusion barrier layer comprising TiSiN conformally lines surfaces of the trenches or vias, wherein the diffusion barrier layer has a Si content of 2.7-9 atomic % and a crystalline texture such that a grazing incidence X-ray spectrum exhibits a ratio of an area of under a (002) peak and a sum of areas under (111) and (222) peaks of 0.4-4.5.

In another aspect, a semiconductor structure comprises a semiconductor substrate comprising a plurality trenches or vias formed thereon, wherein the trenches or vias comprise a dielectric sidewall surface and an aspect ratio exceeding 5. A diffusion barrier layer comprising TiSiN conformally lines surfaces of the trenches or vias, wherein the diffusion barrier layer has a Si content of 2.7-9 atomic % and a nanocrystalline structure having an average grain size of about 5.0-6.5 nm.

BRIEF DESCRIPTION OF THE DRAWINGS

Embodiments of this disclosure will now be described, by way of non-limiting example, with reference to the accompanying drawings.

FIG. 7A shows a selected area diffraction pattern obtained from a substantially amorphous thin film comprising TiSiN lining a high aspect ratio, according to embodiments.

FIG. 7B shows a selected area diffraction pattern obtained from a partially crystalline thin film comprising TiSiN lining a high aspect ratio, according to embodiments.

FIG. 7C shows a selected area diffraction pattern obtained from a substantially crystalline thin film comprising TiSiN lining a high aspect ratio, according to embodiments.

FIG. 16 is a flow chart illustrating a vapor deposition cycle for forming a thin film comprising TiSiN according to an embodiment.

FIG. 26C is a flow chart illustrating a method of forming a nanolaminate thin film using vapor deposition cycles similar to that illustrated in FIG. 17, according to some embodiments, according to some embodiments

FIG. 29 is a flow chart illustrating a vapor deposition cycle for forming a thin film comprising TiSiN, according to some embodiments.

DETAILED DESCRIPTION

Figure 1:
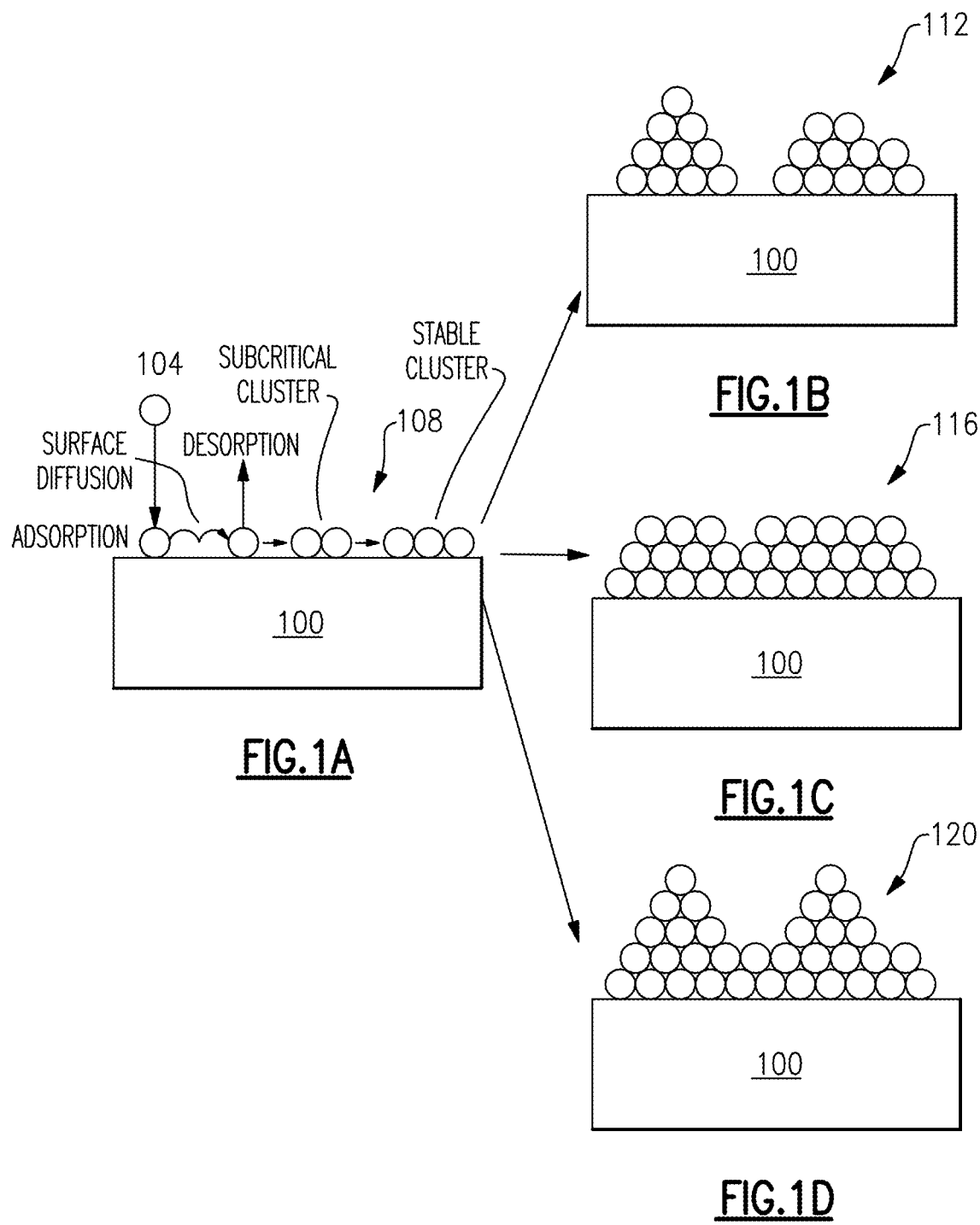
FIGS. 1A-1D schematically illustrate different nucleation and growth mechanisms of thin films under different growth modes.

As described above, there is a need in the integrated circuit (IC) industry for conformal thin films, e.g., TiN-based thin films, with superior physical and barrier properties, as well as methods of forming such films. To address these and other needs, disclosed herein is a thin film comprising TiSiN and/or TiAlN, which can be at least partially amorphous, and a cyclic vapor deposition method, which can be an atomic layer deposition (ALD) method, of forming such thin film, which displays the conformality characteristic of a film deposited by ALD, while also having barrier properties that are superior or matching those of TiN films formed by existing physical vapor deposition (PVD) and chemical vapor deposition (CVD) methods. The thin film comprising TiSiN and/or TiAlN can serve as a conformal diffusion barrier. The thin film is formed by a method adapted for a substrate having a relatively large surface area due to the presence of topography, e.g., openings in a dielectric, such as trenches or vias, which can be high (e.g., >1) aspect ratio vias and trenches, at an area density such that the exposed surface area exceeds a planar substrate surface area by at least a factor of 2. The method comprises exposing a semiconductor substrate to one or more vapor deposition cycles at a relatively high pressure (e.g., >1 Torr), wherein the vapor deposition cycles comprise exposures to a titanium (Ti) precursor, exposures to a nitrogen (N) precursor and exposures to one or both of a silicon (Si) precursor or an aluminum (Al) precursor. The thin film comprising TiSiN and/or TiAlN deposited according to the methods disclosed herein advantageously has excellent diffusion barrier characteristics while having excellent conformality, step height coverage and low surface roughness. These and other characteristics of the thin film can be advantageously tuned by controlling the morphology of the thin film at the nanoscale to have varying degrees of crystallinity and/or homogeneity by tuning the process conditions.

As described herein, a compound referred to by its constituent elements without specific stoichiometric ratios thereof shall be understood to encompass all possible non-zero concentrations of each element unless explicitly limited. For example, titanium nitride (TiN) shall be understood to encompass all possible stoichiometric and nonstoichiometric compositions of titanium nitride that can be expressed by a general formula $Ti_xN$, where x>0, including TiN, $Ti_3N_4$, $Ti_4N_3$, $Ti_6N_5$, $Ti_2N$ and $TiN_2$ as well as other non-stoichiometric compositions of Ti and N. Similarly, silicon nitride (SiN) shall be understood to encompass all possible stoichiometric and nonstoichiometric compositions of silicon nitride that can be expressed by a general formula $Si_yN$, including $Si_3N_4$, where y>0; aluminum nitride (AlN) shall be understood to encompass all possible stoichiometric and nonstoichiometric compositions of aluminum nitride that can be expressed by a general formula $Al_yN$, including AlN, where y>0; titanium silicon nitride (TiSiN) shall be understood to encompass all possible stoichiometric and nonstoichiometric compositions of titanium silicon nitride that can be expressed by a general formula $Ti_xSi_yN$, where x>0 and y>0; titanium aluminum nitride (TiAlN) shall be understood to encompass all possible stoichiometric and nonstoichiometric compositions of titanium aluminum nitride that can be expressed by a general formula $Ti_xAl_yN$, where x>0 and y>0.

As described above, titanium nitride-based thin films play an important role in integrated circuit (IC) fabrication. While techniques such as physical vapor deposition (PVD) and chemical vapor deposition (CVD) have been used in the IC industry to deposit TiN, the need for deposition methods for forming TiN-based films, e.g., ternary or quaternary alloys including Ti, N and one or more additional metals including Si and/or Al, having high conformality without significant compromise in electrical and/or physical properties has been increasing.

In addition, while plasma-enhanced processes such as plasma enhanced atomic layer deposition (PE-ALD) may be effective in forming conformal films on surfaces having relatively low aspect ratios, such processes may not be effective in depositing films inside vias and cavities having relative high aspect ratios. Without being limited by theory, one possible reason for this is that a plasma may not reach deeper portions of high aspect ratio vias under some circumstances. In these circumstances, different portions of the vias may be exposed to different amounts of the plasma, leading to undesirable structural effects arising from non-uniform deposition, such as thicker films being deposited near the opening of the via compared to deeper portions (sometimes called cusping or keyhole formation). For these reasons, a thermal cyclic vapor deposition such as thermal ALD may be more advantageous, because such thermal processes do not depend on the ability of the plasma to reach portions of the surface being deposited on.

However, while thermal ALD techniques may be suitable for forming relatively conformal TiN-based thin films on topography, particularly topography with relatively high aspect ratios (e.g., over 1:1), the inventors have recognized that TiN-based thin films formed by thermal ALD can be inferior to TiN-based thin films formed by PVD or CVD in some respects, e.g., film roughness and electrical resistivity. In this regard, the inventors have discovered that some electrical properties and/or physical properties of ALD-grown TiN-based films can be affected by the mode of growth. In particular, the inventors have discovered that, while it may be desirable to grow the TiN-based films in a two-dimensional layer-by-layer growth mode in ALD, such layer-by-layer growth mode may not be easily achieved under some circumstances. The inventors have further discovered that growing TiN-based thin films by ALD in a layer-by-layer growth mode poses a particular challenge in IC fabrication where the TiN-based films are formed on non-metal surfaces, particularly insulating surfaces such as oxide and nitride surfaces or semiconductor surfaces such as doped and undoped silicon surfaces. The inventors have recognized that the degree to which the TiN-based thin films may be grown in a layer-by-layer growth mode may in turn depend on the initial growth mode that depends on the type of surface and the degree of crystallinity, as described herein without being bound to any theory, in reference to FIGS. 1A-1D.

FIG. 1A schematically illustrates nucleation of a TiN-based layer and FIGS. 1B-1D illustrate different growth modes of the TiN-based layer on different surfaces. Referring FIG. 1A, once precursor molecules 104 reach the surface of a substrate 100, they become physically adsorbed thereon. Some of the adsorbed molecules 104 may diffuse along the surface of the substrate 100 until they reach an energetically favorable position to be chemisorbed. The surface diffusion is governed by, among other things, the substrate temperature, the substrate material and kinetic energy of the adsorbed molecules. When the size of nuclei formed by chemisorbed molecules exceeds a certain size (sometimes referred to as "critical size") determined by the trade-off between volume free energy and surface energy, the nuclei may become energetically stable, and start to grow in size. Thus formed layer 108 of stable nuclei continue to grow by incorporating additional precursor molecules 104. Subsequent film growth can be classified according to different growth modes, as schematically illustrated in FIGS. 1B-1D.

FIG. 1B schematically illustrates a three-dimensional island growth mode, sometimes referred to as Volmer-Weber growth mode, which results in the formation of a layer 112 of three-dimensional islands. Without being bound to any theory, the island growth mode can dominate when the net surface free energy associated with three-dimensional islands is positive, indicating that deposited atoms are more strongly bound to each other than to the substrate. It will be appreciated that the energetics of ALD growth of TiN-based layers can favor the island growth mode, e.g., when metallic TiN-based layers are deposited on some semiconductor and/or insulating material surfaces.

FIG. 1C illustrates a layer-by-layer growth mode, sometimes referred to as Frank-van der Merwe growth mode, which results in the formation of a relatively smooth two-dimensional layer 116. Without being bound to any theory, the layer-by-layer growth mode can dominate when the deposited atoms are more strongly bound to the substrate than to each other, such that a stable two-dimensional layer 116 is energetically favored. The layer-by-layer growth mode can be sustained when there is a continuous decrease in bonding energy between the layers from the first monolayer to the bulk-crystal value of the TiN-based layer.

While FIGS. 1B and 1C are two different possible growth modes of TiN-based thin films, it will be appreciated that, under some circumstances, a growth mode that is intermediate between a layer-by-layer growth mode and a three-dimensional growth mode is possible. FIG. 1D illustrates an example of an intermediate growth mode known as Stranski-Krastanov (SK) growth mode. Without being bound to any theory, the SK growth may occur in thin film growth that commences in a layer-by-layer mode. When layer-by-layer growth becomes unfavorable after the formation of one or more monolayers, an island growth mode starts to dominate over a layer-by-layer growth mode, resulting in thin film structure 120 in which three dimensional islands are formed on a two-dimensional initial layer. The SK growth mode can occur as a strain relaxation mechanism (strain-induced roughening).

In addition to the interaction between the deposited material and the substrate, other factors such as the substrate temperature, pressure and deposition rate can significantly affect the nucleation and early growth processes, which in turn affects the final nanostructure or microstructure of the resulting thin film. For example, deposition at relatively high substrate temperatures and/or low deposition rates may promote the growth of relatively large grains, while relatively low substrate temperatures and high deposition rates may favor the formation of smaller grains.

It has been discovered that, when TiN-based thin film is grown by ALD on various surfaces of interest in IC fabrication, such as dielectric and semiconductor surfaces, the ALD growth may initialize in a three-dimensional island growth mode or a SK growth mode. For example, under some circumstances, ALD growth of TiN-based thin films on substrate surfaces including doped and undoped Si, $SiO_2$, $Si_3N_4$ and other high K or low K materials may proceed in an island growth mode or the SK growth mode. The inventors have discovered that, in part owing to the initial growth mode of either an island or SK growth mode, subsequent growth of the TiN-based layer by ALD often results in a film morphology that is undesirable for various applications of ultrathin conformal diffusion barriers for high aspect ratio structures, as illustrated in FIG. 2.

Figure 2:
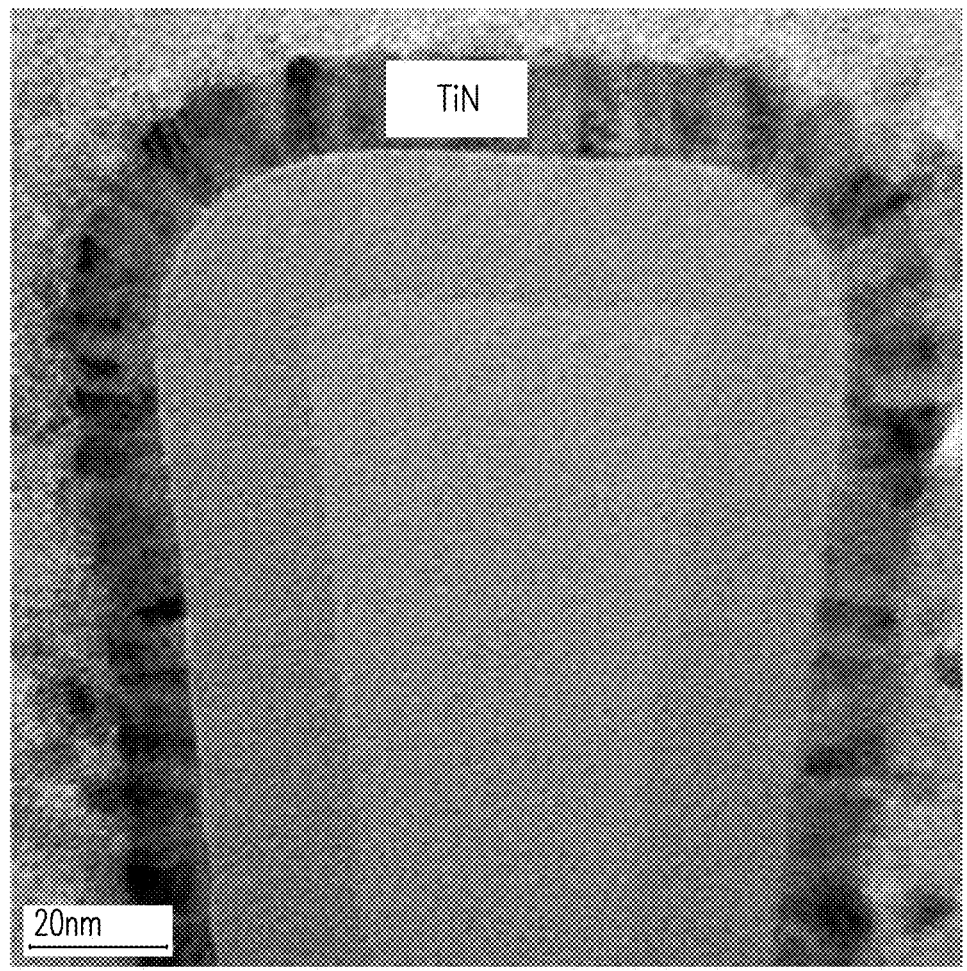
FIG. 2 is a cross-sectional transmission electron micrograph of a TiN layer grown by atomic layer deposition on a silicon substrate having topography.

FIG. 2 is a cross-sectional transmission electron micrograph of a TiN layer grown by thermal ALD on a topography comprising a dielectric ($Si_3N_4$) surface. After an initial film grown in either a three-dimensional island or SK growth mode, the ALD growth of TiN is often characterized by a competitive growth of adjacent crystals with different orientations, resulting, under some circumstances, in V-shaped grains close to the nucleation layer and culminating in a columnar morphology at higher film thicknesses. As illustrated in FIG. 2, the resulting film morphology includes facetted column tops that give rise to a significant surface roughness and column boundaries having lower density relative to the grains. It will be appreciated that the column boundaries can have significantly worse diffusion barrier properties relative to the grains themselves, and may serve as paths of least resistance for transportation of undesirable contaminant through the TiN layer. Furthermore, because of the columnar morphology, relatively thicker TiN layers may need to be deposited to observe sufficient diffusion barrier characteristics. Accordingly, an effective TiN barrier may be too thick for acceptable overall contact or line conductivity, leaving little room for lower resistivity filler materials such as W or Cu.

The inventors have discovered that, when a thin film comprising TiSiN and/or TiAlN, which can be at least partially amorphous, is formed on a non-metal surface, e.g., by thermal cyclic vapor deposition processes such as thermal ALD, the three-dimensional or SK growth mode can be substantially suppressed and a layer-by-layer growth mode can be promoted. Among other reasons, this may be because, when the TiN-based thin film has Si or Al added as an alloying element, and/or has an amorphous phase present therein, the nuclei may wet the non-metal surface with relatively low contact angles. The resulting thin film covers relatively large areas of a non-metal surface with reduced island formation, e.g., because the growth of the thin film tends to proceed more favorably in a layer-by-layer growth mode on substrate surfaces on which TiN-based thin films would normally favor a three-dimensional island or SK growth mode in ALD, as described above. Thus, unlike a TiN layer grown by ALD directly on some non-metal surfaces, which tends to favor a columnar growth as described above, thin films comprising at least partially amorphous TiSiN and/or TiAlN formed on the non-metal surfaces according to embodiments tend to favor a layer-by-layer growth mode, which results in higher conformality and surface smoothness. Furthermore, the presence of the amorphous phase reduces grain boundaries, thereby suppressing fast-diffusing paths for some elements, e.g., Cu or W. The presence of an amorphous phase, higher conformality and/or surface smoothness can in turn enable a reduction in thickness of the diffusion barrier. When formed to line high aspect ratio vias or trenches, the smaller thickness can in turn allow for relatively larger opening for subsequent filling of the vias or trenches with a metal to form a contact via, and/or for reduction in contact resistance.

Figure 3:
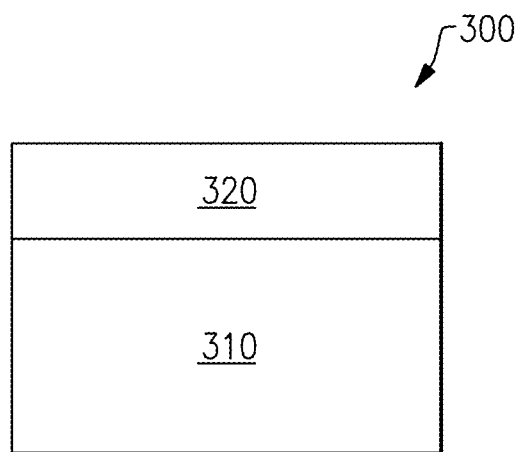
FIG. 3 schematically illustrates a cross-sectional view of a semiconductor structure comprising a thin film comprising TiSiN or TiAlN formed on a semiconductor substrate, according to embodiments.

FIG. 3 schematically illustrates a cross-sectional view of a semiconductor structure 300 comprising a thin film 320 comprising TiSiN and/or TiAlN that may be formed using methods according to various embodiments disclosed herein. The semiconductor thin film structure 300 comprises a substrate 310, e.g., a semiconductor substrate. The substrate 310 may comprise a non-metal surface, e.g., a dielectric and/or a semiconductor surface, on which a thin film 320 comprising at least partially amorphous TiSiN and/or TiAlN is formed according to methods described herein. The thin film 320 has excellent diffusion barrier characteristics while having excellent conformality, step coverage and low surface roughness. These and other characteristics of the thin film can be by advantageously tuned by controlling the crystallinity and/or homogeneity of the thin film at the nanoscale, which can in turn be tuned by tuning various process conditions described herein.

While the thin film comprising TiSiN and/or TiAlN has been illustrated in FIG. 3 as being formed on a planar substrate for clarity, embodiments are not so limited. The benefits of the thin film comprising TiSiN and/or TiAlN can be particularly high when formed on a substrate having topography, e.g., a substrate having high (e.g., >1) aspect ratio vias and trenches and/or having a relatively high density of features, such that the surface area exposed to precursors during cyclic vapor deposition, e.g., ALD, is relatively large (e.g., a surface area exceeding a planar substrate surface area by a factor of 2).

Figure 4:
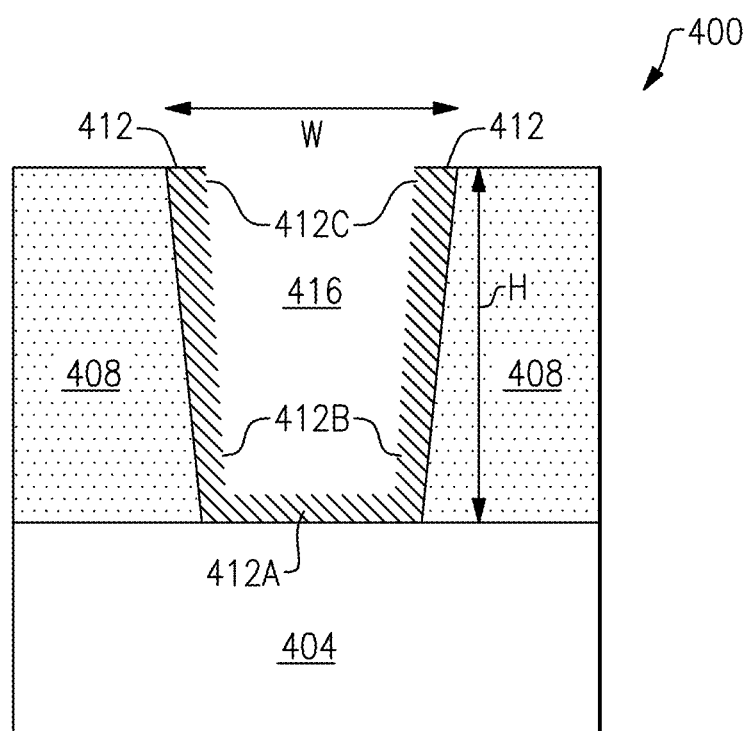
FIG. 4 schematically illustrates a cross-sectional view of a via lined with a thin film comprising TiSiN or TiAlN having different thicknesses at different portions of the via.

One measure of conformality in the context of high aspect ratio structures is referred to herein and in the industry as step coverage. A high aspect ratio structure may be, e.g., a via, a hole, a trench, a hole, a cavity or a similar structure. By way of illustrative example, FIG. 4 schematically illustrates a semiconductor structure 400 having an example high aspect ratio structure 416 formed therein, to illustrate some example metrics of defining and/or measuring conformality of thin films formed on high aspect ratio structures. The illustrated high aspect ratio structure 416 has inner surfaces that are lined with a thin film 412, e.g., a thin film comprising TiSiN and/or TiAlN having different thicknesses at different portions thereof. As described herein, a high aspect ratio structure has an aspect ratio, e.g., a ratio defined as a depth or height (H) divided by a width (W) at the opening region of the high aspect ratio structure 416, which exceeds 1. In the illustrated example, the high aspect ratio structure 416 is a via formed through a dielectric layer 408, e.g., an interlayer dielectric (ILD) layer, formed on a semiconductor material 404. In the illustrated example, a bottom surface of the high aspect ratio structure 416 exposes the underlying semiconductor substrate 404. The thin film 412 can coat different surfaces of the high aspect ratio structure 416 with different thicknesses. As described herein, a step coverage may be defined as a ratio between a thickness of a thin film at a lower or bottom region of a high aspect ratio structure and a thickness of the thin film at an upper or top region of the high aspect ratio structure. The upper or top region may be a region of the high aspect ratio structure at a relatively small depth at, e.g., 0-10% or 0-25% of the H measured from the top of the opening. The lower or bottom region may be a region of the high aspect ratio structure at a relatively large depth at, e.g., 90-100% or 75-100% of the H measured from the top of the opening. In some high aspect ratio structures, a step coverage may be defined or measured by a ratio of thicknesses of the thin film 412A formed at a bottom surface to the thickness of the thin film 412C formed at upper or top sidewall surfaces of the high aspect ratio structure. However, it will be appreciated that some high aspect ratio structures may not have a well-defined bottom surface or a bottom surface having small radius of curvature. In these structures, a step coverage may be more consistently defined or measured by a ratio of thickness of the thin film 412B formed at a lower or bottom sidewall surface to the thickness of the thin film 412C formed at an upper or top sidewall surfaces of the high aspect ratio structure.

Cyclic Vapor Deposition of Thin Films Comprising TiSiN and/or TiAlN

Figure 5A:
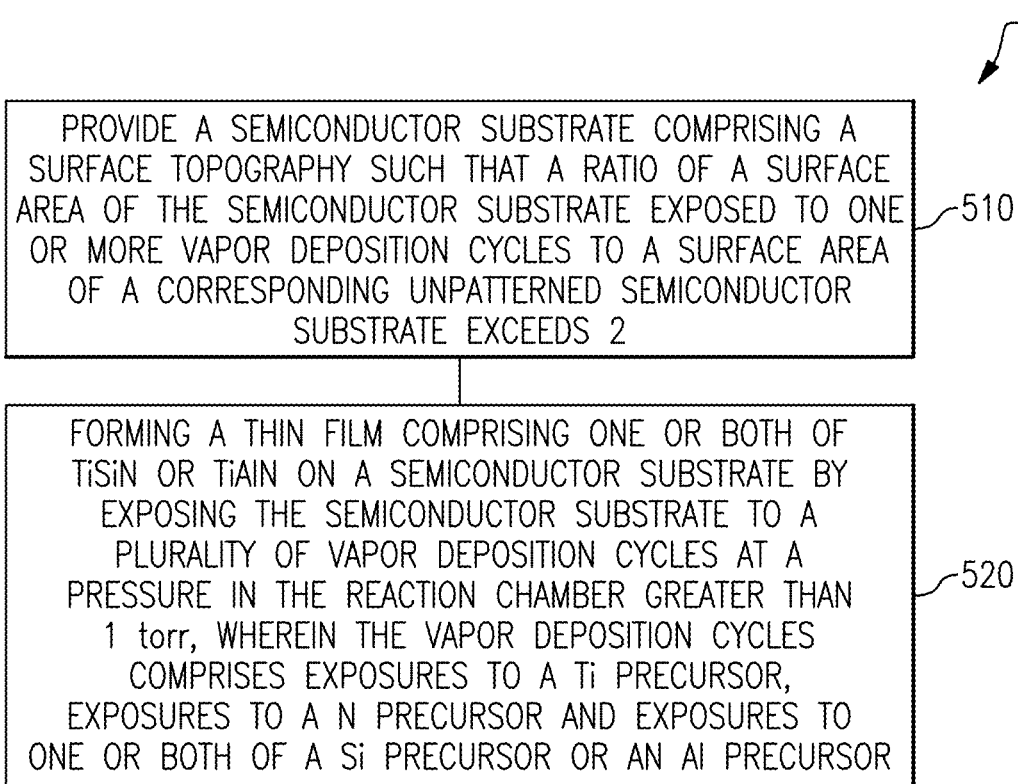
FIG. 5A is a flow chart illustrating a method of forming a thin film comprising TiSiN or TiAlN, according to embodiments.

FIG. 5A illustrates a flow chart of a method 500 of forming a thin film comprising TiSiN and/or TiAlN, according embodiments. The method 500 includes providing 510 a substrate. The substrate can be a planar semiconductor substrate or semiconductor substrate comprising a surface topography such that a ratio of a surface area of the semiconductor substrate exposed to one or more vapor deposition cycles to a surface area of an unpatterned semiconductor substrate exceeds 2, as described herein. The surface topography giving rise to the relatively large surface area may be a plurality openings, such as trenches or vias, formed on the substrate, as described herein. The openings may comprise a dielectric sidewall surface and an aspect ratio exceeding 5.

The method 500 additionally includes forming 520 a thin film, which can serve as a diffusion barrier, comprising titanium silicon nitride (TiSiN) or titanium aluminum nitride (TiAlN). The thin film is formed by exposing the semiconductor substrate to a plurality of vapor deposition cycles at a pressure in the reaction chamber greater than 1 Torr, wherein the vapor deposition cycles comprise exposures to a titanium (Ti) precursor, exposures to a nitrogen (N) precursor and exposures to one or both of a silicon (Si) precursor or an aluminum (Al) precursor.

As described herein and throughout the specification, it will be appreciated that the semiconductor substrate over which the thin film, e.g., a diffusion barrier, comprising TiSiN and/or TiAlN is formed can be implemented in a variety of substrates, including, but not limited to, a doped semiconductor substrate, which can be formed of an elemental Group IV material (e.g., Si, Ge, C or Sn) or an alloy formed of Group IV materials (e.g., SiGe, SiGeC, SiC, SiSn, SiSnC, GeSn, etc.); Group III-V compound semiconductor materials (e.g., GaAs, GaN, InAs, etc.) or an alloy formed of Group III-V materials; Group II-VI semiconductor materials (CdSe, CdS, ZnSe, etc.) or an alloy formed of Group II-VI materials.

According to certain embodiments, the substrate can also be implemented as a semiconductor on insulator, such as silicon on insulator (SOI) substrate. An SOI substrate typically includes a silicon-insulator-silicon structure in which the various structures described above are isolated from a support substrate using an insulator layer such as a buried $SiO_2$ layer (BOX). In addition, it will be appreciated that the various structures described herein can be at least partially formed in an epitaxial layer formed at or near a surface region.

Still referring to FIG. 5A, it will be understood that the method 500 may be carried out over a substrate having been processed through the front-end-of-line, and can include various devices, for instance transistors. Furthermore, the semiconductor substrate can include one or more of a variety of structures pre-formed thereon, e.g., diffusion regions, isolation regions, electrodes, and metallization structures such as contacts and metallization lines, to name a few, over which the method 500 may be performed. The diffusion barrier comprising TiSiN and/or TiAlN may thus be formed on a variety of topographical structures, including vias, cavities, holes or trenches. The surfaces on which the diffusion barrier comprising TiSiN and/or TiAlN according to embodiments can be formed include a metallic surface, e.g., a surface of a metallization structure; a semiconductor surface, e.g., a doped or undoped Si surface; and/or a dielectric surface, e.g., an interlayer dielectric (ILD) surface, a mask or a hard mask surface or a gate dielectric surface, to name a few.

In some embodiments, when formed as a diffusion barrier, a thin film comprising TiSiN and/or TiAlN may be interposed between a dielectric layer, e.g., an interlayer dielectric (e.g., 408 in FIG. 4) and a metallization structure formed by filling a via or a trench (e.g., 416 in FIG. 4) and/or between a semiconductor substrate 404 and the metallization structure formed by filling the via or the trench, thereby serving as a diffusion barrier therebetween, among other functionalities, such as an electrical contact. In these embodiments, the dielectric material may be any dielectric material used in integrated circuit fabrication, e.g., silicon oxide, silicon nitride, high K dielectric or low K dielectric, to name a few. The metallization structure can include a metallization line, a contact structure or other conductive structures formed of a metal or a metallic material for electrically connecting the underlying semiconductor material 404, e.g. a diffusion region, to other parts of an integrated circuit device being fabricated. The metallization structure may be formed of any suitable metal or metallic material including, for example, metals including Al, Cu, Ni, Cr, Co, Ru, Rh, Pd, Ag, Pt, Au, Ir, Ta, and W; conductive metal nitrides including TiN, TaN, WN, and TaCN; conductive metal silicides including tantalum silicides, tungsten silicides, nickel silicides, cobalt silicides and titanium silicides; and conductive metal oxides including $RuO_2$, to name a few.

Still referring to FIG. 5A, the method 500 of forming a thin film, e.g., a diffusion barrier, further comprises forming 520 a thin film comprising TiSiN and/or TiAlN by exposing a semiconductor substrate in a reactor chamber to a plurality of vapor deposition cycles, which can be atomic layer deposition (ALD) cycles, wherein the vapor deposition cycles comprise one or more exposures to a titanium (Ti) precursor, one or more exposures to a nitrogen (N) precursor and one or more exposures to a silicon (Si) precursor or an aluminum (Al) precursor. At least one of the vapor deposition cycles can be performed in a reaction chamber at a pressure greater than about 1 Torr.

As described herein and throughout the specification, a reactor chamber refers to any reaction chamber including a single wafer processing reaction chamber or a batch wafer processing reaction chamber that is suitably configured for cyclic vapor deposition, which can be atomic layer deposition (ALD), e.g., thermal cyclic vapor deposition or ALD. In a thermal cyclic deposition reactor or an ALD reactor, the substrate may be placed on a suitable substrate such as a susceptor or a carrier boat. The substrate may be directly heated by conduction through a heated susceptor, or indirectly heated by radiation from a radiation source such as a lamp or by convection through a heated chamber wall.

Generally in a cyclic vapor deposition or ALD process, reactants or precursors, e.g., oxidizing and reducing reactants, are alternatingly introduced into a reaction chamber having disposed therein a substrate. The introduction of one or more reactants or precursors may be in turn be alternated with a purge and/or a pump out process for removing excess reactants or precursors from the reaction chamber. The reactants may be introduced into the reaction chamber under a condition over a suitable period of time such that the surface on which the diffusion barrier is to be deposited is exposed to the reactants, whereby the surface of the substrate can become at least partly saturated with the precursors or reactants and/or a reaction product of the reactants. Excess or residual precursors or reactants may then be purged and/or pumped out of the reaction chamber. A pump out process may be performed by a suitable vacuum pumping process and a purge step may be performed by introducing a non-reactive or an inert gas, e.g., nitrogen or a noble gas, into the reaction chamber. Other techniques also exist for keeping mutually reactive reactants from mixing in the gas phase.

Figure 5B:
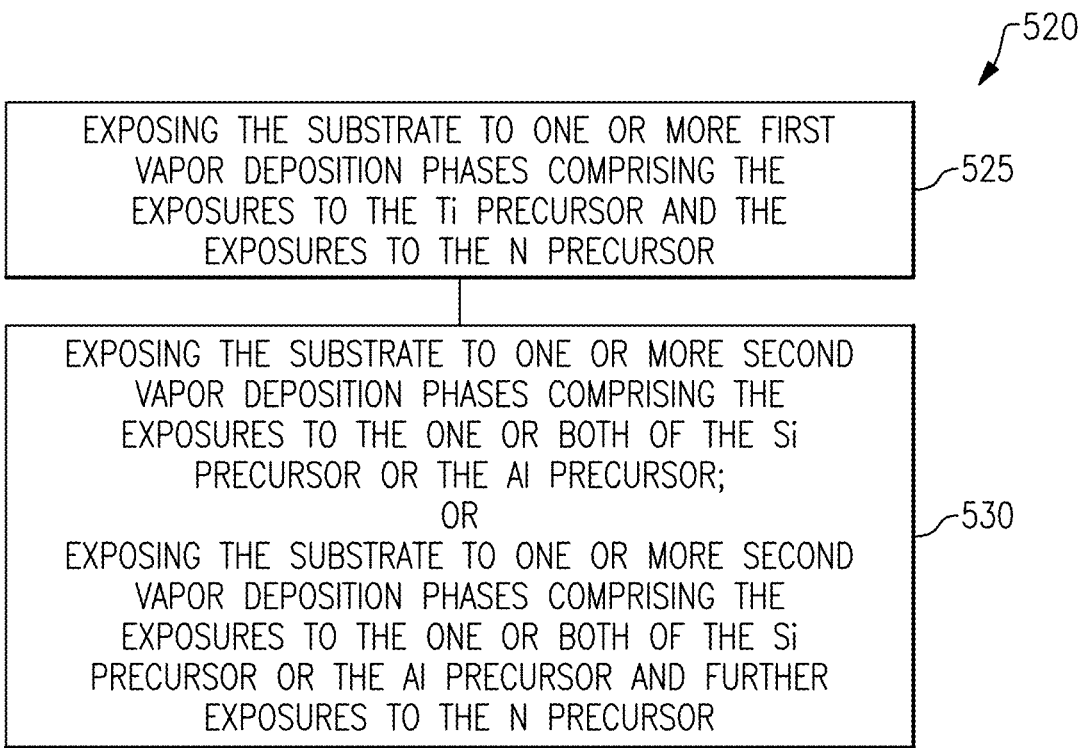
FIG. 5B is a flow chart illustrating a deposition cycle for forming a thin film comprising TiSiN or TiAlN, according to embodiments.
Figure 5C:
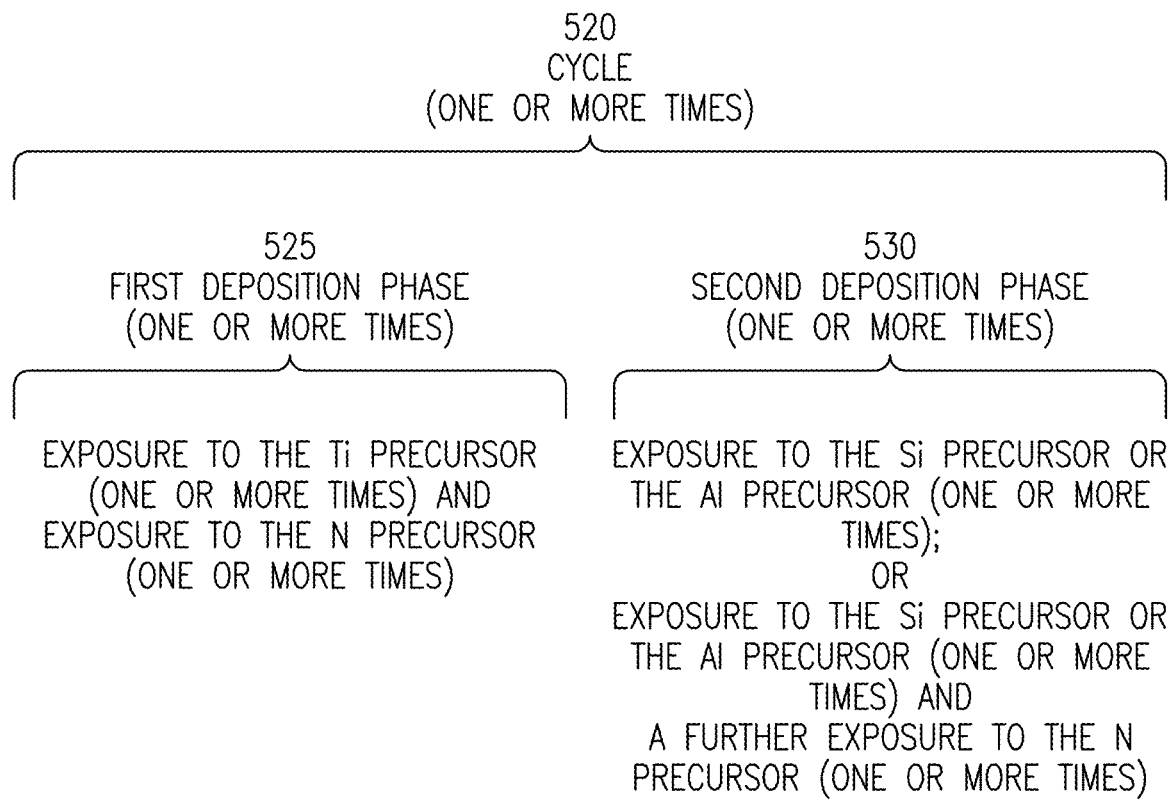
FIG. 5C is a diagram illustrating a deposition cycle for forming a thin film comprising TiSiN or TiAlN, according to embodiments.
Figure 5D:
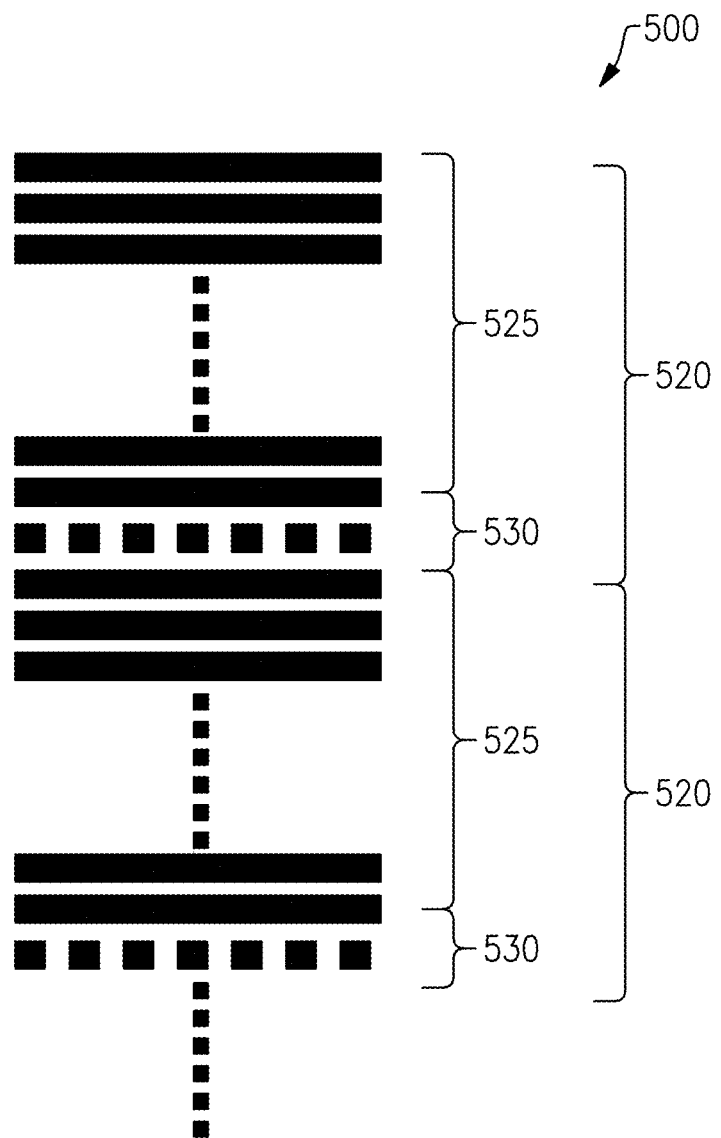
FIG. 5D is a diagram illustrating a sequence of deposition cycles for forming a thin film comprising TiSiN or TiAlN, according to embodiments.

FIG. 5B is a flow chart and FIGS. 5C and 5D are diagrams illustrating a method of forming a diffusion barrier comprising TiSiN and/or TiAlN, according to embodiments. FIG. 5C illustrates deposition phases comprising exposures to precursors, and a cycle comprising exposures to deposition phases. FIG. 5D illustrates a sequence of cyclic deposition phases as part of multiple cycles. Referring to FIGS. 5B-5D, according to various embodiments, exposing 520 (FIG. 5A) the semiconductor substrate to one or more vapor deposition cycles, which can be ALD cycles, comprises exposing 525 the substrate to one or more first vapor deposition phases ("first deposition phases"), wherein at least one of the first deposition phases comprises an exposure to the Ti precursor and an exposure to the N precursor. Exposing 520 (FIG. 5A) the semiconductor substrate to one or more vapor deposition cycles, which can be ALD cycles, additionally comprises exposing 530 the substrate to one or more second vapor deposition phases ("second deposition phases"), wherein at least one of the second deposition phases comprises an exposure to the Si and/or Al precursor or a combination of an exposure to the Si and/or Al precursor and a further exposure to the N precursor. The one or more first deposition phases and the one or more second deposition phases can combine to form one cycle, which in turn can be repeated a plurality of times or cycles. Different cycles can have the same or different number of first and second deposition phases. The combination of exposing 525 the substrate to one or more first deposition phases and exposing 530 to one or more second deposition phases results in a diffusion barrier layer comprising a TiSiN and/or TiAlN layer or region. Each of exposing 525 the substrate to one or more first deposition phases and exposing 530 the substrate to one or more second deposition phases, in turn, can comprise one or more exposures to respective precursors, such as in pulses, as described below.

Still referring to FIGS. 5B-5D, in various embodiments, exposing 525 the substrate to each of the one or more first deposition phases comprises subjecting the substrate to one or more exposures to the Ti precursor and one or more exposures to the N precursor. Each exposure to the Ti precursor is such that the surface of the substrate on which the diffusion barrier is to be deposited is exposed to the Ti precursor, whereby the surface can become substantially or partly saturated with the Ti precursor. After exposing the substrate to the Ti precursor, excess or residual Ti precursor or its reaction products that do not remain adsorbed or chemisorbed on the surface of the substrate may be removed from the substrate surface, such as by having the process chamber pumped or purged out. Similarly, each exposure to the N precursor is such that the substrate on which the diffusion barrier is to be deposited is exposed to the N precursor, whereby the surface can become substantially or partly saturated with the N precursor. After exposing the substrate to the N precursor, excess or residual N precursor or its reaction products that do not remain adsorbed or chemisorbed or react with the surface of the substrate may be removed from the substrate surface, such as by having the process chamber pumped or purged out. Subjecting the substrate to one or more first deposition phases each comprising one or more exposures to the Ti precursor and one or more exposures to the N precursor may locally form one or more monolayers or a region formed substantially of TiN as-deposited.

In some embodiments, the exposure to the Ti precursor in a given first deposition phase may be performed a plurality of times in sequence. Similarly, the exposure to the N precursor in a given first deposition phase may be performed a plurality of times in sequence. Advantageously, under some circumstances, exposing the substrate to the Ti and/or N precursors more than once may result in a higher level of surface saturation, e.g., when substantial stearic hindrance effect exists, by exposing more reactive sites for the respective precursor adsorption or reaction.

Still referring to FIGS. 5B-5D, in various embodiments, exposing 530 the substrate to each of the one or more second deposition phases comprises subjecting the substrate to one or more exposures to the Si precursor or the Al precursor. Each exposure to the Si and/or Al precursor is such that the surface of the substrate on which the diffusion barrier is to be deposited is exposed to the Si and/or Al precursor, whereby the surface can become substantially or partly saturated with the Si and/or Al precursor. After exposing the substrate to the Si and/or Al precursor, excess or residual Si and/or Al precursor or its reaction products that do not remain adsorbed or chemisorbed on the surface of the substrate may be removed from the substrate surface, such as by having the process chamber pumped or purged out. Subjecting the substrate to one or more second deposition phases each comprising one or more exposures to the Si and/or Al precursor may locally form one or more monolayers or a region formed substantially of Si or Al, as-deposited.

In some embodiments, the exposure to the Si and/or Al precursor in a given second deposition phase may be performed a plurality of times in sequence. Advantageously, under some circumstances, exposing the substrate to the Si and/or Al precursor more than once may result in a higher level of surface saturation, e.g., when substantial stearic hindrance effect exists, by exposing more reactive sites for the respective precursor adsorption or reaction.

Still referring to FIGS. 5B-5D, in some embodiments, exposing 530 to the substrate to each of the one or more second deposition phases comprises subjecting the substrate to one or more exposures to the Si and/or Al precursor and further subjecting the substrate to one or more exposures to a N precursor, which can be the same as or different from the N precursor of the first deposition phases. Each exposure to the Si and/or Al precursor is such that the surface of the substrate on which the diffusion barrier is to be deposited is exposed to the Si and/or Al precursor, whereby the surface can become substantially or partly saturated with the Si and/or Al precursor. After exposing the substrate to the Si and/or Al precursor, excess or residual Si and/or Al precursor or its reaction products that do not remain adsorbed or chemisorbed on the surface of the substrate may be removed from the substrate surface, such as by having the process chamber pumped or purged out. Each exposure to the N precursor is such that the surface of the substrate on which the diffusion barrier is to be deposited is exposed to the N precursor, whereby the surface can become substantially or partly saturated with the N precursor. After the one or more further exposures to the N precursor, excess or residual N precursor or its reaction products that do not react with the surface of the substrate may be removed from the substrate surface, such as by having the process chamber pumped or purged out. Subjecting the substrate to one or more second deposition phases each comprising one or more exposures to the Si precursor and one or more exposures to the N precursor may locally form one or more monolayers or a region formed substantially of SiN or AlN, as-deposited.

In some embodiments, the exposure to the Si precursor in a given second deposition phase may be performed a plurality of times in sequence. Similarly, the further exposure to the N precursor may be performed a plurality of times in sequence. Advantageously, under some circumstances, exposing the substrate to the Si and/or Al and/or N precursors as discussed herein more than once may result in a higher level of surface saturation, e.g., when substantial stearic hindrance effect exists, by exposing more reactive sites for the respective precursor adsorption.

It will be appreciated that, in various embodiments, number of cycles each including one or both of the first and second deposition phases, the frequency and number of repetition of the first deposition phases and the frequency and number of repetition of the second deposition phases, the frequency and the number of repetitions of the exposures of the substrate to the Ti precursor and the N precursor during the first deposition phases, and the frequency and the number of repetitions of the exposures of the substrate to the Si and/or Al precursor or the Si and/or Al precursor and the N precursor during the second deposition phases as described herein can be varied to obtain a desired thickness, stoichiometry and other properties described herein in the resulting diffusion barrier layer comprising TiSiN and/or TiAlN, based on various considerations including susceptibility to stearic hindrance effects of the precursors.

Still referring to FIGS. 5B-5D, depending on the circumstances or a film characteristic being sought, it may be advantageous to initiate the deposition of the diffusion barrier comprising TiSiN and/or TiAlN with one or the other of the exposures of the substrate to a first deposition phase or a second deposition phase. For example, the inventors have found that, exposing 530 the substrate to one or more second deposition phases (Si and/or Al precursor or N precursor) first, followed by exposing 525 the substrate to one or more first deposition phases (Ti precursor or N precursor), may be particularly advantageous in enhancing layer-by-layer growth mode of the diffusion barrier layer, thereby increasing conformality and reducing surface roughness, e.g., when the substrate surface comprises a nonmetallic surface, e.g., an insulating surface such as the sidewalls of a trench or a via formed in an interlayer dielectric (ILD) layer, or a semiconductor surface such as a Si diffusion region.

However, embodiments are not so limited and in other embodiments, it may be more advantageous to expose 525 the substrate to one or more first deposition phases (Ti precursor or N precursor) first, followed by exposing 530 the substrate to one or more second deposition phases (Si and/or Al precursor or N precursor), e.g., for reducing contact resistance while maintaining good conformality and surface roughness, e.g., when the substrate surface comprises a metallic surface (e.g., a W, Al, or Cu metal metallization).

Referring to FIG. 5D, under some circumstances, the sequence of first and second deposition phases may result in a thin film having regions or layers that are detectably rich in TiN and Si and/or Al or SiN and/or AlN, depending on the sequence as described above. However, under other circumstances, despite the distinct sequence of exposures to first and second deposition phases, the resulting thin film may be substantially homogenous TiSiN and/or TiAlN thin films, as described in further infra.

According to various embodiments, non-limiting examples of the Ti precursor for forming the thin film, e.g., diffusion barrier layer or region, include titanium tetrachloride ($TiCl_4$), tetrakis(dimethylamino)titanium (TDMAT) or tetrakis(diethylamino)titanium (TDEAT).

According to various embodiments, non-limiting examples of the N precursor for forming the thin film, e.g., diffusion barrier layer or region, include ammonia ($NH_3$), hydrazine ($N_2H_4$) or monomethylhydrazine ($CH_3(NH)NH_2$, "MMH"). As noted above, different N precursors can be employed for the first and second deposition phases, and indeed different precursors can be used for different cycles of the same phase.

According to various embodiments, non-limiting examples of the inert gas for purging include nitrogen $N_2$ or a noble gas such as Ar.

According to some embodiments, the Si precursor for forming the diffusion barrier layer may be a hydride precursor. Examples of the hydride precursor include silane ($SiH_4$) and disilane ($Si_2H_6$). According to some other embodiments, the Si precursor for forming the diffusion barrier layer may be a chlorine-containing precursor, such as a silicon chloride or a chlorosilane. Examples include silicon tetrachloride ($SiCl_4$), monochlorosilane ($SiH_3Cl$, "MCS"), dichlorosilane ($SiH_2Cl_2$, "DCS"), trichlorosilane ($SiHCl_3$), hexachlorodisilane ($Si_2Cl_6$, "HCDS") and octachlorotrisilane ($Si_3Cl_8$, "OCTS"). The inventors have found that the diffusion barrier layer comprising TiSiN may be desirably formed using a silicon and chlorine-containing Si precursor when a higher level of saturation of the surface by the precursor is desired under a wide variety of conditions due to reduced steric hindrance relative to organic silicon precursors.

According to some embodiments, the Al precursor for forming the diffusion barrier layer may be an organometallic precursor. Examples of the organometallic precursor include tri-methyl aluminum ("TMA"), tri-iso-butyl-aluminum and tris (dimethylamido) aluminum. According to some other embodiments, the Al precursor for forming the diffusion barrier layer may be chlorine-containing Al precursor, e.g. $AlCl_3$.

Without being bound to any theory, the inventors have found that these Si and Al precursors, when introduced as the first non-nitrogen precursor, can be particularly advantageous for promoting a layer-by-layer growth mode of the TiSiN layer or the TiAlN layer, compared to other Si or Al precursors. The layer-by-layer growth mode is achieved through improved wetting of the substrate surface by nuclei of the TiSiN layer or the TiAlN layer during early stages of growth, which may be characterized by a small contact angle between the nuclei and the substrate surface. As a result of the layer-by-layer growth mode, improved conformality and reduced surface roughness may be achieved, which can be particularly advantageous for forming the diffusion barrier by depositing in high aspect ratios with small dimensions. Further, without being bound to any theory, the chlorine-containing Si and/or Al precursors may enable more precise control of composition in the direction of growth by inhibiting or self-limiting adsorption.

For realizing various advantages disclosed herein, e.g., to serve as an effective diffusion barrier, the thin film comprising TiSiN and/or TiAlN can have a thickness that does not exceed about 25 nm, 20 nm, 15 nm, 10 nm, 7 nm, 4 nm, 2 nm, 1 nm or has a value in a range defined by any of these values or outside of these values, according to embodiments. These thickness can be substantially lower compared to TiN barriers having similar effectiveness as a diffusion barrier.

For realizing various advantages disclosed herein, e.g., to serve as a diffusion barrier, the thin film comprising TiSiN and/or TiAlN may be formed at a substrate temperature of 250° C.-300° C., 300° C.-400° C., 350° C.-400° C., 400° C.-450° C., 450° C.-500° C., 500° C.-550° C., 550° C.-600° C., 600° C.-650° C., or a temperature in a range defined by any of these values, for instance about 400° C., according to embodiments.

For realizing various advantages disclosed herein, e.g., to serve as an effective diffusion barrier, the exposure times or pulse durations of the various precursors are in the range of about 0.1-5 sec., 5-10 sec., 10-20 sec., 20-30 sec, 30-40 sec, 40-50 sec., 50-60 sec., or a duration in a range defined by any of these values or higher, according embodiments.

In summary, forming a thin film, e.g., a diffusion barrier, comprising TiSiN and/or TiAlN comprises exposing a substrate to one or more cycles each including one or more first deposition phases and/or one or more second deposition phases. Each of the first deposition phases in turn comprises one or more exposures to a Ti precursor alternating with one or more exposures to a N precursor. According to some embodiments, each of the second deposition phases in turn comprises one or more exposures to a Si or an Al precursor. According to some other embodiments, each of the second deposition phases comprises one or more exposures to a Si precursor and/or an Al precursor alternating with one or more exposures to a N precursor. The resulting diffusion barrier layer comprises a TiSiN layer or region or a TiAlN layer or region. According to various embodiments, the frequency and the number of exposures of the substrate to each of the Ti precursor, the N precursor and the Si and/or Al precursor, and the frequency and the number of exposures of the substrate to each of the cycles, first deposition phases and second deposition phases, as well as the order of the exposures, may be tailored to obtain a desired stoichiometry, thickness and degree of crystallinity, as described herein.

Deposition on Substrates Having High Surface Area and/or High Aspect Ratio Structures The inventors have discovered that, when a substrate has a relatively high surface area, e.g., arising from a relatively high area density of high aspect ratio structures, coating the exposed surface with a thin film using ALD process recipes developed based on characterization of thin films formed on a planar or unpatterned substrate or a substrate with relatively low surface area or low area density of high aspect ratio structures may yield thin films having different characteristics at different parts of the exposed surface. For example, the conformality or step coverage as described above may be significantly worse in high aspect ratio structures in substrates having a relatively high area density thereof. Other characteristics that may also be different at different parts of the exposed surface include film stoichiometry, surface roughness, electrical resistivity and film density, to name a few. Without being bound to any theory, one reason for the low uniformity of the characteristics may be the significantly increased exposed surface area of the substrate relative to a planar substrate. Because of the increased exposed surface area, different parts of the exposed surface may receive different magnitudes of the flux of precursors, such that different amounts of precursors may be adsorbed on different parts of the exposed surface. By way of a simplified example only, when a 300 mm semiconductor substrate has formed thereon hundreds of dies each having of the order of $1 \times 10^{10}$ or more transistors and each transistor has one or more vias having a diameter of 10-100 nm and an aspect ratio of 1 to 100, the surface area exposed to precursors during the deposition of the thin film can exceed the surface area of a corresponding unpatterned substrate 10, 100, 1000 or more. In addition, local deposition conditions at different parts of the exposed surface may be different. For example, local pressure inside a deep trench or a via may be different, e.g., lower, compared to regions outside the deep trench or the via. In addition, under vacuum conditions, because gas molecules undergo more collisions with sidewalls of the trench or the via, upper portions of the deep trench or the via may adsorb a higher amount of precursor molecules from being subjected to a higher flux.

According to various embodiments described herein, the inventors have discovered that the deposition methods described herein are particularly advantageous for forming thin films comprising TiSiN and/or TiAlN at different parts of the exposed surface with higher uniformity with respect to various physical characteristics including conformality, step coverage, film stoichiometry, surface roughness, electrical resistivity and film density, to name a few. Thus, the thin film comprising TiSiN and/or TiAlN formed according to deposition methods disclosed herein have higher uniformity at both local (e.g., within a trench or via) and global (e.g., within-wafer) levels with respect to one or more of these physical characteristics. Thus, the deposition methods according to embodiments are particularly advantageous for forming the thin film comprising TiSiN and/or TiAlN on a substrate that comprises a surface topography such that a ratio of a surface area of the semiconductor substrate exposed to the one or more vapor deposition cycles to a surface area of a corresponding unpatterned semiconductor substrate exceeds 2, 5, 10, 20, 50, 100, 200, 500, 1000 or has a ratio in a range defined by any of these values, or higher.

Alternatively or additionally, the deposition methods according to embodiments are additionally particularly advantageous for forming the thin film on a substrate that comprises high aspect ratio structures having an opening width less than 1 micron, 500 nm, 200 nm, 100 nm, 50 nm, 20 nm or a value in a range defined by any of these values, an aspect ratio exceeding 5, 10, 20, 50, 100, 200 or a value in a range defined by any of these values, and an area density such that the surface area is greater than a that of a planar substrate as described above. Substrates having such topography may be conformally coated with thin films comprising TiSiN and/or TiAlN according to embodiments with a step coverage as defined above that exceeds 50%, 60%, 70%, 80%, 90%, 95%, or has a value in a range defined by any of these values or higher. As discussed above, the inventors have found that process conditions for conformally coating a substrate having a relatively high area density of high aspect ratio structures may be optimized according to embodiments to achieve these results. The inventors have discovered that these results may be achieved by controlling, among other things, the reaction chamber pressure or partial pressures of precursors during exposures of the substrate, the deposition rate, the temperature or pressure of precursors being introduced into the reaction chamber, the flow rate of the precursors and the exposure time, to name a few.

The inventors have discovered that relatively higher total or partial pressures can lead to improvement in conformality and step coverage when coating a substrate having a relatively high area density of high aspect ratio structures, according to embodiments. Without being bound to any theory, such improvement may be associated with, among other things, lessening the effect of locally reduced partial pressure of precursors inside the high aspect ratio vias or trenches. Thus, according to embodiments, referring back to FIGS. 5B and 5C, total or partial pressures of any of the individual precursors during exposing 525 the substrate to one or more first deposition phases (Ti precursor and/or N precursor), and/or during exposing 530 the substrate to one or more second deposition phases (Si and/or Al precursor and/or N precursor), may be 1.0-3.0 torr, 3.0-5.0 torr, 5.0-7.0 torr, 7.0-9.0 torr, 9.0-11.0 torr, 11.0-13.0 torr, 13.0-15.0 torr, or a pressure in range defined by any of these values. In each of the exposures to the Ti precursor, the N precursor and/or the Si and/or Al precursor, the respective precursor can make up 1-2%, 2-5%, 5-10%, 10-20%, 20-50%, 50-100% of the total amount of gas molecules in the reaction chamber, or a percentage in a range defined by any of these values. The inventors have discovered that, under some circumstances, when the total or partial pressure is outside of these values, step coverage may start to degrade, among other things.

The relatively high total pressure or the partial pressures during exposing 525 the substrate to one or more first deposition phases (Ti precursor and/or N precursor), and/or during exposing 530 the substrate to one or more second deposition phases (Si and/or Al precursor and/or N precursor), in conjunction with the flow rates of the respective precursors and an inert gas, and the pumping power of the reaction chamber. are controlled such that the deposition rate is relatively high at 0.20-0.30 Å/deposition phase, 0.30-0.40 Å/deposition phase, 0.40-0.50 Å/deposition phase, 0.50-0.60 Å/deposition phase, 0.60-0.70 Å/deposition phase, 0.60-0.70 Å/deposition phase, 0.70-0.80 Å/deposition phase or a value in a range defined by any of these values, per first and/or second deposition phases, according to embodiments.

The inventors have discovered that, in part to enable relatively high throughput while delivering relatively high amounts of precursors to the reaction chamber for deposition at relatively high total or partial pressures, the flow rates of the precursors into the reaction chamber should be significantly higher than those used in process conditions for forming thin films on planar substrates and/or substrates with low (e.g., <1) aspect ratio structures. The high flow rates can in turn may be achieved by increasing one or both of the temperatures or the pressures of the precursors prior to introduction into the reaction chamber. For example, for precursors in liquid form under manufacturing conditions, the precursor bottles may be heated to temperatures higher than a room temperature, e.g., 30-60° C., 60-80° C., 80-100° C., 100-120° C., 120-150° C., or a temperature in a range defined by any of these values, to increase the vapor generation rate. The lower and upper bottle temperatures of these ranges may be determined in part based on the vapor pressure of the precursor and the decomposition temperature of the precursor, respectively. By way of example, $TiCl_4$ may be heated to about 60-80° C. On the other hand, for precursors in gas form under manufacturing conditions, the high flow rate may be achieved by increasing the gas line pressures to increase the delivery pressures to values that are much higher relative to gas line pressures used in forming thin films on relatively low surface area or planar substrates and/or substrates with low (e.g., <1) aspect ratio structures. It will be appreciated that the relatively high flow rate to achieve various advantages described herein can depend on, among other things, the pumping rate, exposure time, and volume of the reactor. To achieve flow rates adapted for depositing the thin film on substrates having a high surface area and/or high aspect ratio structures, the temperature and or pressure of the precursor, among other parameters, can be adjusted such that the flow rate of each of the Ti, N, Si and Al precursors can be, e.g., 100-1000 standard cubic centimeters per minute (sccm), 1000-2000 sccm, 2000-5000 sccm, 5000-10,000 sccm, 10,000-15,000 sccm, 15,000-20,000 sccm, or a value in a range defined by any of these values or higher. It will be appreciated that a suitable flow rate can depend, among other things, the volume of the reactor, and some of these flow rates may be suitable for single wafer reactors having a volume of about 1-2 liters.

Figure 6A:
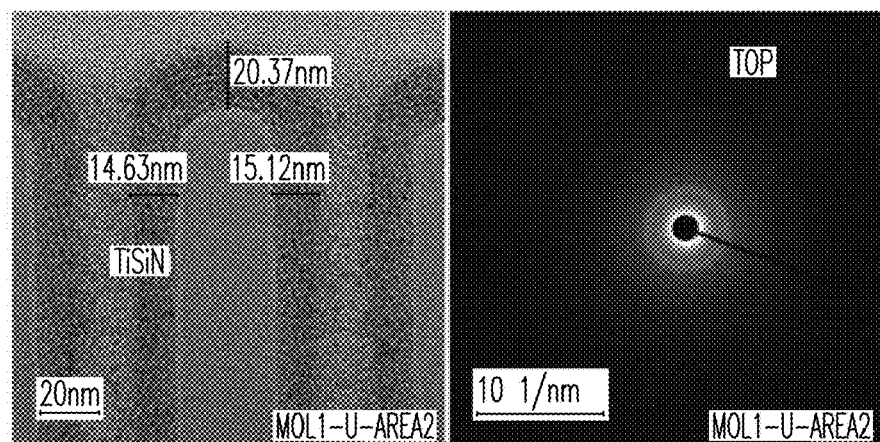
FIG. 6A shows a cross-sectional transmission electron micrograph and a corresponding selected area diffraction pattern obtained from a thin film comprising TiSiN lining an upper portion of a high aspect ratio via, according to embodiments.
Figure 6B:
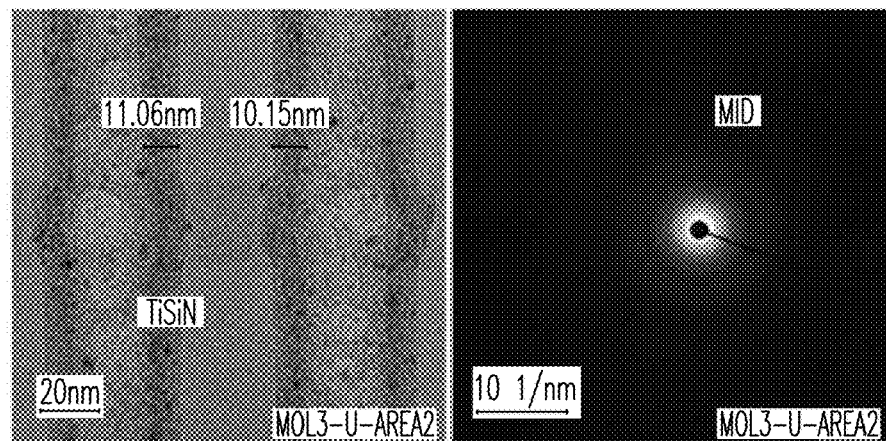
FIG. 6B shows a cross-sectional transmission electron micrograph and a corresponding selected area diffraction pattern obtained from a thin film comprising TiSiN lining a middle portion of the high aspect ratio via shown in FIG. 6A, according to embodiments.
Figure 6C:
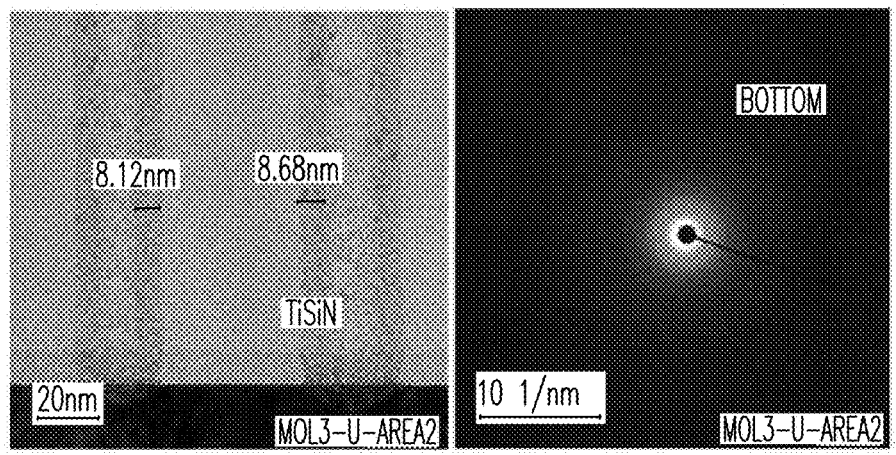
FIG. 6C shows a cross-sectional transmission electron micrograph and a corresponding selected area diffraction pattern obtained from a thin film comprising TiSiN lining a lower portion of the high aspect ratio via shown in FIGS. 6A and 6B, according to embodiments.

FIGS. 6A-6C illustrate experimental transmission electron microcopy (TEM) images of a conformal TiSiN film lining high aspect ratio vias formed according deposition techniques described herein. The high aspect ratio vias have a deposited silicon oxide surface. FIGS. 6A, 6B and 6C are TEM images taken at upper, middle and lower portions, respectively, of a thin TiSiN film formed in a via having an aspect ratio of about 40. In each of FIGS. 6A-6C, the left image is a bright field image of the respective portion of the high aspect ratio via and the right image shows a selective area diffraction (SAD) pattern obtained from the thin film formed on the respective portion of the high aspect ratio via using an electron beam having a spot size comparable to the thickness of the thin TiSiN film. Unlike polycrystalline TiN having a rough surface due to columnar growth as shown in FIG. 2, bright field TEM images of FIGS. 6A-6C show that the deposited TiSiN is much more smooth and conformal. The inventors have discovered that these and other improvements can be attributed in part to the presence of at least some amorphous phase of TiSiN, which can be present along with some nanocrystalline phase of TiSiN, as indicated by the SAD patterns. The thin TiSiN film is substantially amorphous and substantially conformal throughout the depth of the via with good step height coverage (~60%).

Control of Thin Film Morphology at Nanoscale

Advantageously, owing to the ability to control the adsorption of precursors at sub-monolayer level using various process parameters described herein, various embodiments of cyclic vapor deposition processes disclosed herein, which can be ALD processes, enable control and improvement of the film morphology and structure of thin films comprising TiSiN and/or TiAlN at the nanoscale. The controlled morphology and structure include the degree of crystallinity, homogeneity and surface roughness. In particular, the inventors have discovered that the degree of crystallinity and/or the homogeneity at the nanoscale can be advantageously controlled in thin films comprising TiSiN and/or TiAlN by controlling various parameters of the exposure cycles, as described herein.

According to various embodiments, when forming a thin film, e.g., a diffusion barrier layer, comprising TiSiN and/or TiAlN, the film morphology can be controlled using, in addition to various parameters described above, particular ratios of the number of exposures of the substrate to the first deposition phases (comprising a combination of exposures to the Ti precursor and the N precursor) to the number of exposures of the substrate to the second deposition phases (comprising an exposure to the Si and/or Al precursor or a combination of exposures to the Si and/or Al precursor and the N precursor). The ratio may be about 1:30-1:15, 1:15-1:6, 1:6-1:3, 1:3-1:2, 1:2-2:3, 2:3-5:6, 5:6-1:1, 1:1-6:5, 6:5-3:2, 3:2-2:1, 2:1-3:1, 3:1-6:1, 6:1-15:1, 15:1-30:1, or a ratio in a range defined by any of these values. For instance, the ratio may be one of 2:3, 3:2, 5:4, 7:3, 7:5, 7:1, 10:1 and 15:1. Alternatively, exposures to the Ti precursor and the Si and/or Al precursor can have these ratios. Under the combination of process conditions described herein for forming the diffusion barrier comprising TiSiN and/or TiAlN, the ratio of the exposures to the first deposition phases to the exposures to the second deposition phases is such that Si or Al is present in the diffusion barrier at an average concentration exceeding about 3%, 10%, 20%, 30%, 40%, 50%, 60%, 70%, 80%, 90%, or a value in a range defined by any of these values, on the basis of the total number of atoms in the diffusion barrier.

The inventors have discovered that, by controlling the ratio of the number of exposures of the substrate to the first deposition phases (or the Ti precursor) to the number of exposures of the substrate to the second deposition phases (or the Si or Al precursor) the degree of crystallinity of the resulting thin film comprising TiSiN and/or TiAlN can be continuously tuned, as illustrated in FIGS. 7A-7C. FIGS. 7A-7C show selected area diffraction (SAD) patterns obtained from conformal thin films comprising TiSiN deposited on sidewalls of a high aspect ratio via similar to that illustrated in FIGS. 6A-6C, with varying degrees of crystallinity. FIGS. 7A-7C show, respectively, a SAD pattern of a TiSiN thin film that is substantially fully amorphous, a SAD pattern of a TiSiN thin film that is partly amorphous and partly crystalline or nanocrystalline and a SAD pattern of a TiSiN thin film that is substantially polycrystalline or nanocrystalline. It will be appreciated that the presence of nanocrystalline or polycrystalline domains and the qualitative degree of crystallinity can be determined from the positions and the relative sharpness of the diffraction spots and/or rings that can be indexed to (111), (200) and (220) crystal planes of crystalline TiSiN as indicated in FIG. 7C. For example, an SAD pattern having predominantly diffuse rings can be associated with substantially amorphous TiSiN, while an SAD pattern having predominantly spots can be associated with substantially polycrystalline TiSiN having domain sizes comparable to the selected area used to obtain the SAD pattern. An SAD pattern having nanocrystalline and amorphous phases of TiSiN can have a mix of both diffuse rings and spots. The inventors have discovered that, among other things, an increasing fraction of amorphous phase can be attributed to increasing smoothness, conformality and step coverage of the TiSiN thin film.

Figure 8:
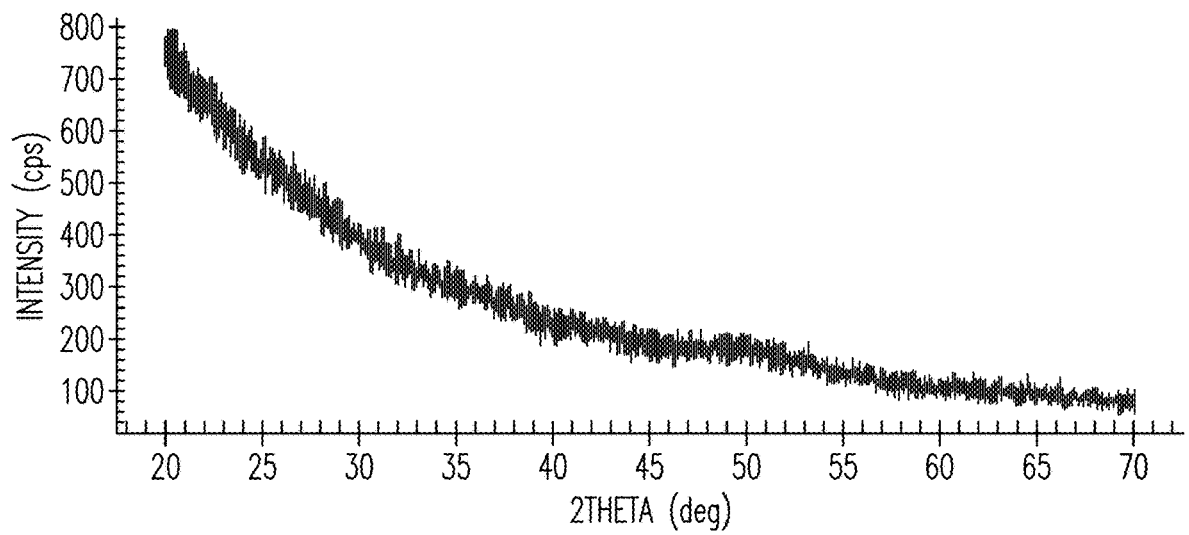
FIG. 8 shows a grazing incidence X-ray diffraction spectrum obtained from a substantially amorphous thin film comprising TiSiN, according to embodiments.

FIG. 8 is a grazing incidence X-ray diffraction pattern of a blanket TiSiN layer formed on a Si substrate that is substantially fully amorphous, according to embodiments. The measured TiSiN layer is similar to the TiSiN layer imaged for the SAD patterns in FIG. 7A and FIGS. 6A-6C. The lack of distinct crystallographic peaks attributable to a crystalline phase of TiSiN layer indicates the substantially fully amorphous nature of the TiSiN layer.

Figure 9:
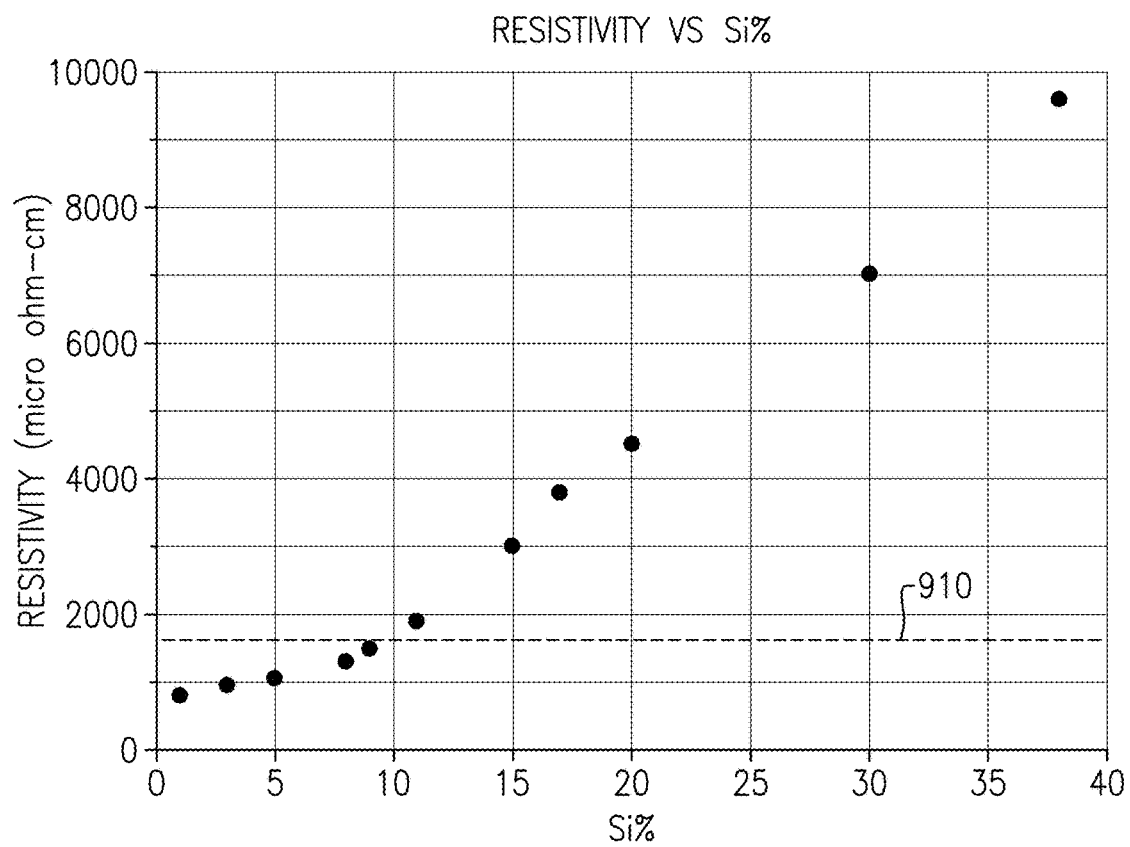
FIG. 9 is a graph of experimentally measured resistivity as a function of silicon content for a thin film comprising TiSiN, according to embodiments.

As described herein, the relative crystallinity of the thin film comprising TiSiN and/or TiAlN can be tuned to optimize various material characteristics, e.g., diffusion barrier characteristics. Under some circumstances, a lower degree of crystallinity may be preferred, e.g., to reduce grain boundaries. Reduced grain boundaries can suppress diffusion of certain elements through the thin film and improve smoothness. However, under other circumstances, a higher degree of crystallinity may be preferred, e.g., to reduce the electrical resistivity of the thin film. FIG. 9 is a graph of experimentally measured resistivity as a function of silicon content for thin films comprising TiSiN, according to embodiments. The graph illustrates that the resistivity of the TiSiN thin film can be tuned over a wide range of values by tuning the relative Si content (atomic %) in the thin film, which can in turn be tuned by tuning the number of exposures to a Si precursor in the cyclic vapor deposition or ALD cycle. The inventors have found that, while the resistivity of the TiSiN layer increases relatively slowly as a function of Si content at relatively low Si content, the resistivity increases relatively fast as a function of Si content at relatively high Si content. The inventors have found that a relatively fast increase in the resistivity as a function of Si content generally coincides with an onset 910 of the emergence of an amorphous phase of TiSiN, as verified experimentally by transmission electron microscopy as described above. It will be appreciated that the onset 910 and the electrical resistivity can depend on, among other things, the deposition temperature and the precursors used. As discussed above, to form at least partly amorphous TiSiN layer, higher than about 10% of Si may be desirable. While the resistivity may increase as a result, the overall thickness may be reduced relative to fully crystalline layers such as TiN layers.

Thus, in circumstances where it is advantageous to have a thin film having a relatively high diffusion barrier capability and/or relatively low surface roughness, the composition of the electrode layer can advantageously be tuned such that the thin film comprising TiSiN and/or TiAlN is at least partially amorphous. In these implementations, the thin film may be substantially entirely amorphous or comprise nanocrystalline regions surrounded by an amorphous matrix. For example, the electrode may include one or more of TiSi/TiAl, TiN, and TiAlN/TiSiN nanocrystals in an amorphous matrix including Ti, Al/Si and N. In the illustrated implementation, the onset 910 at about 1600 $\mu\Omega$-cm corresponds to an average atomic concentration of Si of about 10%. However, in other implementations, the onset can correspond to an average Si concentration of about 10%, 15%, 20% or 25%, or a value in a range defined by any of these values, depending on the deposition conditions and the precursors used. Alternatively, the onset 910 corresponds to a ratio of the number of exposures of substrate to the one or more first deposition phases (each comprising a combination of exposures to the Ti precursor and the N precursor, without exposures to Si and/or Al precursors) to the number of exposures of the substrate to the one or more second deposition phases (each comprising an exposure to the Si and/or Al precursor or a combination of exposures to the Si and/or Al precursor and the N precursor) of 1:1-2:1, 2:1-3:1, 3:1-6:1, 6:1-15:1, 15:1-30:1, or a ratio in a range defined by any of these values, Alternatively, these ratios can represent the ratio of the number of exposures to the Ti precursor to the number of exposures to the N precursor.

The composition of thin films comprising TiSiN and/or TiAlN can be tuned to have an electrical resistivity of <1000 $\mu\Omega$-cm, 1000-2000$\mu\Omega$-cm, 2000-3000 $\mu\Omega$-cm, 3000-4000$\mu\Omega$-cm, 4000-5000$\mu\Omega$-cm, 5000-6000 $\mu\Omega$-cm, 6000-7000$\mu\Omega$-cm, 7000-8000$\mu\Omega$-cm, 8000-9000$\mu\Omega$-cm, 9000-10000$\mu\Omega$-cm, or greater than 10000 $\mu\Omega$-cm, or a value in a range defined by any of these values.

Figure 10A:
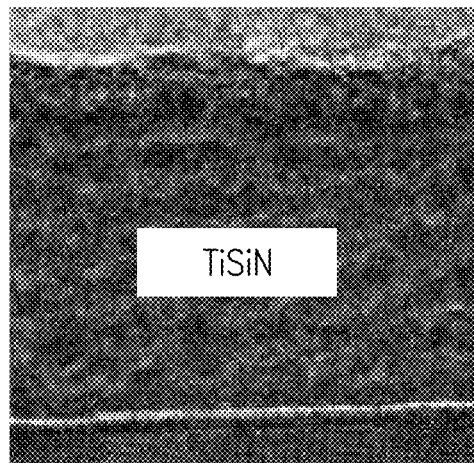
FIG. 10A is a cross-sectional transmission electron micrograph obtained from a substantially homogenous thin film comprising TiSiN, according to embodiments.
Figure 10B:
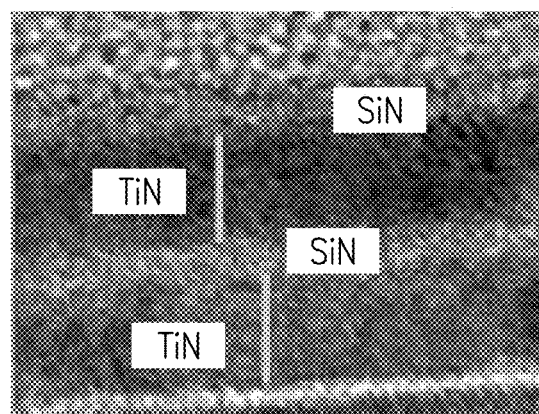
FIG. 10B is a cross-sectional transmission electron micrograph obtained from a nanolaminate thin film comprising regions or layers of TiN alternating with regions or layers of SiN, according to embodiments.

In addition to the degree of crystallinity, the inventors have found that a degree of homogeneity at the nanoscale can also be controlled by controlling the number of exposures to the first deposition phase and/or the number of exposures to the second deposition phase. Under some circumstances, the sequence of first and second deposition phases may be controlled to form a thin film having regions or layers that are rich in TiN and Si and/or Al or SiN and/or AlN, e.g., a nanolaminate comprising TiN-rich regions or layers alternating with Si-rich and/or Al-rich regions or layers or SiN/AlN-rich regions or layers. Under some other circumstances, the despite the distinct sequence if exposures to first and second deposition phases, the resulting thin film may be substantially homogenous TiSiN and/or TiAlN thin films, as described in further detail below. Example implementations are illustrated with respect to FIGS. 10A and 10B. FIG. 10A illustrates a TEM image of a TiSiN layer that is substantially homogeneous, whereas FIG. 10B illustrates a TEM image of a TiSiN layer that is in the form of a nanolaminate comprising TiN-rich regions or layers alternating with SiN-rich regions or layers.

According to various embodiments, when forming a thin film, e.g., a diffusion barrier layer, comprising TiSiN and/or TiAlN, to form a substantially homogenous layer, as shown in FIG. 10A, the number of back-to-back performances of the first deposition phases and/or the second deposition phases may be less than about 50, 30, 25, 20, 15, 10, 5, or value in a range defined by any of these values, when the thin film is deposited at temperatures disclosed above. The thin film may comprise a nanolaminate structure when the number of back-to-back performances of the first deposition phases and/or the second deposition phases exceeds these values. It will be appreciated that the number of back-to-back performances the first and/or second deposition phases for forming a substantially homogenous or a nanolaminate structure may depend on various factors, including temperature, pressure and the precursors used. For example, at a relatively high temperature, higher diffusive mixing of atoms may favor a homogenous composition, whereas at relatively low temperature, lower diffusive mixing of atoms may favor a nanolaminate formation.

The inventors have found that, advantageously, when the thin film comprising TiSiN and/or TiAlN is formed according to embodiments disclosed herein, the surface roughness can also be reduced compared to other diffusion barrier materials, e.g., TiN, or TiSiN formed using other techniques, e.g., CVD or PVD. The reduced surface roughness is particularly advantageous compared to other materials or techniques when the surface on which the diffusion barrier is deposited comprises a nonmetallic surface, e.g., a dielectric surface and/or a semiconductor surface exposed by an opening such as a via or a trench. As deposited, the diffusion barrier having the above-indicated thicknesses can have a root-mean square (RMS) surface roughness of 0.5%, 1%, 1.5%, 2%, 2.5%, 3%, 3.5%, 4%, 4.5% and 5%, on the basis of an average thickness of the diffusion barrier, or a value in a range defined by any of these values or a lower value. Alternatively, as-deposited, the diffusion barrier having the above-indicated thicknesses can have a root-mean square (RMS) surface roughness value that is less than 0.5 nm, 0.4 nm, 0.3 nm, 0.2 nm, 0.1 nm, or a value in a range defined by any of these values or a lower value. The reduced RMS roughness can in turn improve the conformality of the diffusion barrier layers.

Applications

The thin films comprising TiSiN or TiSiN formed using various process parameters according to various embodiments disclosed herein can be used in a variety of applications, particularly where the substrate comprises a topography having a relatively high surface area, relatively high aspect ratio structures and/or a non-metal surface that can benefit from various advantageous characteristics disclosed herein. Example applications include deposition to line a via, a hole, a trench, a cavity or a similar structure having an aspect ratio, e.g., a ratio defined as a depth divided by a top width, that exceeds 1, 2, 5, 10, 20, 50, 100, 200 or a value in a range defined by any of these values.

Figure 11:
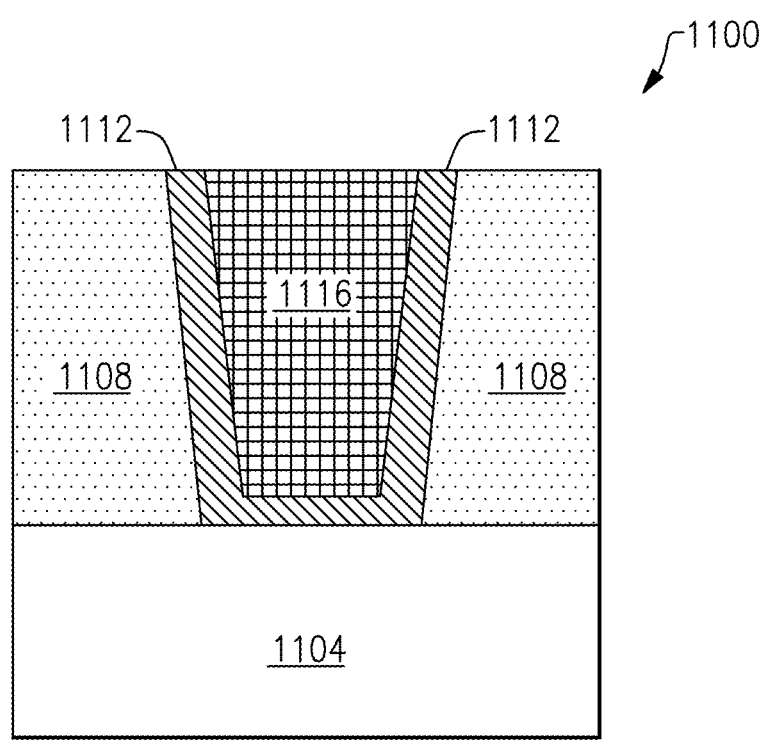
FIG. 11 schematically illustrates a cross-sectional view of a portion of a semiconductor device comprising a contact or metal line formed by filling an opening lined with a thin film comprising TiSiN or TiAlN with a metal, according to embodiments.

FIG. 11 illustrates one example application in the context of forming a diffusion barrier for a contact structure, e.g., a source or drain contact, formed on an active semiconductor substrate region that may be heavily doped. The portion of a semiconductor device 1100 is illustrated, which includes a material 1104 on which a dielectric layer 1108, e.g., an interlayer dielectric (ILD) layer comprising a dielectric material such as a silicon oxide or silicon nitride is formed. To form contacts to various regions of the substrate 1104, including various doped regions, e.g., source and drain regions, a via or a trench may be formed through the dielectric layer 1108. The via or the trench may expose various non-metal surfaces, e.g., an exposed bottom surface comprising a substrate surface, e.g., a silicon substrate surface, as well as dielectric sidewalls of the vias. Thereafter, the bottom and side surfaces of the via can be conformally coated with a thin film comprising TiSiN and/or TiAlN according to various embodiments described herein, in a similar manner as shown in FIGS. 6A-6C. Thereafter, the lined via may be filled with a more conductive material, particularly a metal or metal alloy, e.g., W, Al or Cu, to form a contact plug 1116. For example, the via may be filled with tungsten by CVD using, e.g., $WF_6$.

The barrier layer 1112 formed according to embodiments can be advantageous for various reasons described above. In addition, due to the conformal nature of the barrier layer 1112, the propensity for a pinching off during the subsequent metal fill process may be substantially reduced. In addition, as described above, the barrier layer 1112 can provide effective hindrance of material transport thereacross, e.g., dopant (B, P) out-diffusion from the substrate 1104, as well as in-diffusion of reactants, etchants and metals (e.g., F, Cl, W or Cu) from the contact plug formation process. The barrier effect may be enhanced by reduced surface roughness, increased step coverage, partly amorphous morphology (which can be partly nanocrystalline) and/or homogeneous/nanolaminate morphology. These advantageous effects may be achieved at lower thicknesses relative to a TiN thin film. Furthermore, as described above, a layer-by-layer growth mode may reduce the overall contact resistance of the barrier layer 1112.

Other applications of thin films comprising TiSiN and/or TiAlN formed according various embodiments disclosed herein include various conductive structures formed in recessed substrates (e.g., buried electrodes or lines), electrodes (e.g., DRAM capacitor electrodes or gate electrodes), metallization barriers for higher metal levels (e.g., barriers in vias/trenches for Cu contacts/lines), high aspect ratio vertical rod electrodes or vias for three-dimensional memory and through-silicon vias (TSVs), to name a few.

TiSiN Film Deposition Comprising Ti-Surface Treatment Prior to Si Precursor Exposure Various embodiments described herein address a need for improvement diffusion barriers used in the industry, e.g., TiN-based diffusion barriers as described above with respect to FIG. 2. As described above, low resistivity and high step coverage, among other characteristics of thin films comprising TiSiN, are desirable for many applications, e.g., for forming electrodes and/or diffusion barriers lining high aspect ratio vias or trenches. As discussed above, the process conditions described above with respect to, e.g., FIGS. 5A-5D for conformally coating a substrate having a relatively high area density of high aspect ratio structures may be optimized by controlling, among other things, the reaction chamber pressure or partial pressures of precursors during deposition, the deposition rate, the temperature or pressure of precursors being introduced into the reaction chamber, the flow rate of the precursors and the exposure time, to name a few.

Figure 12:
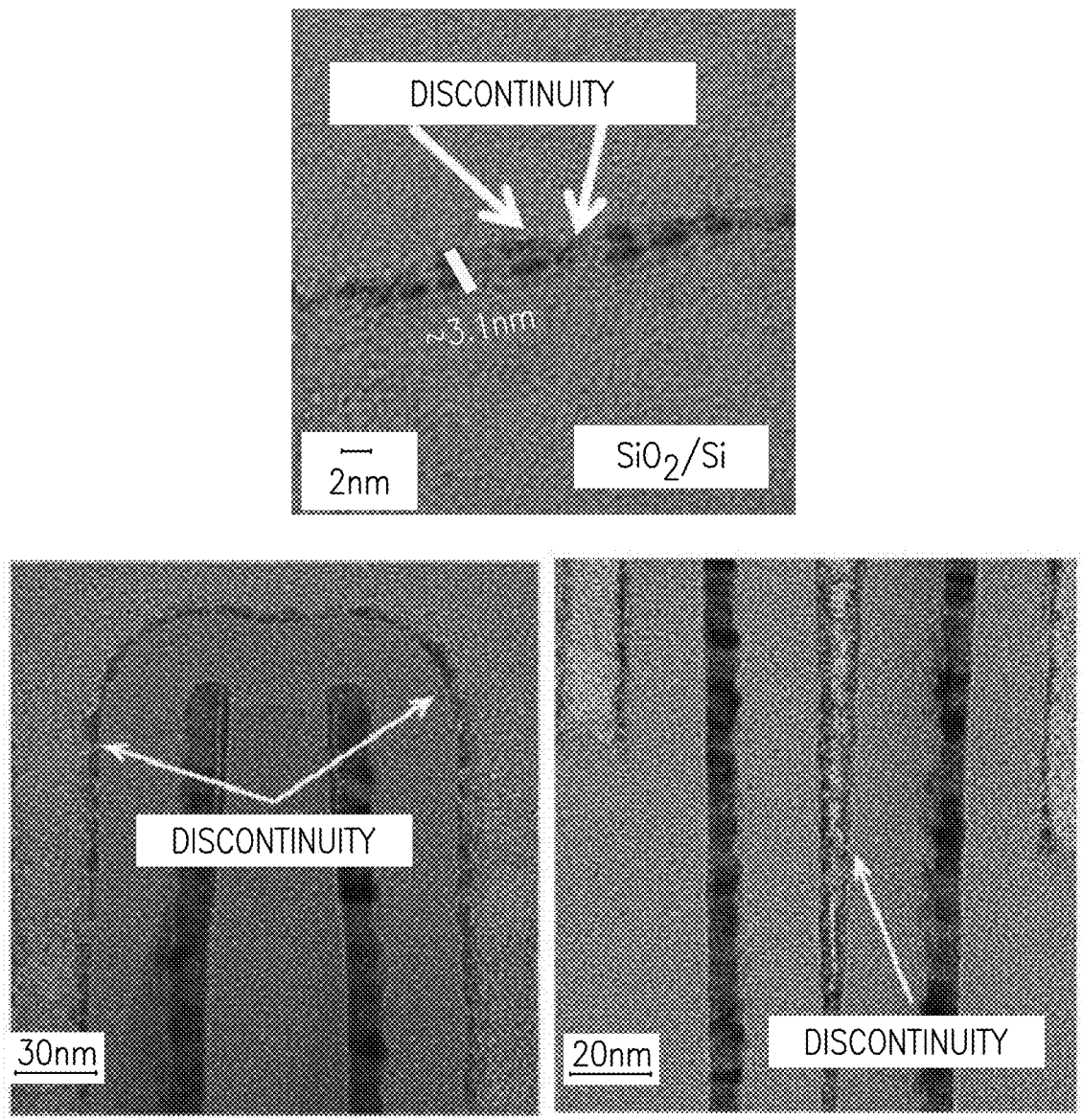
FIG. 12 is a cross-sectional transmission electron micrograph of an ultrathin TiN layer grown by atomic layer deposition on a substrate having topography.

In addition to the above-described improvements provided by TiSiN over other diffusion barrier materials such as TiN, the inventors have discovered that TiSiN can provide other advantages for advanced technology nodes. FIG. 12 show cross-sectional transmission electron micrographs of an ultrathin TiN layer grown by atomic layer deposition on a substrate having topography. The inventors have discovered that, even when grown by atomic layer deposition, ultrathin (e.g., <5 nm) TiN layers may not continuously cover the underlying surface and have discontinuities. Such discontinuities can limit the effectiveness of the TiN layers as diffusion barriers. In contrast, the inventors have discovered that, when deposited under certain deposition conditions described herein, TiSiN can provide continuous and uniform coverage even down to these ultrathin dimensions, e.g., as low as <5 nm, which can be particularly critical for application in ultrathin diffusion barriers for advanced technology nodes. As described herein, the inventors have discovered an alternative to and/or a further improvement to the various methods described above, e.g., with respect to FIGS. 5A-5D, for increasing step coverage and/or decreasing electrical resistivity of TiSiN films. In particular, in the alternative or further improved methods described herein, a semiconductor substrate is exposed to one or more first deposition phases alternating with and without overlapping with one or more second deposition phases in which: exposing the semiconductor substrate to the one or more first deposition phases comprises alternatingly exposing the semiconductor substrate to a titanium (Ti) precursor and a nitrogen (N) precursor; and exposing the semiconductor substrate to the one or more second deposition phases comprises sequentially exposing the semiconductor substrate to the Ti precursor, followed by a silicon (Si) precursor, followed by the N precursor. That is, in the second deposition phase, an exposure to a Ti precursor precedes an Si precursor exposure, which is followed by a N precursor exposure. This alternative method further reduces roughness and enhances the layer-by-layer growth such that the TiSiN films remain continuous even down to ultrathin (e.g., <5 nm) dimensions. In addition, the inventors have found that the method allows for a more precise control of the amount of Ti incorporation, even when one or the precursors undersaturate the surface of the substrate during growth. As a result, the inventors have discovered that the method allows for substantially reduced resistivity values and higher stability of the resistivity values.

Figure 13:
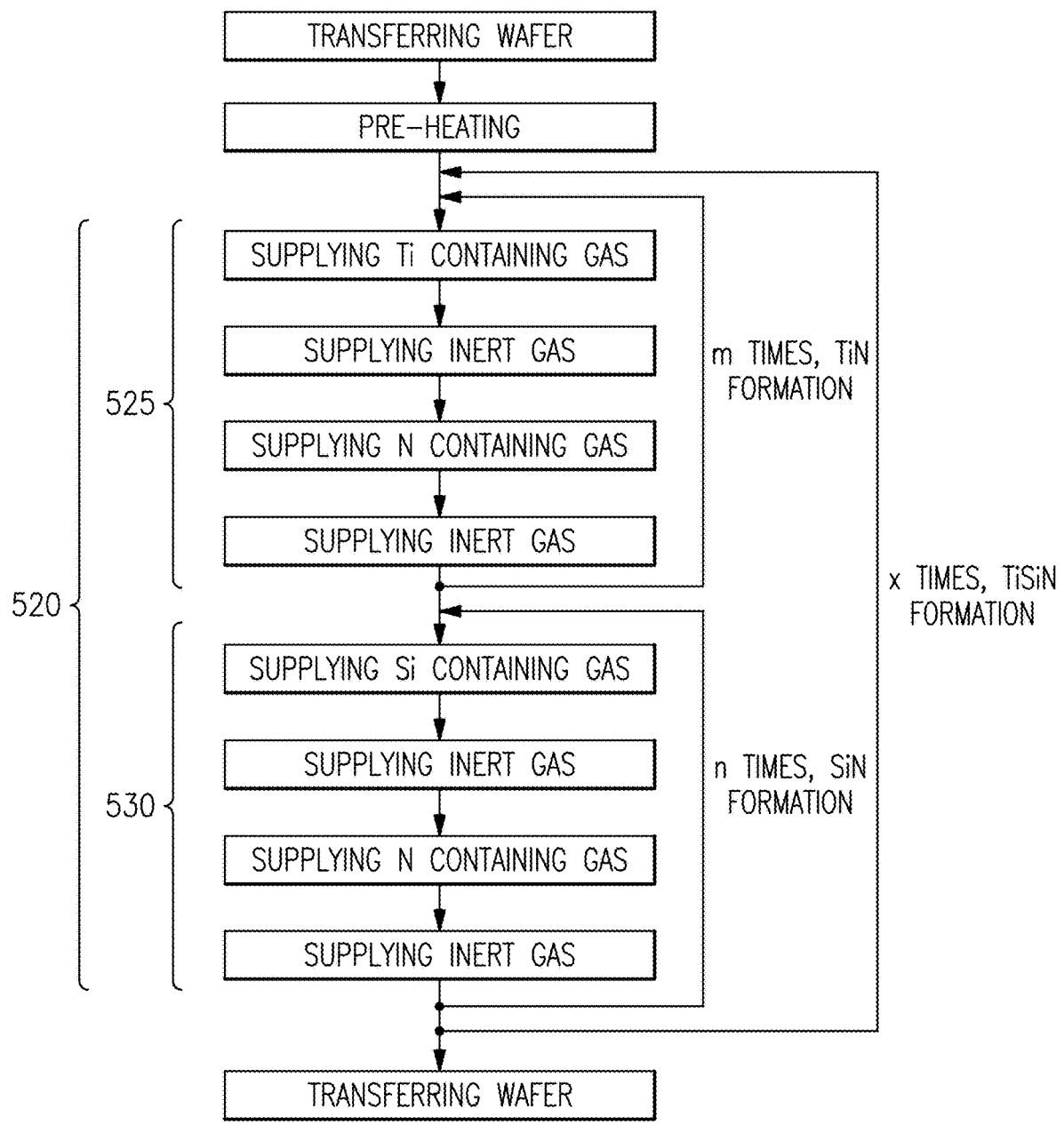
FIG. 13 is a flow chart illustrating a vapor deposition cycle for forming a thin film comprising TiSiN, according to some embodiments.

FIG. 13 is a flow chart illustrating a method of forming a thin film comprising TiSiN, which is similar to that described above with respect to FIGS. 5B-5D. The illustrated method of depositing a thin film comprising TiSiN includes exposing 525 the semiconductor substrate to one or more (m) first deposition phases and exposing 530 the semiconductor substrate to one or more (n) second deposition phases. Each of the first deposition phases in turn comprises a plurality of alternating exposures to the a Ti precursor and a N precursor, and each of the second deposition phases in turn comprises a plurality of alternating exposures to a Si precursor and a N precursor. Additional details of the method illustrated in FIG. 13 have been described above with respect to FIGS. 5B-5D, the details of which are not repeated herein for brevity.

Figure 14:
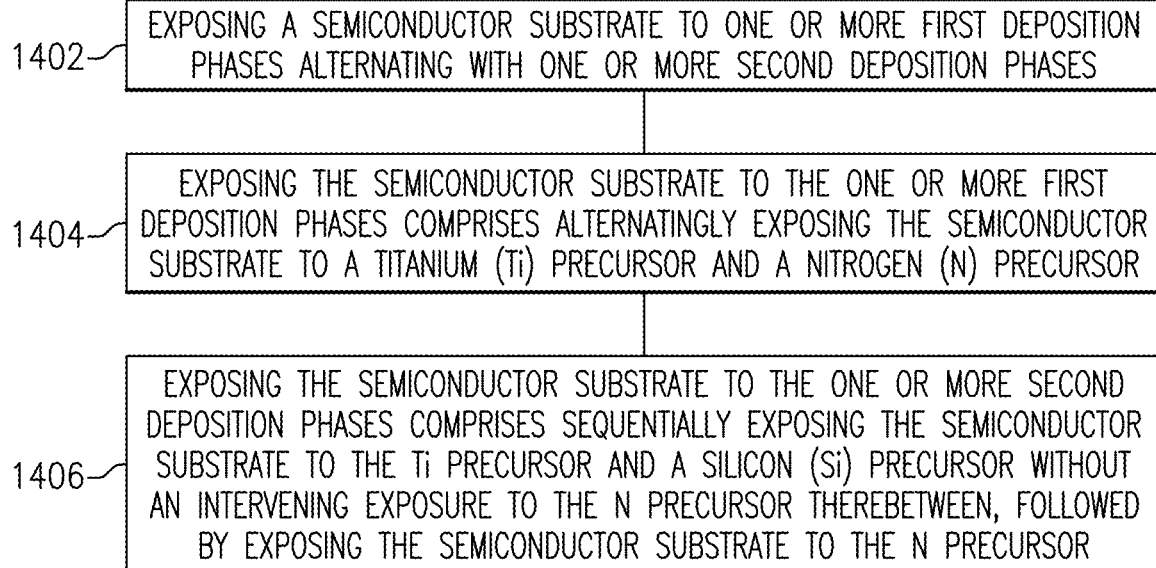
FIG. 14 is a flow chart illustrating a vapor deposition cycle for forming a thin film comprising TiSiN according to an embodiment.
Figure 15:
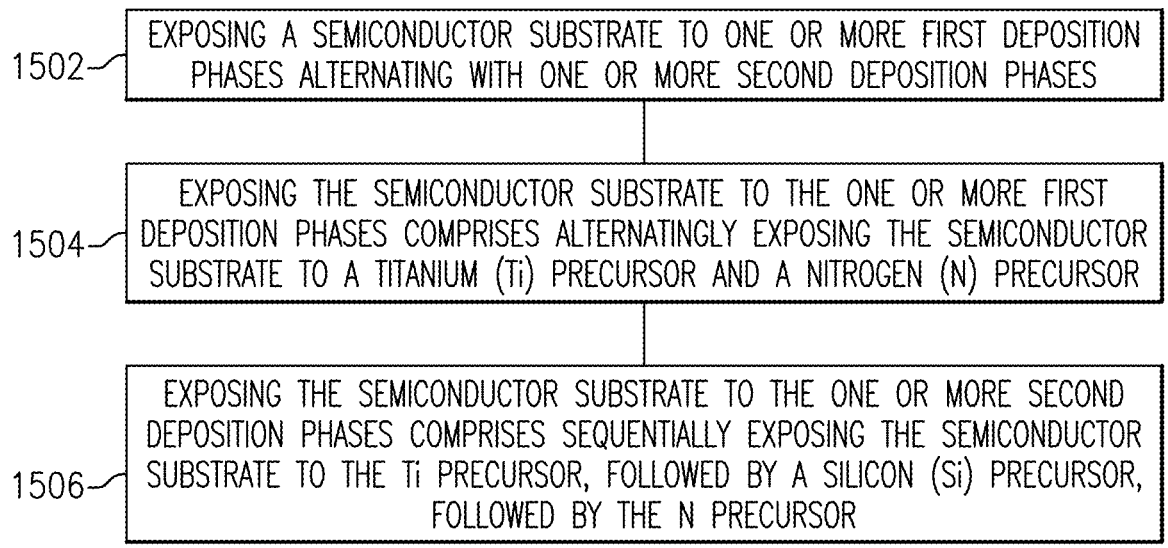
FIG. 15 is a flow chart illustrating a vapor deposition cycle for forming a thin film comprising TiSiN according to an embodiment.

FIGS. 14-16 illustrate alternative or further improved methods of forming a diffusion barrier comprising TiSiN with further improvement in roughness and continuity at ultralow thicknesses, as well as higher precision in controlling the Ti content, such that the resistivity can be lowered with less variability.

FIG. 14 is a flow chart illustrating a method of forming a diffusion barrier comprising TiSiN, according to an embodiment. The method includes a step 1402 of exposing a semiconductor substrate to one or more first deposition phases alternating with one or more second deposition phases. In the method, exposing 1404 the semiconductor substrate to the one or more first deposition phases 1404 comprises alternatingly exposing the semiconductor substrate to a titanium (Ti) precursor and a nitrogen (N) precursor. In the method, exposing 1406 the semiconductor substrate to the one or more second deposition phases comprises sequentially exposing the semiconductor substrate to the Ti precursor and a silicon (Si) precursor without an intervening exposure to the N precursor therebetween, followed by exposing the semiconductor substrate to the N precursor.

FIG. 15 is a flow chart illustrating a method of forming a diffusion barrier comprising TiSiN, according to another embodiment. The method includes a step of 1502 exposing a semiconductor substrate to one or more first deposition phases alternating with one or more second deposition phases. In the method, exposing 1504 the semiconductor substrate to the one or more first deposition phases comprises alternatingly exposing the semiconductor substrate to a titanium (Ti) precursor and a nitrogen (N) precursor. In the method, exposing 1506 the semiconductor substrate to the one or more second deposition phases comprises sequentially exposing the semiconductor substrate to the Ti precursor, followed by a silicon (Si) precursor, followed by the N precursor.

FIG. 16 is a flow chart illustrating a method of forming a diffusion barrier comprising TiSiN according to another embodiment. The method includes a step 1602 of exposing a semiconductor substrate to one or more first deposition phases alternating with one or more second deposition phases. In the method, exposing 1604 the semiconductor substrate to the one or more first deposition phases comprises alternatingly exposing the semiconductor substrate to a titanium (Ti) precursor and a nitrogen (N) precursor. In the method, exposing 1606 the semiconductor substrate to the one or more second deposition phases comprises exposing the semiconductor substrate to the Ti precursor for a Ti precursor exposure duration, followed by a silicon (Si) precursor for a Si precursor exposure duration, followed by the N precursor, wherein a ratio of the Si precursor exposure duration to the Ti precursor exposure duration is between 2 and 130.

Figure 17:
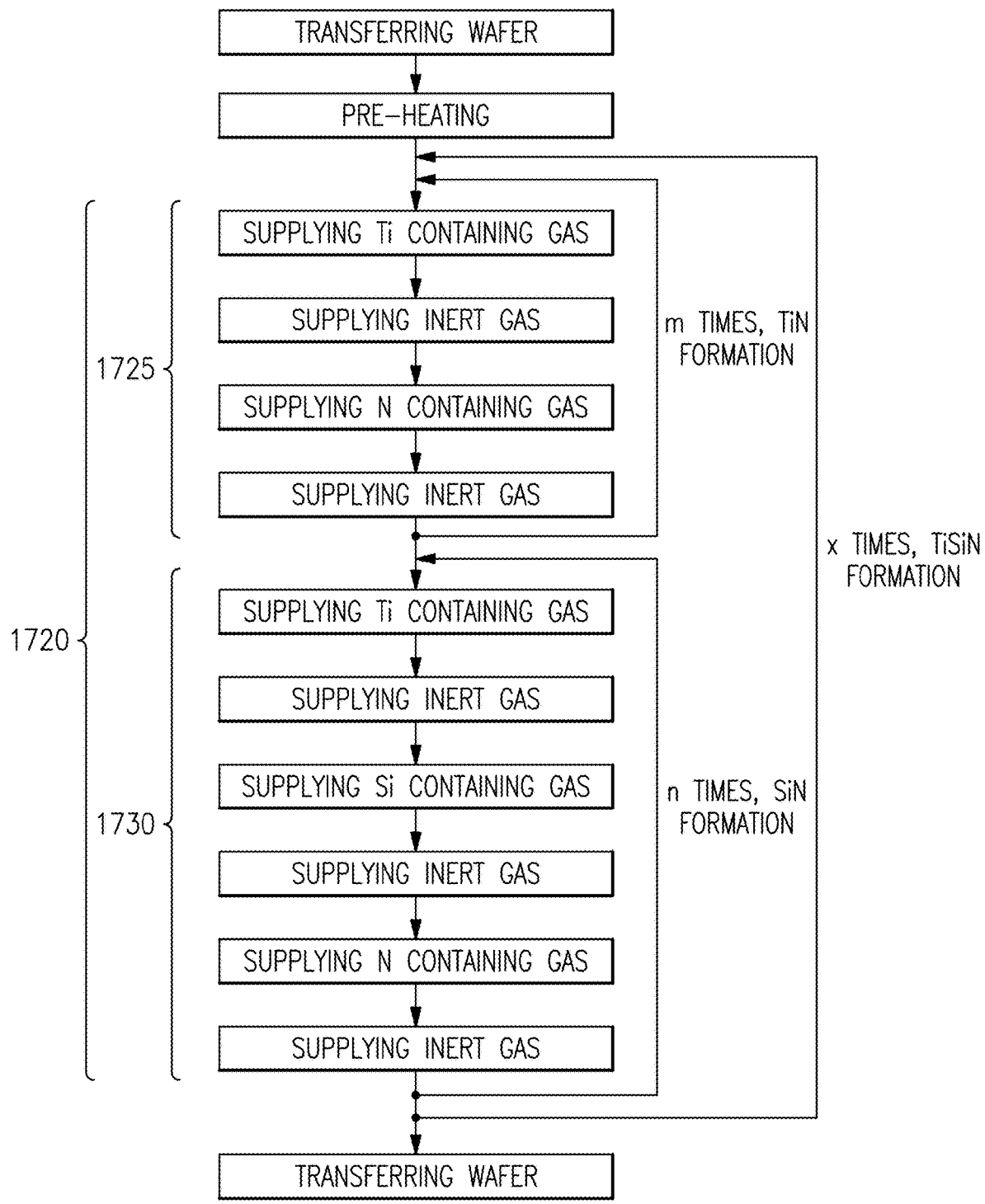
FIG. 17 is a flow chart illustrating a vapor deposition cycle for forming a thin film comprising TiSiN, according to some other embodiments.

FIG. 17 is a flow chart illustrating a method for forming a thin film comprising TiSiN, according to embodiments illustrating a sequence of precursor exposures compatible with any of the embodiments illustrated above with respect to FIGS. 14-16 in which, unlike the method described above with respect to FIG. 13, in the second deposition phase, a Ti precursor precedes a Si precursor exposure that is followed by a N precursor exposure. The illustrated method includes exposing a substrate to one or more (x) vapor deposition cycles 1720 each including exposing 1725 the semiconductor substrate to one or more (m) first deposition phases and exposing 1730 the semiconductor substrate to one or more (n) second deposition phases. The first and second deposition phases alternate with each other without temporally overlapping in the illustrated embodiment. In the illustrated method, the order of exposing 1725 the semiconductor substrate to one or more first deposition phases may be substantially the same as exposing 525 the semiconductor substrate to one or more (m) first deposition phases described above with respect to FIGS. 5B-5D and 13. In particular, exposing 1725 the semiconductor substrate to one or more first deposition phases comprises alternatingly exposing the semiconductor substrate to a titanium (Ti) precursor and a nitrogen (N) precursor, in a similar manner as described above with respect to FIGS. 5B-5D and 13, the details of which are not repeated herein for brevity.

However, unlike the method described above with respect to FIG. 13 (and FIGS. 5B-5D), in the method illustrated in FIG. 17, exposing the semiconductor substrate to each of the second deposition phases additionally comprises exposing the substrate to a titanium (Ti) precursor. In particular, exposing 1730 the semiconductor substrate to one or more second deposition phases comprises sequentially exposing the semiconductor substrate to the Ti precursor, followed by a silicon (Si) precursor, followed by the N precursor.

Additionally or alternatively, exposing 1730 the semiconductor substrate comprises sequentially exposing the semiconductor substrate to the Ti precursor and a Si precursor without an intervening exposure to the N precursor, followed by exposing the semiconductor substrate to the N precursor. In the illustrated embodiment of FIG. 17, when a second deposition phase immediately follows a first deposition phase, exposing 1725 the semiconductor substrate to the first deposition phase comprises exposing the semiconductor substrate to the N precursor as a last precursor, and exposing the semiconductor substrate to the Ti precursor as a first precursor of the second deposition phase.

While the details are omitted herein for brevity, various process parameters used in the illustrated embodiment of FIG. 17 can be similar those used in the methods described above with respect to FIG. 13 and/or FIGS. 5B-5D, including the precursors, the chamber pressure during deposition and the deposition temperature. Similar ones of the parameters are not repeated herein for brevity.

The inventors have discovered that preceding the Si precursor exposure with the Ti precursor exposure as described herein can be advantageous for various reasons stated above. To enhance the advantageous effects, the Ti precursor exposure during the second deposition phase can be optimized with respect to various parameters, including the precursor flow rate and exposure duration relative to other exposures.

To achieve flow rates adapted for depositing TiSiN thin films on substrates having a high surface area and/or high aspect ratio structures using deposition processes with a Ti-surface treatment prior to a Si precursor exposure, the flow rate of each of the Ti precursor and the Si precursor can be adjusted to be less than 1000 standard cubic centimeters per minute (sccm), 800 sccm, 600 sccm, 400 sccm, 200 sccm or a value in a range defined by any of these values or higher. The flow rate of the N precursor can be adjusted to be higher, e.g., less than 10,000 standard cubic centimeters per minute (sccm), 8,000 sccm, 6,000 sccm, 4,000 sccm, 2.000 sccm or a value in a range defined by any of these values or higher. It will be appreciated that a suitable flow rate can depend, among other things, the volume of the reactor, and these flow rates may be suitable for single wafer reactors having a volume of about 1-2 liters. For reactors including a plurality of processing stations, these flow rates may be suitable for each of the processing stations.

Referring back to FIG. 17, the inventors have discovered that exposing the semiconductor substrate to the Ti precursor during exposing 1730 to the second deposition phase can be particularly effective when the exposure time thereof is shorter relative to the exposure time of the Si precursor. Advantageously, in particular embodiments, relatively short exposure times of the Ti precursor in the second deposition phases results in a surprisingly large improvement in electrical resistivity and/or step coverage. In various embodiments, a ratio of exposure times of exposing the semiconductor substrate to the Si precursor and exposing the semiconductor substrate to the Ti precursor in the second deposition phases exceeds 0.05, 0.1, 0.5, 1, 2, 5, 10, 20, 50, 100, 130, 200, 240 or a value in a range defined by any of these values. For example, in the illustrated embodiment in FIG. 17, the Si precursor exposure time of the second deposition phase can be less than 120 sec, 90 sec., 60 sec., 30 sec., 10 sec., 5 sec., 3 sec., 2 sec., 1 sec., 0.5 sec., 0.1 sec., or be a value in a range defined by any of these values, while a Ti exposure time of the second deposition phase can be less than 2 sec., 1.5 sec., 1.2 sec., 1.0 sec., 0.7 sec., 0.5 sec., or be a value in a range defined by any of these values.

Still referring to FIG. 17, the inventors have further discovered that exposing the semiconductor substrate to the Ti precursor during exposing 1730 to the second deposition phase can be particularly effective when the exposure time thereof is longer relative to the exposure time of the Ti precursor during exposing 1725 to the first deposition phase. Advantageously, in various embodiments, a ratio of exposure times of exposing the semiconductor substrate to the Ti precursor in the second deposition phases and exposing the semiconductor substrate to the Ti precursor in the first deposition phases exceeds 0.5, 1, 3, 5, 10, 20, 30, 40 or a value in a range defined by any of these values. For example, in the illustrated embodiment in FIG. 17, the Ti precursor exposure time of the first deposition phase can be less than 1 sec., 0.5 sec., 0.2 sec., 0.1 sec., 0.05 sec. or be a value in a range defined by any of these values, while a Ti exposure time of the second deposition phase can be less than 2 sec., 1.5 sec., 1.2 sec., 1.0 sec., 0.7 sec., 0.5 sec., or be a value in a range defined by any of these values.

Still referring to FIG. 17, the inventors have further discovered that exposing the semiconductor substrate to the N precursor during exposing 1730 to the second deposition phase can be particularly effective when the exposure time thereof is longer relative to the exposure time of the N precursor during exposing 1725 to the first deposition phase. Advantageously, in various embodiments, a ratio of exposure times of exposing the semiconductor substrate to the N precursor in the second deposition phases and exposing the semiconductor substrate to the N precursor in the first deposition phases exceeds 1, 2, 5, 10, 20, 50, 100, 200, 500, 600 or a value in a range defined by any of these values. For example, in the illustrated embodiment in FIG. 17, the N precursor exposure time of the first deposition phase can be less than 1 sec., 0.5 sec., 0.2 sec., 0.1 sec., or be a value in a range defined by any of these values, while a N exposure time of the second deposition phase can be less than 60 sec., 30 sec., 10 sec., 5 sec., 2 sec., 1 sec., 0.5 sec., 0.2 sec., or be a value in a range defined by any of these values.

Still referring to FIG. 17, by way of illustration only, typical durations of Ti precursor pulse/Ti precursor purge/N precursor pulse/N precursor purge in the first deposition phase can be 0.05-1 sec./0.2-1 sec./0.1-1 sec./0.2-1 sec., respectively, while typical durations of Ti precursor pulse/Ti precursor purge/Si precursor pulse/Si precursor purge/N precursor pulse/N precursor purge in the second deposition phase can be 0.5-2 sec./0.2-1 sec./0.2-120 sec./0.5-5 sec./ 0.2-120 sec./0.5-5 sec., respectively.

By controlling various Ti precursor exposure conditions in the second deposition phase as described herein, the TiSiN thin film formed using the method according to embodiments can have a resistivity that is lower compared to a diffusion barrier formed using the same method except for exposing the semiconductor substrate to the Ti precursor as part of the one or more second deposition phases, by at least 200 μΩ·cm, 500 μΩ·cm, 1000 μΩ·cm, 1500 μΩ·cm or a value in a range defined by any of these values. Thus formed TiSiN thin films can have a resistivity that is lower than 2500 μΩ·cm, 2000 μΩ·cm, 1500 μΩ·cm, 1000 μΩ·cm, 500 μΩ·cm or a value in a range defined by any of these values.

In addition to the exposure times, the ratio (m/n) of the number of the first deposition phases (m) to the number of the second deposition phases (n) can be adjusted for tuning various characteristics of the resulting TiSiN thin film.

Figure 18A:
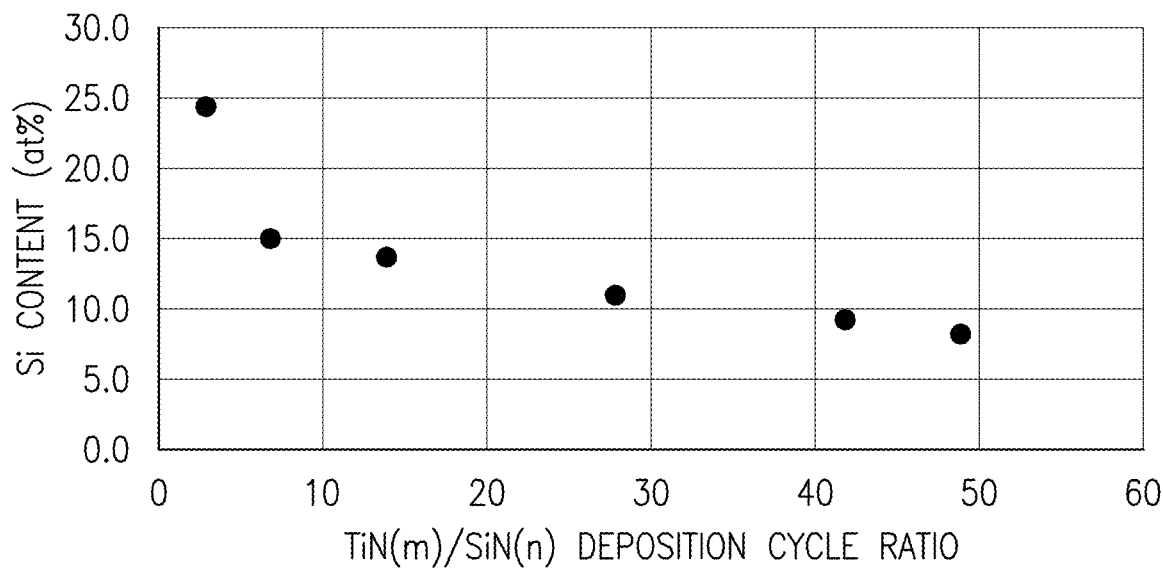
FIG. 18A is a graph of experimentally measured Si content of TiSiN thin films, where the Si content is displayed as a function of a ratio of a number of first deposition phases and a number of second deposition phases.

FIG. 18A is a graph of experimentally measured Si content of TiSiN thin films deposited according to the method illustrated in FIG. 17, where the Si content is displayed as a function of a ratio of a number of first deposition phases and a number of second deposition phases. As shown, the Si content in the deposited TiSiN thin film was observed to decrease as a function of increasing m/n ratio. As shown, the rate of reduction of the Si content as a function of the m/n ratio unexpectedly decreases (shows an inflection point) when the m/n ratio increases above about 7. This reduction coincides with the resistivity trend (FIG. 18C). In the illustrated experimental results, for forming TiSiN thin films having low resistivity (e.g., below about 2000 μΩ·cm) corresponding to a Si content of 15% or less, adjusting the m/n to be greater than 7 is shown to be critical. Above a Si content of 15% or greater corresponding to m/n ratio greater than about 7, the nanostructure of the TiSiN becomes substantially amorphous, as shown in FIG. 18B.

Figure 18B:
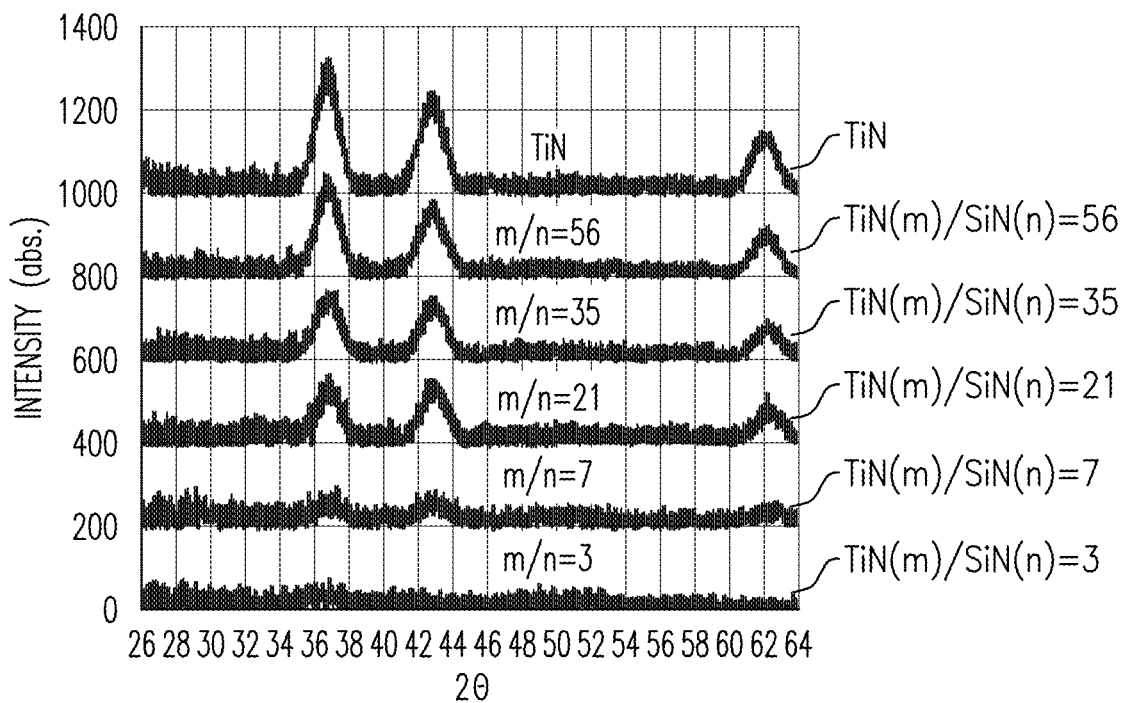
FIG. 18B is a graph of experimentally measured grazing incidence X-ray diffraction spectra of TiSiN thin films, where different curves correspond to TiSiN thin films having different ratios of a number of first deposition phases and a number of second deposition phases.
Figure 18C:
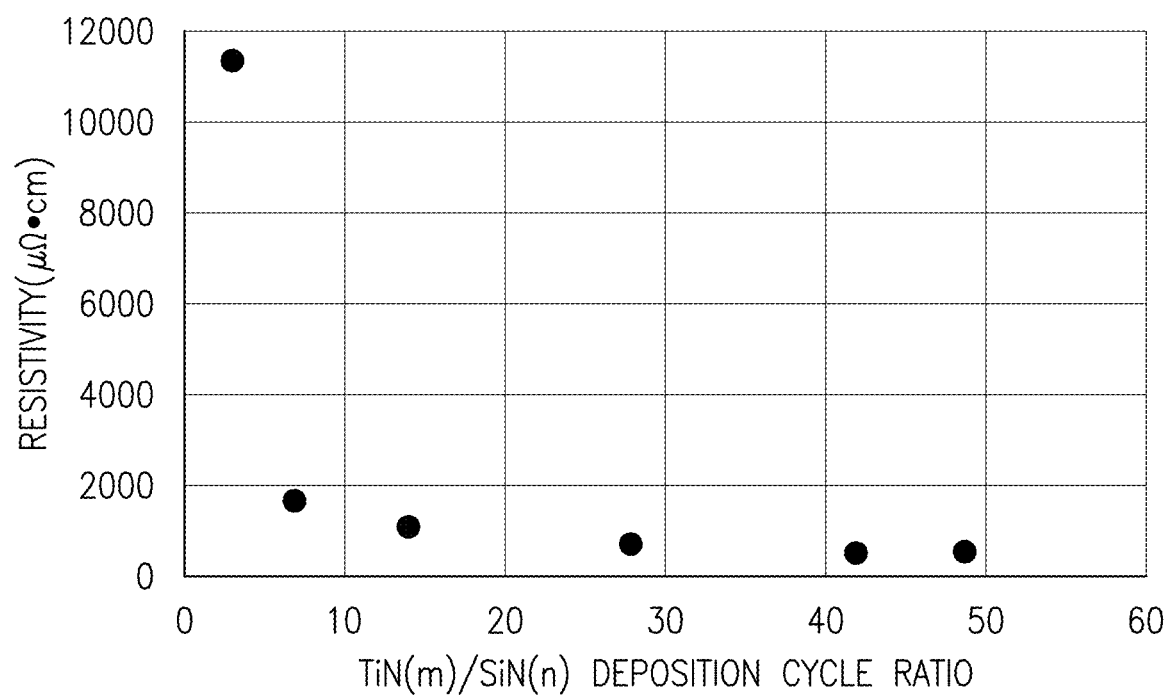
FIG. 18C is a graph of electrical resistivities experimentally measured from the TiSiN thin films measured for their Si contents as illustrated in FIG. 18A.

FIG. 18B is a graph of experimentally measured grazing incidence X-ray diffraction (XRD) spectra of TiSiN thin films deposited according to the method illustrated in FIG. 17, where different curves correspond to TiSiN thin films having different ratios of a number of first deposition phases and a number of second deposition phases. As shown, the XRD peak intensities of (111), (002), and (220) domains were observed to decrease as a function of decreasing m/n ratio. As shown from the signal/noise ratio, the amount of the amorphous phase of in the TiSiN films increases as the m/n ratio is decreased.

FIG. 18C is a graph of electrical resistivities experimentally measured on the TiSiN thin films measured for their Si contents as illustrated in FIG. 18A. As shown, the resistivity of TiSiN film was observed to decrease as a function of increasing m/n ratio. As shown and discussed above, the rate of increase of the resistivity unexpectedly increases when the m/n ratio falls below 7. In the illustrated experimental results, for forming TiSiN thin films having a resistivity of 2000 μΩ·cm less, adjusting the m/n to be greater than 7 can be critical. Below this ratio, in addition to the high resistivity values, the variability of the resistivity for small changes in Si content can render the process unsuitable for high volume manufacturing.

The inventors have found that preceding a Si precursor exposure in the second deposition phase enables, among other things, a lower resistivity of the resulting TiSiN film with relatively small variability in the resistivity as a function of exposure times, even when one or more of the exposures to Ti, Si and N precursors in the second deposition phases under-saturate the substrate surface. As a result, the run-to-run variability of the TiSiN thin films is reduced, and the manufacturability thereof is enhanced. This is illustrated in the following with respect to various precursors. Furthermore, the throughput can be enhanced because of a lack of need for unnecessarily long exposure times during the second deposition phase. Thus, according to embodiments, exposing the semiconductor to one or more of the Ti precursor, the Si precursor and the N precursor during the one or more second deposition phases, e.g., as illustrated in any of FIGS. 14-17, comprises under-saturating a major surface of the semiconductor substrate.

As described herein, a precursor surface saturation condition refers to a condition where increasing the exposure time for a particular precursor does not result in a substantial change in the degree surface saturation by the precursor. Conversely, under-saturation refers to a condition where increasing the exposure time for a particular precursor does result in a substantial change in the degree of surface saturation by the precursor. While a degree of surface saturation is difficult to absolutely measure, it can be inferred by measuring relevant electrical or physical parameters. For example, for a given parameter, if an exposure for a duration is used to achieve a given value of the parameter, and if an additional exposure for the same or longer duration does not change the value of the parameter by more than, e.g., 10%, it may be inferred that the surface was substantially saturated.

Figure 19A:
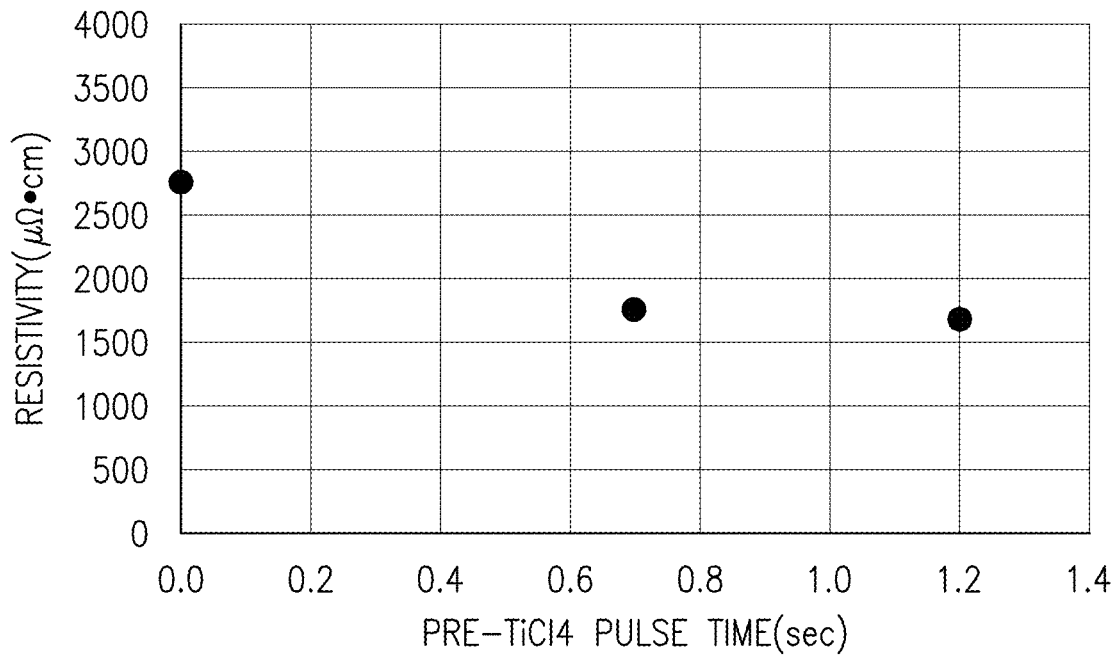
FIGS. 19A-19B are graphs of experimentally measured electrical resistivities as a function of Ti exposure time in the second deposition phase of the deposition cycle illustrated in FIG. 17, where the exposure times to dichlorosilane as the Si precursor were fixed at 60 seconds and 90 seconds, respectively.
Figure 19B:
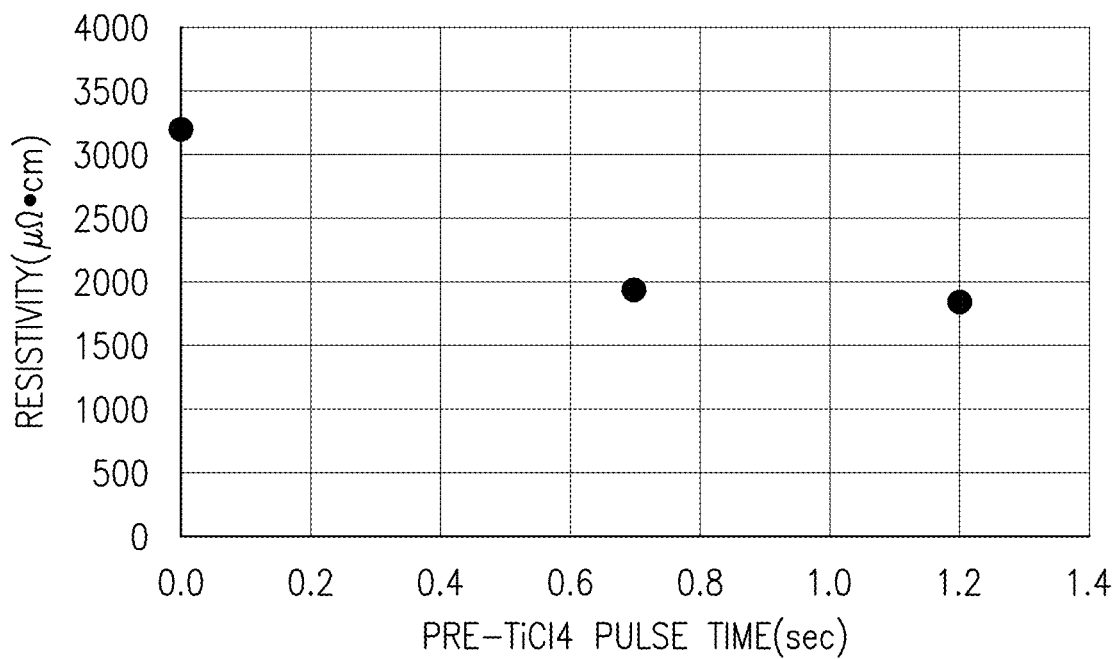

FIGS. 19A-19B are graphs of experimentally measured electrical resistivities of TiSiN thin films as a function of Ti precursor (TiCl$_4$) exposure time in the second deposition phase of the deposition cycle illustrated in FIGS. 14-17, where the exposure times to dichlorosilane (SiH$_2$Cl$_2$, "DCS") as the Si precursor were fixed at 60 seconds and 90 seconds, respectively. As illustrated, the reduction in the electrical resistivity of the TiSiN thin film can be observed with increasing Ti precursor exposure time in the second deposition phase. It can be seen that, compared to a TiSiN thin film deposited using a process that is the same except for omitting the Ti precursor exposure in the second deposition phase, the TiSiN thin films deposited with the Ti precursor exposure time as short as 0.7 sec. in the second deposition phase have substantially lower resistivities. While longer exposure times further reduce the resistivity, it can be seen that the substantial reduction is achieved with Ti precursor pulse duration as short as 0.7 sec. As shown, without the leading Ti exposure in the second deposition phase (zero value in the x-axis), compared to 60 seconds of exposure to DCS, an exposure to 90 seconds of DCS increases the resistivity from about 2800 μΩ cm to about 3200 μΩ cm, which is greater than 10%. That is, it can be inferred that 60 seconds of DCS may not be sufficient to substantially saturate the surface. Regardless of the DCS saturation level, however, a Ti precursor exposure with a duration as short as 0.7 sec. is observed to be effective in substantially reducing the resistivity. Afterwards, the change in resistivity with additional increase in Ti precursor exposure time results in a substantially less change in resistivity. As shown, compared to the TiSiN thin film obtained with a Ti precursor exposure duration of 0.7 sec. in the second deposition phase, the TiSiN thin film obtained with a Ti exposure duration of 1.2 sec. has an electrical resistivity that has changed by a relatively small amount, e.g., about 10% or less. The results illustrate that, by insertion of a relatively short Ti precursor prior to the Si precursor in the second deposition phase, two advantageous technical effects are obtained, namely a substantial reduction in the resistivity as well as a substantial reduction in the variability of resistivity.

Figure 20A:
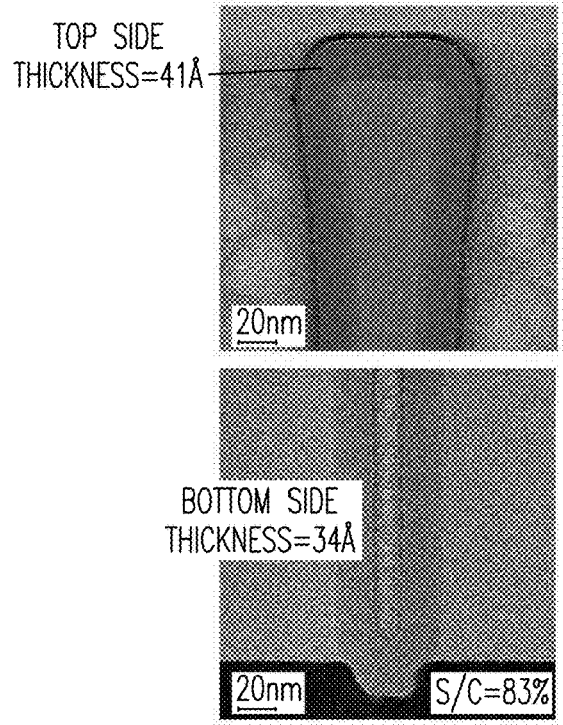
FIGS. 20A-20C are cross-sectional transmission electron micrographs obtained from high aspect ratio structures lined with TiSiN thin films formed using different Ti exposure times in the second deposition phase of the deposition cycle illustrated in FIG. 17.
Figure 20B:
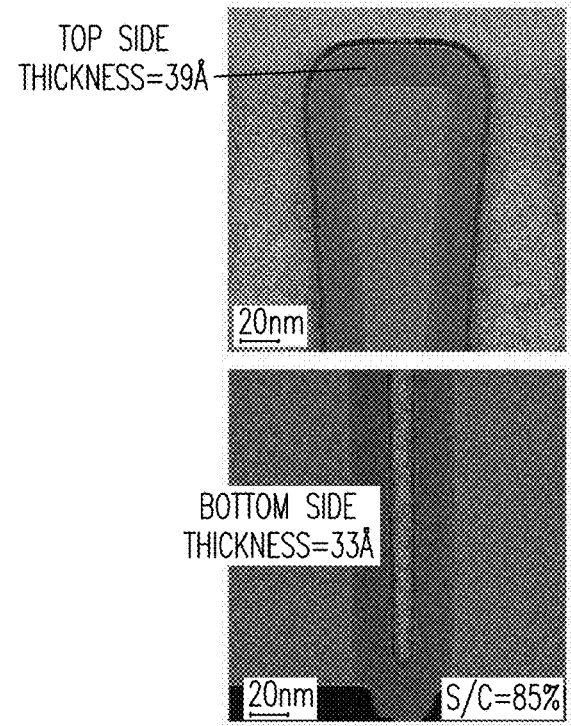
Figure 20C:
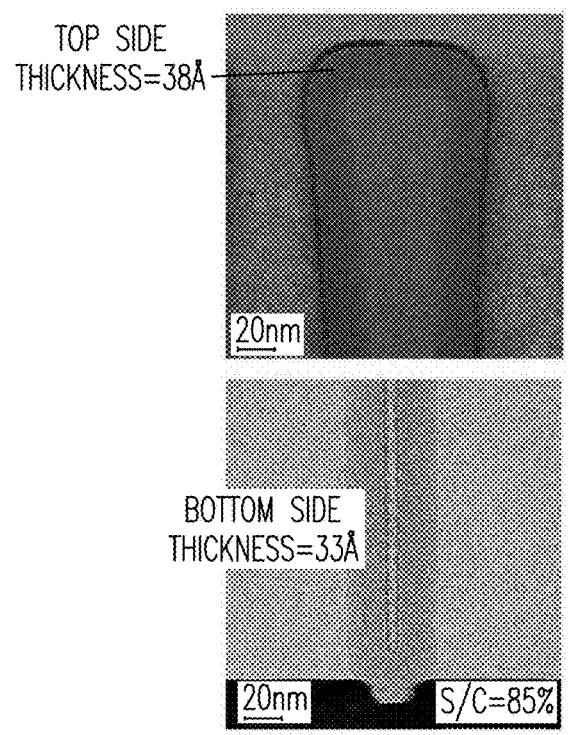

FIGS. 20A-20C are cross-sectional transmission electron micrographs obtained from high aspect ratio structures lined with TiSiN thin films formed using different Ti precursor (TiCl$_4$) exposure times in the second deposition phase of the deposition cycle similar to that illustrated in FIG. 17. The micrographs in FIGS. 20A-20C were obtained after lining the high ratio structures having an aspect ratio of 57:1 (measured using the width of the opening at the top) with a TiSiN thin film having an equivalent thickness of about 4 nm on a planar semiconductor substrate. The TiSiN thin films imaged in the micrographs of FIGS. 20A-20C were formed using a method in accordance with those illustrated in FIGS. 14-17, where in the second deposition phase, the Si precursor (dichlorosilane) exposure time was fixed at 90 seconds while the Ti precursor exposure times were 0 sec., 0.7 sec. and 1.2 sec., respectively. As can be seen, the step coverage was measured to be 83%, 85% and 87% from the micrographs in FIGS. 20A-20C, respectively.

Figure 21A:
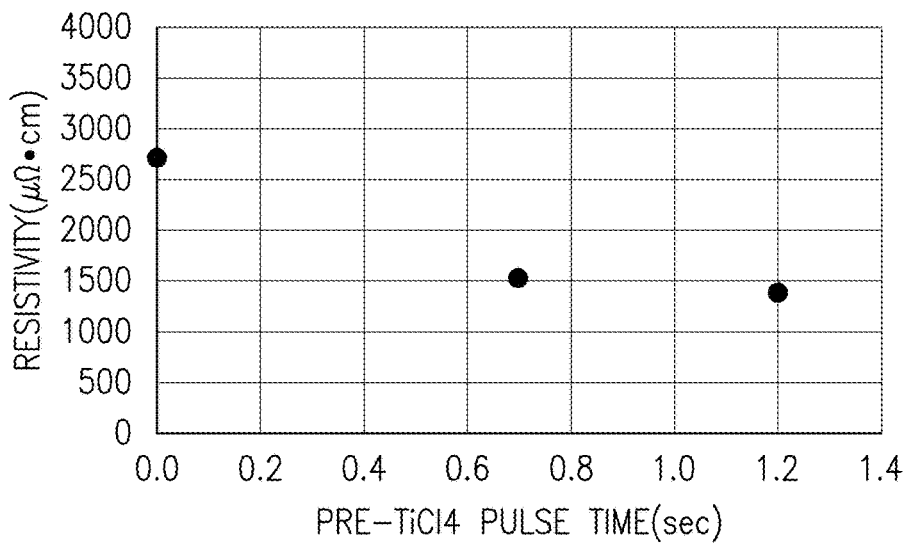
FIGS. 21A-21C are graphs of experimentally measured electrical resistivities as a function of Ti exposure time in the second deposition phase of the deposition cycle illustrated in FIG. 17, where the exposure times to monochlorosilane as the Si precursor were fixed at 3.5 seconds, 30 seconds and 90 seconds, respectively.
Figure 21B:
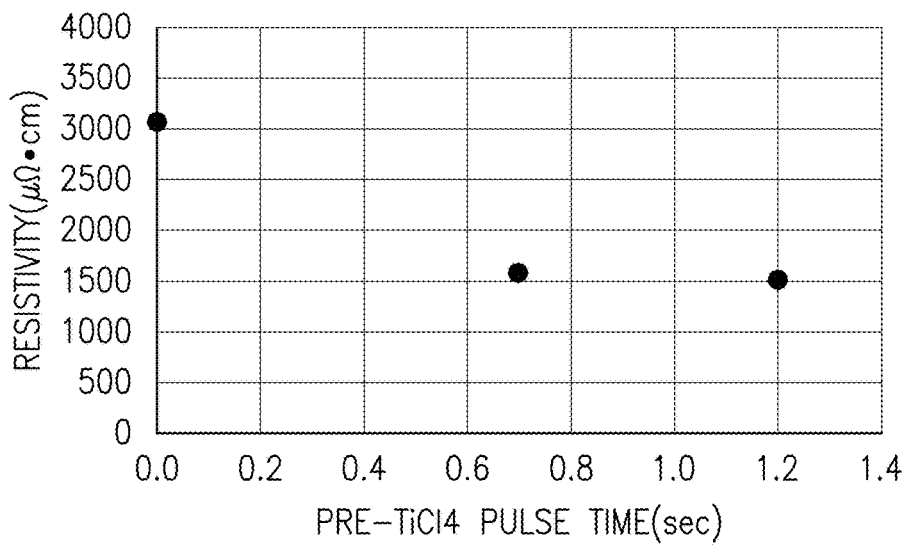
Figure 21C:
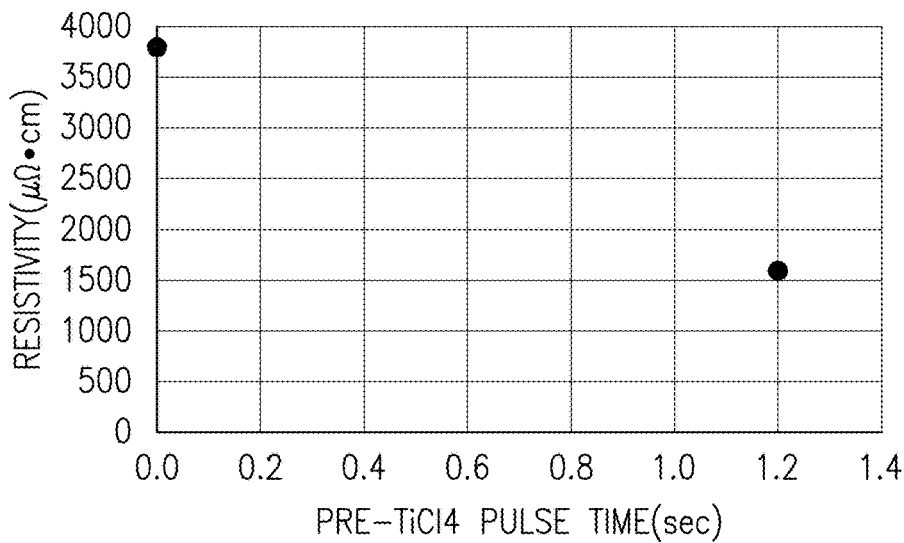

FIGS. 21A-21C are graphs of experimentally measured electrical resistivities as a function of Ti precursor (TiCl$_4$) exposure time in the second deposition phase of the deposition cycle illustrated in FIGS. 14-17, where the exposure times to monochlorosilane (SiH$_3$Cl, "MCS") as the Si precursor were fixed at 3.5 seconds, 30 seconds and 90 seconds, respectively. As illustrated, the reduction in the electrical resistivity of the TiSiN film can be observed with increasing Ti precursor exposure time in the second deposition phase. It can be seen that, compared to a TiSiN thin film deposited using a process that is the same except for omitting the Ti precursor exposure in the second deposition phase, the TiSiN thin films deposited with the Ti precursor exposure time as short as 0.7 sec. in the second deposition phase have substantially lower resistivities. While longer exposure times further reduce the resistivity, it can be seen that the substantial reduction is achieved with pulse duration as short as 0.7 sec. Here, similar observations described above with respect to FIGS. 19A and 19B can be made. As shown, without the leading Ti exposure in the second deposition phase (zero value in the x-axis), regardless of the MCS saturation level, a Ti precursor exposure with a duration as short as 0.7 sec. is observed to be effective in substantially reducing the resistivity. Afterwards, the change in resistivity with additional increase in Ti precursor exposure time results in a substantially less change in resistivity. As shown, compared to the TiSiN thin film obtained with a Ti precursor exposure duration of 0.7 sec. in the second deposition phase, the TiSiN thin film obtained with a Ti exposure duration of 1.2 sec. has an electrical resistivity that has changed by a relatively small amount, e.g., about 10% or less. The results illustrate that, by insertion of a relatively short Ti precursor prior to the Si precursor in the second deposition phase, two advantageous technical effects are obtained, namely a substantial reduction in the resistivity as well as a substantial reduction in the variability of resistivity.

Figure 22A:
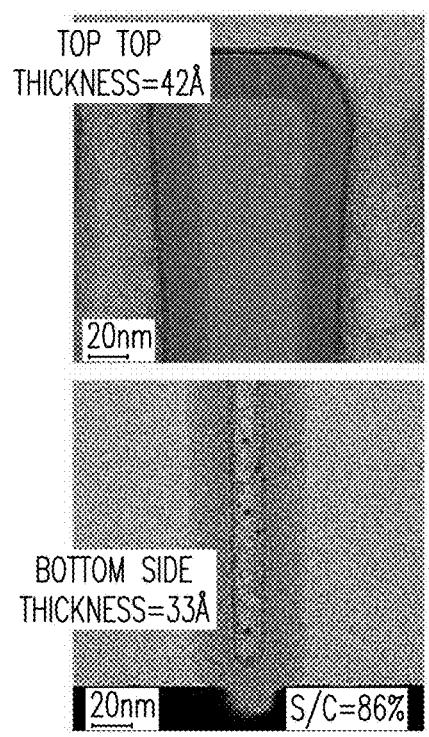
FIGS. 22A-22C are cross-sectional transmission electron micrographs obtained from high aspect ratio structures lined with TiSiN thin films formed using different Ti exposure times in the second deposition phase of the deposition cycle illustrated in FIG. 17.
Figure 22B:
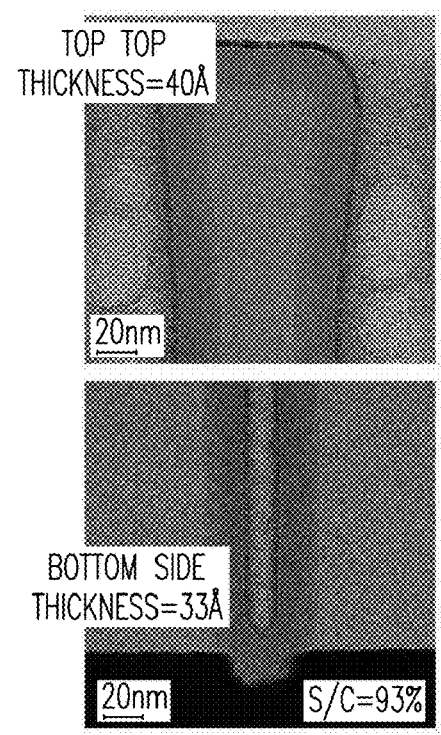
Figure 22C:
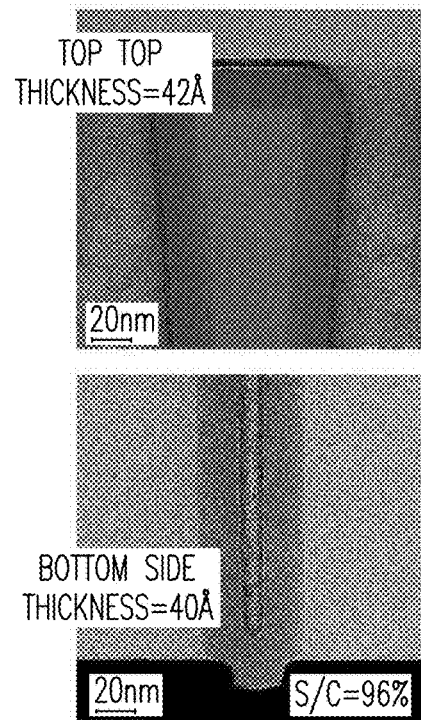

FIGS. 22A-22C are cross-sectional transmission electron micrographs obtained from high aspect ratio structures lined with TiSiN thin films formed using different Ti precursor (TiCl$_4$) exposure times in the second deposition phase of the deposition cycle similar to that illustrated in FIG. 17. The micrographs in FIGS. 22A-22C were obtained after lining the high ratio structures having an aspect ratio of 57:1 (measured using the width of the opening at the top) with a TiSiN thin film having an equivalent thickness of 4 nm on a planar semiconductor substrate. The TiSiN thin films imaged in the micrographs of FIGS. 22A and 22B were formed using a method similar to that illustrated in FIGS. 14-17, where in the second deposition phase, the Si precursor (monochlorosilane) exposure time was fixed at 3.5 seconds while the Ti exposure times were 0 sec. and 1.2 sec., respectively. The TiSiN thin film imaged in the micrographs of FIG. 22C was formed using a method similar to that illustrated in FIGS. 14-17, where in the second deposition phase, the Si precursor (monochlorosilane) exposure time was 90 seconds while the Ti exposure time was 1.2 sec. As can be seen, the step coverage was measured to be 86%, 93% and 96% from the micrographs in FIGS. 22A-22C, respectively.

Figure 23A:
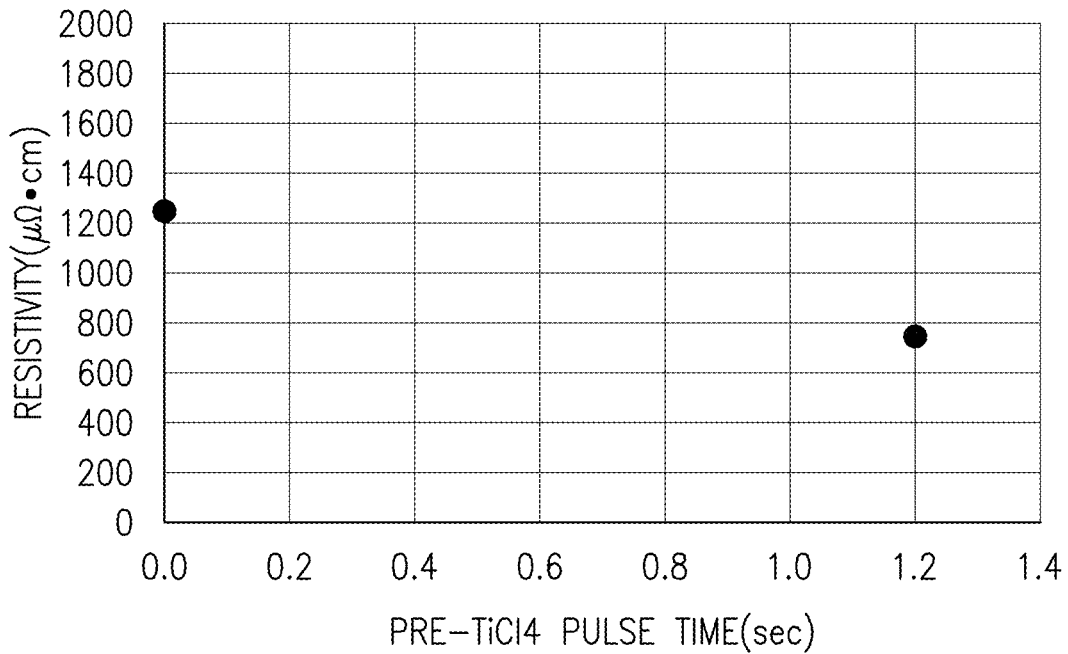
FIGS. 23A-23B are graphs of experimentally measured electrical resistivities as a function of Ti exposure time in the second deposition phase of the deposition cycle illustrated in FIG. 17, where the exposure times to dichlorosilane as the Si precursor were fixed at 5 seconds and 30 seconds, respectively.
Figure 23B:
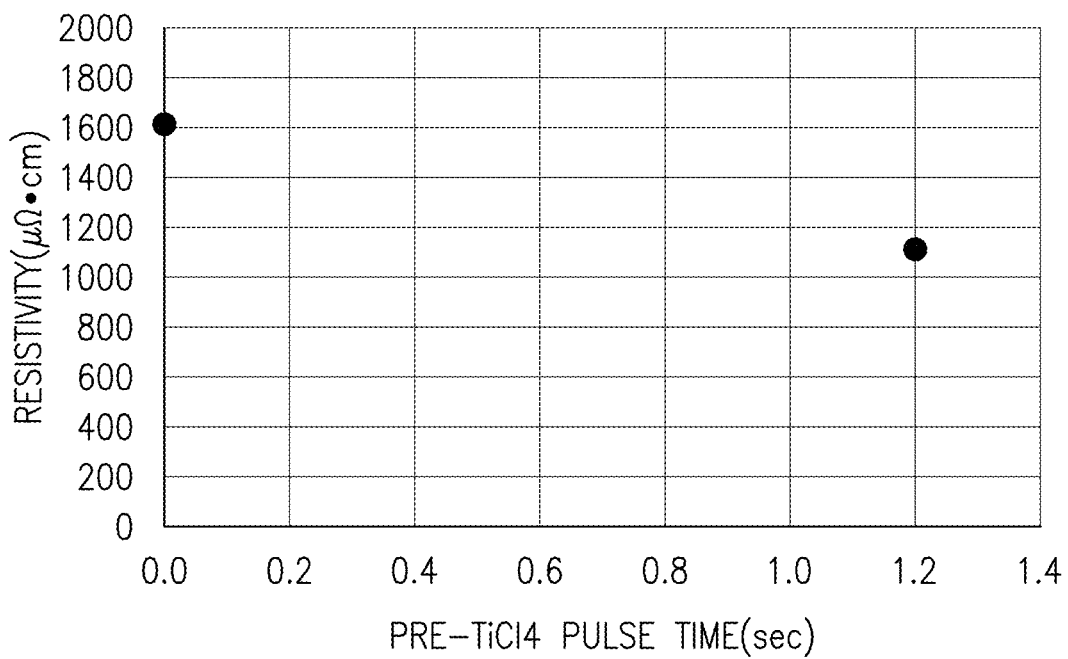

FIGS. 23A-23B are graphs of experimentally measured electrical resistivities as a function of Ti precursor (TiCl$_4$) exposure time in the second deposition phase of the deposition cycle illustrated in FIG. 14-17, where the exposure times to trisilicon octochloride (Si$_3$Cl$_8$, "OTCS") as the Si precursor were fixed at 5 seconds and 30 seconds, respectively. As illustrated, the reduction in the electrical resistivity of the TiSiN film can be observed with increasing Ti precursor exposure time in the second deposition phase. It can be seen that, compared to a TiSiN thin film deposited using a process that is the same except for omitting the Ti precursor exposure in the second deposition phase, the TiSiN thin films deposited with the Ti precursor exposure time as short as 1.2 sec. in the second deposition phase have substantially lower resistivities. Here, similar observations described above with respect to FIGS. 19A and 19B can be made. As shown, without the leading Ti exposure in the second deposition phase (zero value in the x-axis), regardless of the OTCS saturation level, a Ti precursor exposure with a duration as short as 1.2 sec. is observed to be effective in substantially reducing the resistivity. Similarly, by insertion of a relatively short Ti precursor prior to the Si precursor in the second deposition phase, two advantageous technical effects are obtained, namely a substantial reduction in the resistivity as well as a substantial reduction in the variability of resistivity.

Figure 24A:
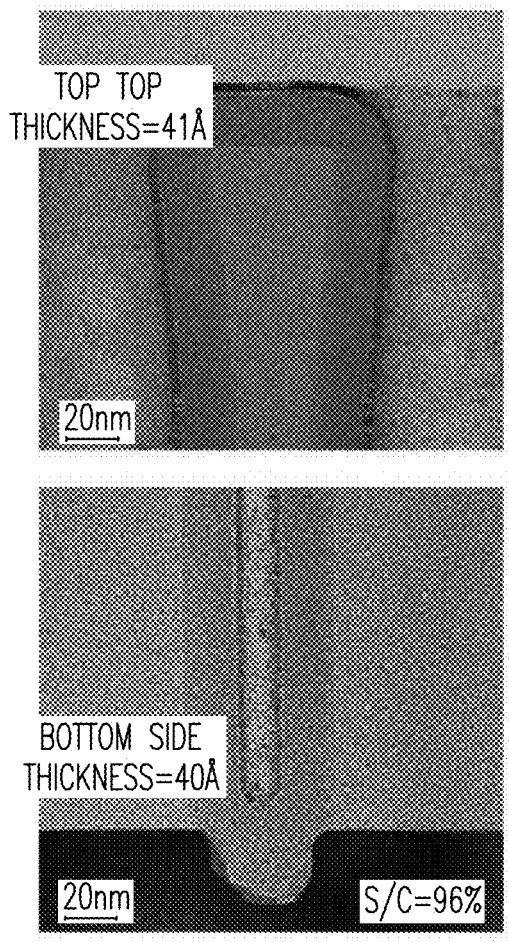
FIGS. 24A-24B are cross-sectional transmission electron micrographs obtained from high aspect ratio structures lined with TiSiN thin films formed using different Ti exposure times in the second deposition phase of the deposition cycle illustrated in FIG. 17.
Figure 24B:
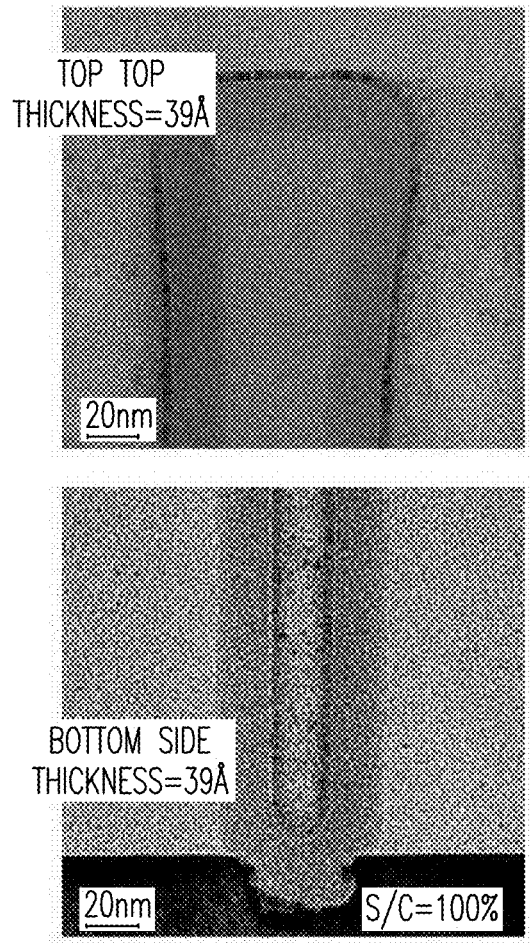

FIGS. 24A-24B are cross-sectional transmission electron micrographs obtained from high aspect ratio structures lined with TiSiN thin films formed using different Ti precursor (TiCl$_4$) exposure times in the second deposition phase of the deposition cycle similar to that illustrated in FIG. 17. The micrographs in FIGS. 24A-24B were obtained after lining the high ratio structures having an aspect ratio of 57:1 (measured using the width of the opening at the top) with a TiSiN thin film having an equivalent thickness of 4 nm on a planar semiconductor substrate. The TiSiN thin films imaged in the micrographs of FIGS. 24A-24B were formed using a method similar to that illustrated in FIGS. 14-17, where in the second deposition phase, the Si precursor (OTCS) exposure time was fixed at 5 seconds while the Ti precursor exposure times were 0 sec. and 1.2 sec., respectively. As can be seen, the step coverage was measured to be 96% and 100% from the micrographs in FIGS. 24A-24B, respectively.

Advantageously, transmission electron micrographs illustrated with respect to FIGS. 20A-20C, 22A-22C and 24A-24B demonstrate that TiSiN greatly improves smoothness of ultrathin diffusion barriers compared to ALD TiN thin films (see, e.g., FIG. 12), In each of the transmission electron micrographs illustrated with respect to FIGS. 20A-20C, 22A-22C and 24A-24B, the TiSiN thin films continuously cover the substrate surface at thicknesses less than 5 nm.

Figure 25A:
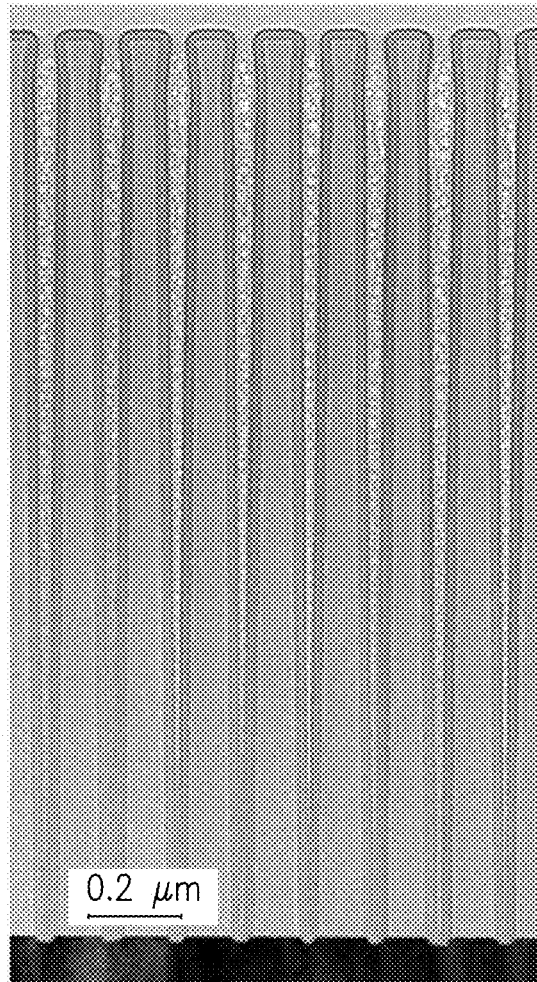
FIGS. 25A and 25B are lower and higher resolution cross-sectional transmission electron micrographs obtained from high aspect ratio structures lined with a TiSiN thin film.

In the transmission electron micrographs illustrated with respect to FIGS. 20A-20C, 22A-22C and 24A-24B, the aspect ratio of 57:1 has been measured as a ratio of the height to the width of the top opening. A full view of the trench structure is shown in FIG. 25A. It will be appreciated that an aspect ratio can be defined in various ways. For example, a ratio of the height to the width of the bottom opening is about 171:1.

TiN/TiSiN Nanolaminate Diffusion Barrier Deposition

Referring back to the methods described above with respect to FIGS. 13 and 17, the inventors have discovered that the ratio (m/n) of the number of the first deposition phases (m) to the number of the second deposition phases (n) can be adjusted to form either a substantially homogenous film comprising TiSiN or a nanolaminate comprising TiN and TiSiN as distinct layers.

Figure 26A:
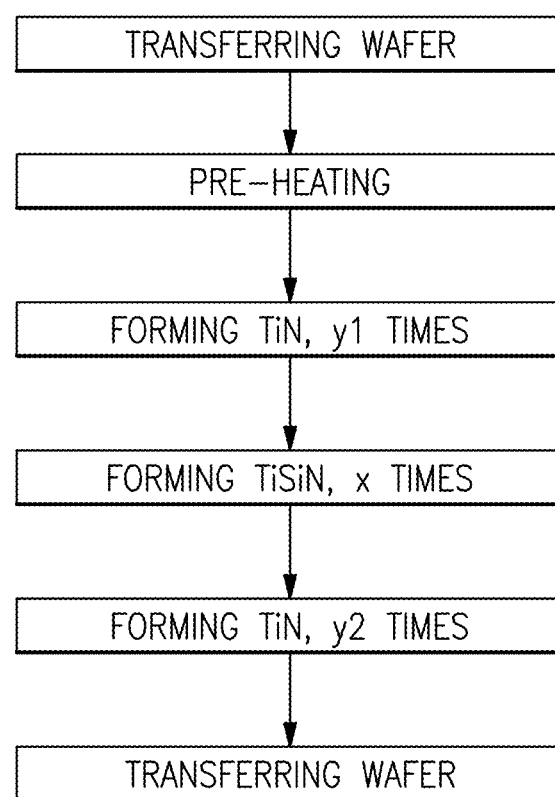
FIG. 26A is a flow chart illustrating a method of forming a nanolaminate thin film, according to some embodiments.
Figure 26B:
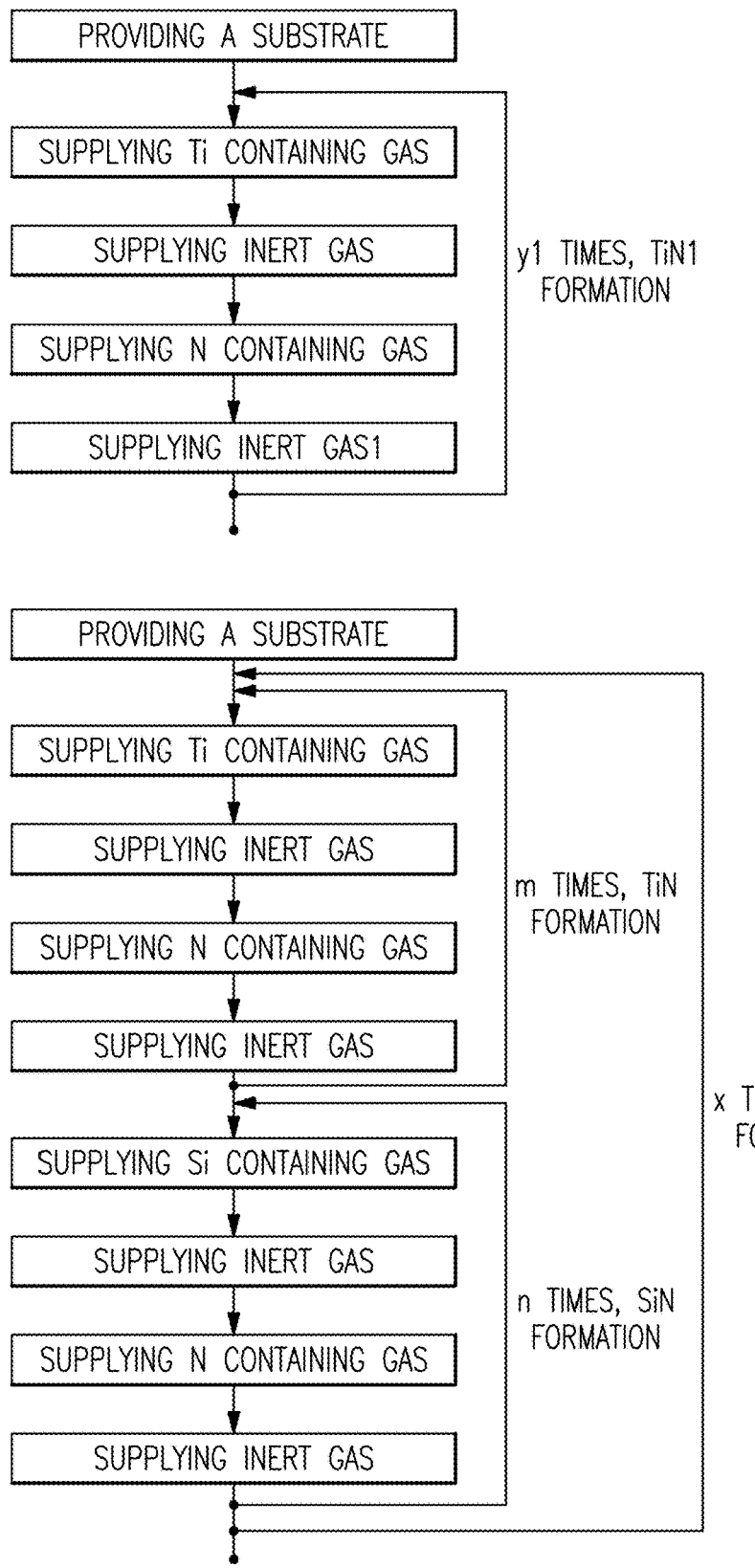
FIG. 26B is a flow chart illustrating a method of forming a nanolaminate thin film using vapor deposition cycles similar to that illustrated in FIG. 13, according to some embodiments, according to some embodiments.

FIG. 26A is a flow chart illustrating a method of forming a nanolaminate thin film, according to some embodiments. As illustrated in FIG. 26A, the method includes depositing a thin film comprising TiN by exposing the semiconductor substrate to one or more (y1) first deposition phases, depositing a thin film comprising TiSiN by exposing the semiconductor substrate to one or more (x) second deposition phases and forming another thin film comprising TiN by exposing the semiconductor substrate to one or more (y2) first deposition phases. In some embodiments, y1 and y2 are different. FIG. 26B is a flow chart illustrating a method of forming a nanolaminate thin film using vapor deposition cycles similar to that illustrated in FIGS. 5B-5D and 13, according to some embodiments. FIG. 26C is a flow chart illustrating a method of forming a nanolaminate thin film using vapor deposition cycles similar to that illustrated in FIGS. 14-17, according to some embodiments, according to some embodiments According to various embodiments, when forming a thin film, e.g., a diffusion barrier layer comprising TiSiN, to form a substantially homogenous layer, the number of back-to-back performances of the first deposition phases and/or the second deposition phases may be less than about 50, 30, 25, 20, 15, 10, 5, or a value in a range defined by any of these values, when the thin film is deposited at temperatures disclosed above. On the other hand, the thin film may comprise a nanolaminate structure when the number of back-to-back performances of the first deposition phases and/or the second deposition phases exceeds these values.

Figure 27A:
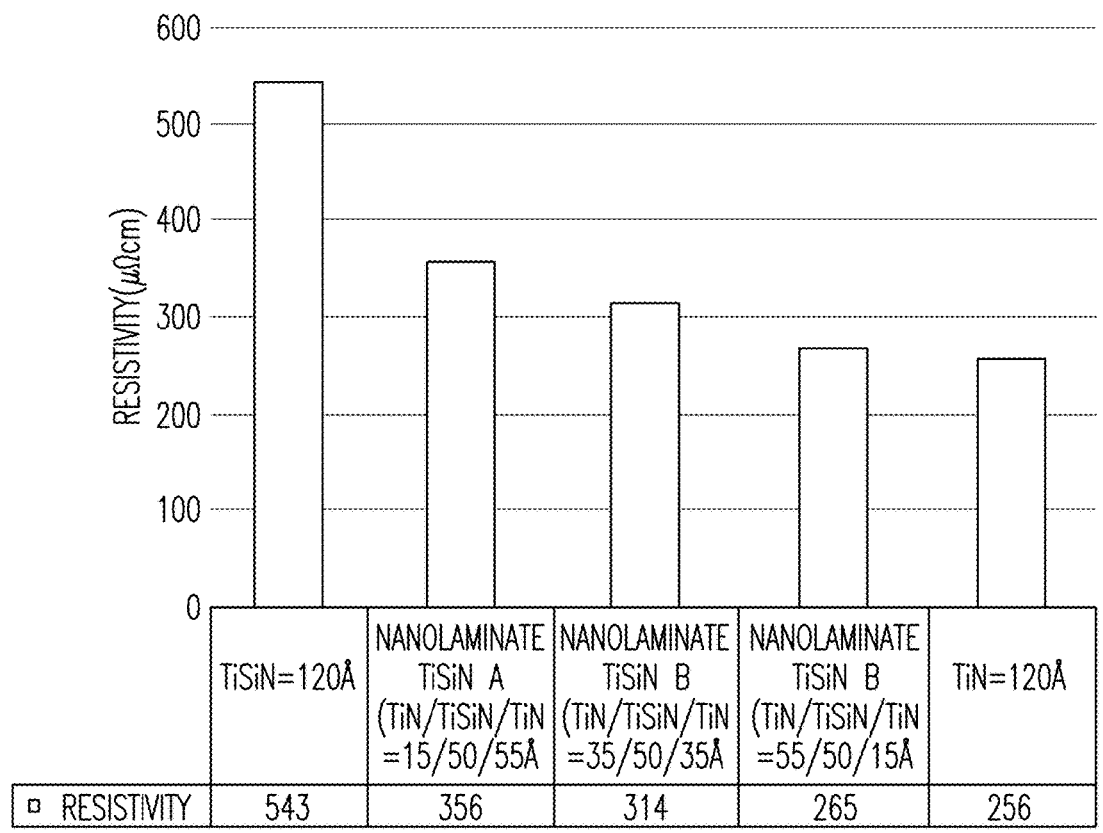
FIG. 27A is a graph of electrical resistivities experimentally measured on various nanolaminate thin films deposited according to the method illustrated in FIGS. 26A and 26C, according to some embodiments.

FIG. 27A is a graph of electrical resistivities experimentally measured on various nanolaminate thin films deposited according to the method illustrated in FIGS. 26A and 26C, according to some embodiments. The measured nanolaminate thin films include a TiSiN thin film interposed between two TiN thin films. It can be seen that, by independently adjusting the thicknesses of the upper and lower TiN thin films, the electrical resistivity can be tuned. Unexpectedly, while the total combined thicknesses of the TiN thin films were the same in the three nanolaminate films measured, the electrical resistivity was unexpectedly lowered when the lower TiN thin film was thinner than the upper TiN thin film. It will be appreciated that at least the various advantages described above with respect to homogenous TiSiN films have been equally observed in the nanolaminates according to embodiments.

Figure 27B:
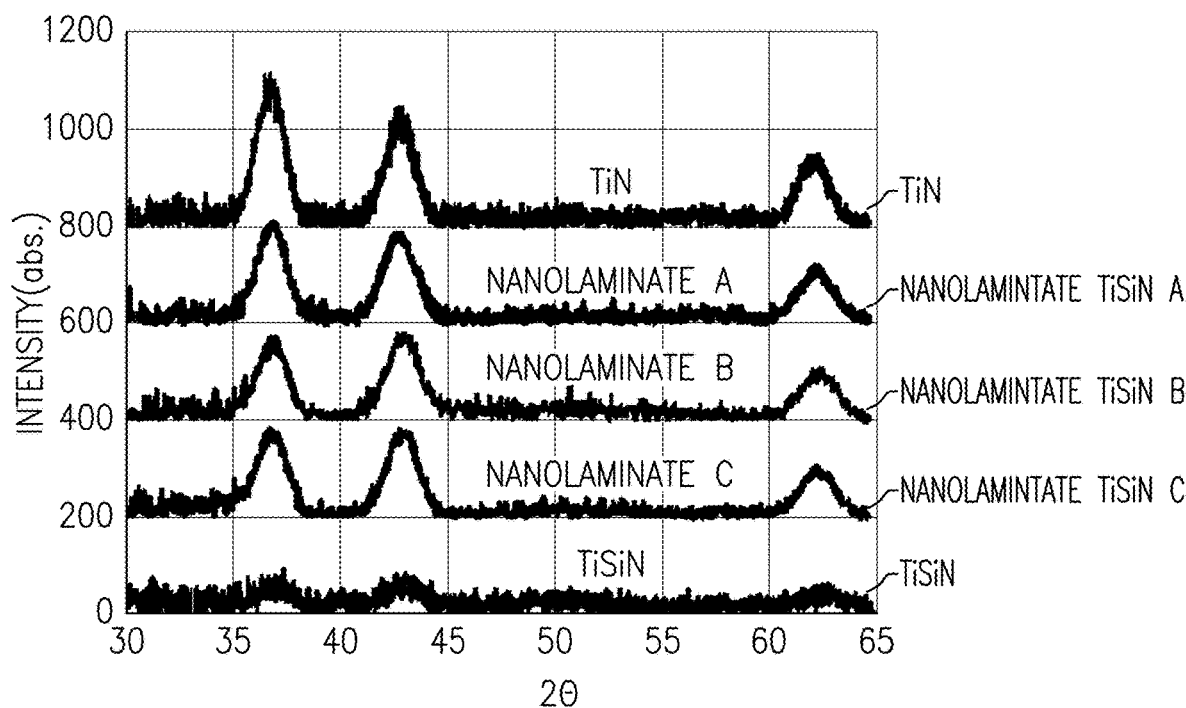
FIG. 27B is a graph of experimentally measured grazing incidence X-ray diffraction spectra measured from various nanolaminate thin films deposited according to the method illustrated in FIGS. 26A and 26C, according to some embodiments.

FIG. 27B is a graph of experimentally measured grazing incidence X-ray diffraction spectra measured from various nanolaminate thin films deposited according to the method illustrated in FIGS. 26A and 26C, according to some embodiments.

Figures 28A, 28B:
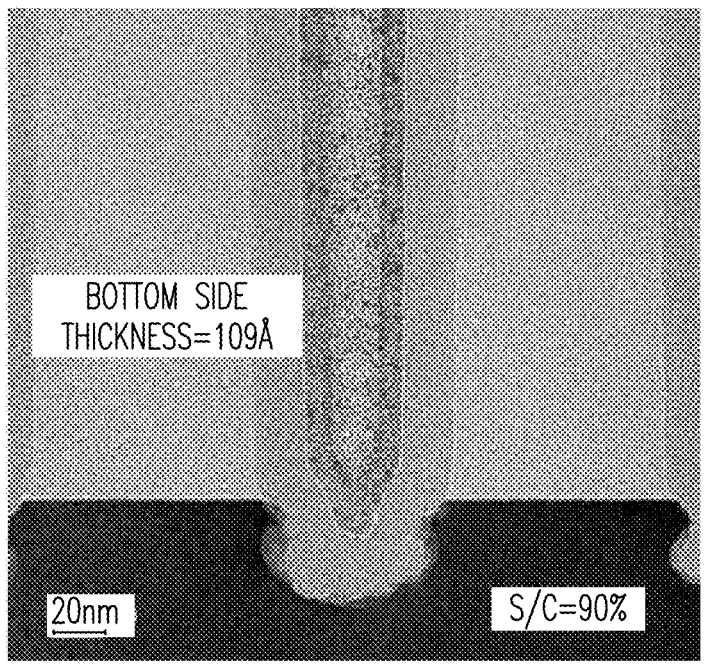
FIGS. 28A and 28B are cross-sectional transmission electron micrographs obtained from high aspect ratio structures lined with a nanolaminate thin film, according to some embodiments.

FIGS. 28A and 28B are cross-sectional transmission electron micrographs obtained from high aspect ratio structures lined with a nanolaminate thin film, according to some embodiments. It can be seen that the step coverage was comparable to homogenous TiSiN thin films.

TiSiN Thin Films with Superior Mechanical Properties Including High Modulus and Hardness As described above, thin films comprising TiSiN are desirable for many applications, e.g., for forming electrodes and/or diffusion barriers lining high aspect ratio vias or trenches. As discussed above, the process conditions described above with respect to, e.g., FIGS. 5A-5D for conformally coating a substrate having a relatively high area density of high aspect ratio structures may be optimized by controlling, among other things, the reaction chamber pressure or partial pressures of precursors during deposition, the deposition rate, the temperature or pressure of precursors being introduced into the reaction chamber, the flow rate of the precursors and the exposure time, to name a few.

Various applications of TiSiN increasingly demand improved structural and mechanical properties of the thin films comprising TiSiN, in addition to electrical and barrier properties. For example, as the features of integrated circuit devices continue to shrink in size and/or increase in aspect ratio, the physical demands on the thin films serving as diffusion barriers and/or electrodes continue to increase. The thicknesses of the thin films may also shrink with the shrinking feature sizes, and the thin films may be placed under correspondingly higher levels thermomechanical stress. While TiN is one of the leading materials for many applications, structural failures of TiN in high-aspect ratio structures is a major concern for reliability and yield of integrated circuit devices. The failure modes such as defects, bending and buckling have been associated with inadequate physical properties of TiN film such as hardness and elastic modulus. Thus, with increasing demand for complex three-dimensional structures, there is a need for alternative barrier materials with superior physical properties. To address these and other needs, described herein are method of forming and tuning thin films comprising TiSiN with superior mechanical properties, and the thin films formed using such methods.

As described herein, the inventors have discovered an alternative to and/or a further improvement to the various methods described above for improving mechanical and structural properties of TiSiN films, in addition to electrical and structural properties thereof. As described above, the inventors have discovered that, even when grown by atomic layer deposition, ultrathin (e.g., <5 nm) TiN layers may not continuously cover the underlying surface and have discontinuities. Such discontinuities can severely compromise the mechanical and structural properties of the TiN films, in addition to limiting the effectiveness of the TiN layers as diffusion barriers.

Unlike TiN thin films, the inventors have discovered that, when deposited under certain deposition conditions described herein, TiSiN can provide continuous and uniform coverage even down to these ultrathin dimensions, e.g., as low as <5 nm, which can be particularly critical for providing superior mechanical and structural properties for application in ultrathin diffusion barriers for advanced technology nodes. For example, in a similar manner as described above with respect to FIGS. 14-17, a semiconductor substrate is exposed to one or more first deposition phases alternating with and without overlapping with one or more second deposition phases in which: exposing the semiconductor substrate to the one or more first deposition phases comprises alternatingly exposing the semiconductor substrate to a titanium (Ti) precursor and a nitrogen (N) precursor; and exposing the semiconductor substrate to the one or more second deposition phases comprises sequentially exposing the semiconductor substrate to the Ti precursor, followed by a silicon (Si) precursor, followed by the N precursor. That is, in the second deposition phase, an exposure to a Ti precursor precedes an Si precursor exposure, which is followed by a N precursor exposure. The method further improves the continuity and structural properties of the TiSiN films even down to ultrathin (e.g., <5 nm) dimensions with improved mechanical integrity.

FIG. 29 is a flow chart illustrating a method for forming a thin film comprising TiSiN with improved mechanical and structural properties, according to some embodiments. In these embodiments, the method comprises forming 2902 a diffusion barrier comprising TiSiN by exposing a semiconductor substrate to one or more first deposition phases alternating with one or more second deposition phases. The diffusion barrier has: a modulus exceeding 290 GPa and a Si content exceeding 2.7 atomic %; or a hardness exceeding 20 GPa and a Si content exceeding 2.7 atomic %; or a crystalline texture such that a grazing incidence X-ray diffraction spectrum of the diffusion barrier exhibits a ratio of an area of under a (002) peak and a sum of areas under (111) and (222) peaks exceeding 0.4 and a Si content exceeding 2.7 atomic %; or a nanocrystalline structure having an average grain size that is less than about 6.5 nm and a Si content exceeding 2.7%. Exposing 2904 the semiconductor substrate to the one or more first deposition phases comprises alternatingly exposing the semiconductor substrate to a titanium (Ti) precursor and a nitrogen (N) precursor. Exposing 2906 the semiconductor substrate to the one or more second deposition phases comprises sequentially exposing the semiconductor substrate to the Ti precursor, followed by a silicon (Si) precursor, followed by the N precursor.

Various embodiments in accordance with the method illustrated in FIG. 29 can include features described above with respect to FIGS. 5B-5D and 13 or FIGS. 14-17, the details of which are not repeated herein for brevity. For example, according to embodiments, the exposure times of each one of the Ti precursor exposure time of the first deposition phase, the N precursor exposure time of the first deposition phase and N precursor exposure time of the second deposition time can be less than 1.0 sec., 0.8 sec., 0.6 sec, 0.4 sec, 0.2 sec., 0.1 sec., or a value in a ranged defined by any of these values. The thin film deposition system may be configured to introduce each of the precursors at a respective flow rate such that a surface of the substrate substantially reaches a saturation level, e.g., a saturation level greater than 40%, 60%, 80% or a value in a range defined by any of these values, within these exposure times. In embodiments where a rapid purge follows an exposure to a precursor as illustrated in FIG. 17, durations of the rapid purge steps can be less than 1.0 sec., 0.8 sec., 0.6 sec, 0.4 sec, 0.2 sec., 0.1 sec., or a value in a ranged defined by any of these values.

Referring back to FIG. 17, in another example, the inventors have discovered that exposing the semiconductor substrate to the Ti precursor during exposing 1730 to the second deposition phase can be particularly effective when the exposure time thereof is the same or shorter relative to the exposure time of the N precursor. In various embodiments, a ratio of exposure times of exposing the semiconductor substrate to the Ti precursor and exposing the semiconductor substrate to the Si precursor in the second deposition phases is greater than 1, 0.2, 0.4, 0.6, 0.8 and 1.0 or a value in a range defined by any of these values. For example, in the illustrated embodiment in FIG. 17, the Si precursor exposure time of the second deposition phase can be less than 30 sec, 15 sec., 10 sec., 5 sec., 1 sec., 0.5 sec. or be a value in a range defined by any of these values, while a Ti exposure time of the second deposition phase can be 0 or less than 2 sec., 1.5 sec., 1.0 sec., 0.5 sec., 0.2 sec., or be a value in a range defined by any of these values.

Still referring back to FIG. 17, by way of illustration only, in one particular example, typical durations of Ti precursor pulse/Ti precursor purge/N precursor pulse/N precursor purge in the first deposition phase can be 0.15 sec./0.53 sec./0.2 sec./0.32 sec., respectively, while typical durations of Ti precursor pulse/Ti precursor purge/Si precursor pulse/

Si precursor purge/N precursor pulse/N precursor purge in the second deposition phase can be 0-1.0 sec./0.3 sec./1-10 sec./0.5 sec./0.5 sec./0.5 sec., respectively.

In addition to the exposure times, the ratio (m/n) of the number of the first deposition phases (m) to the number of the second deposition phases (n) can be adjusted for tuning various characteristics of the resulting TiSiN thin film. The m/n can be greater than 5, 10, 20, 40, 60, 80 and 100.

Figure 30:
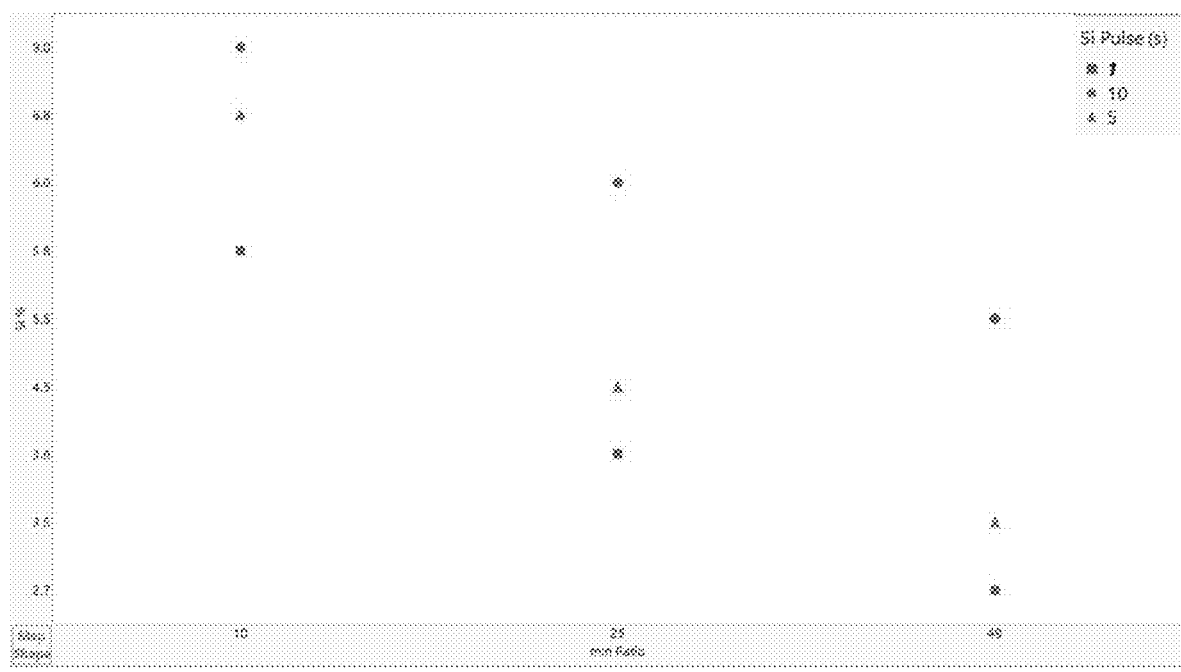
FIG. 30 is a graph illustrating the tunability of the Si content of a TiSiN thin film by tuning the precursor exposure times and/or the ratio of the number of first deposition phases and the number of second deposition phases, according to embodiments.
Figure 31A:
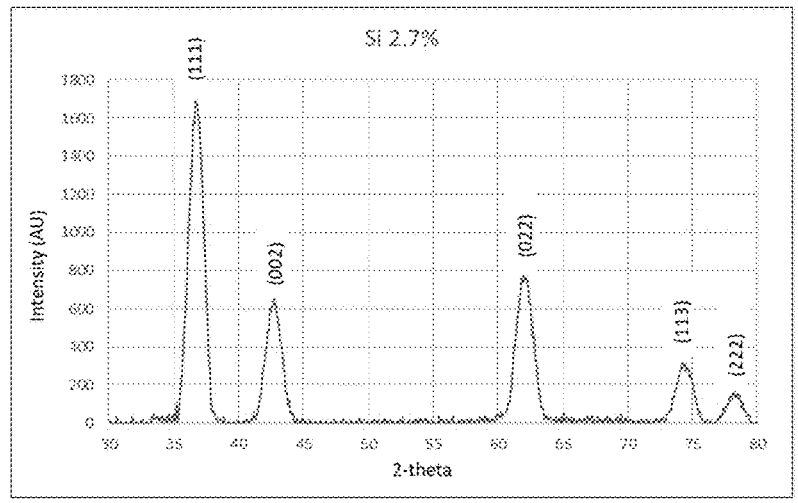
FIGS. 31A-31I are experimentally measured grazing incidence X-ray diffraction (XRD) spectra of TiSiN thin films according to embodiments.
Figure 31B:
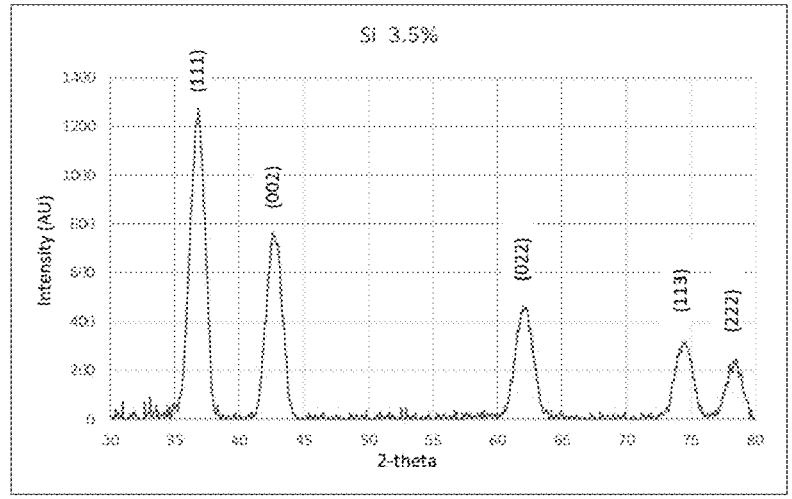
Figure 31C:
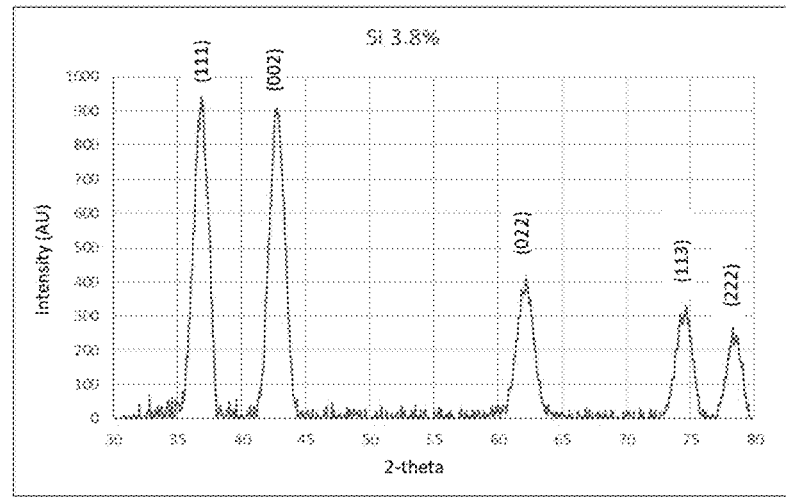
Figure 31D:
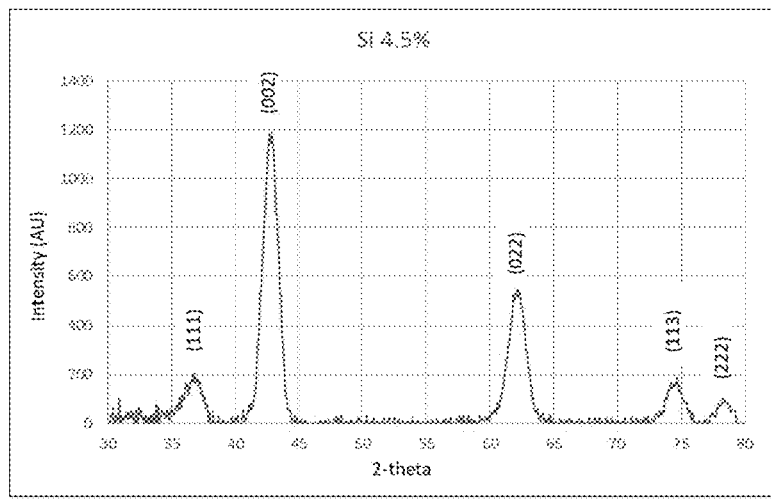
Figure 31E:
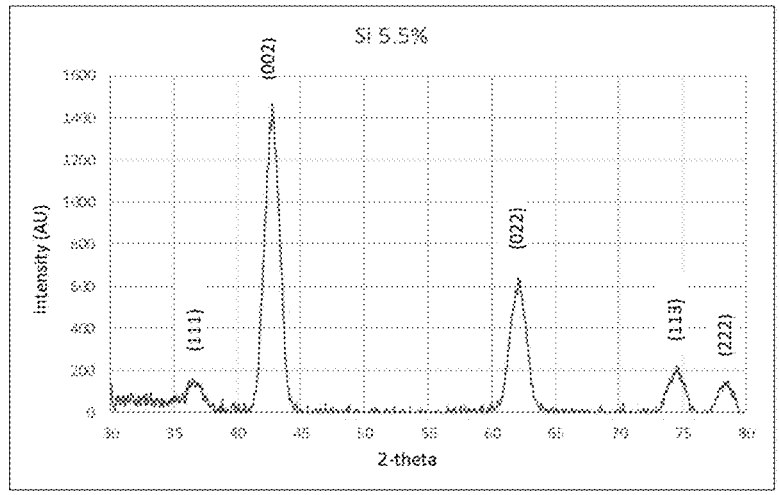
Figure 31F:
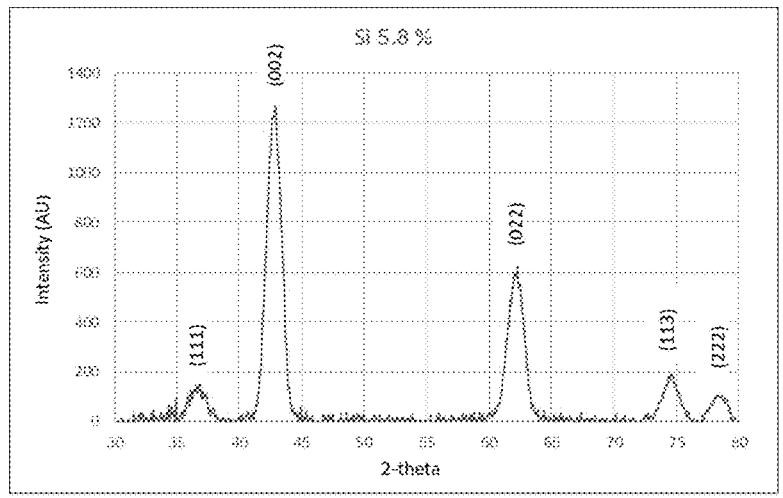
Figure 31G:
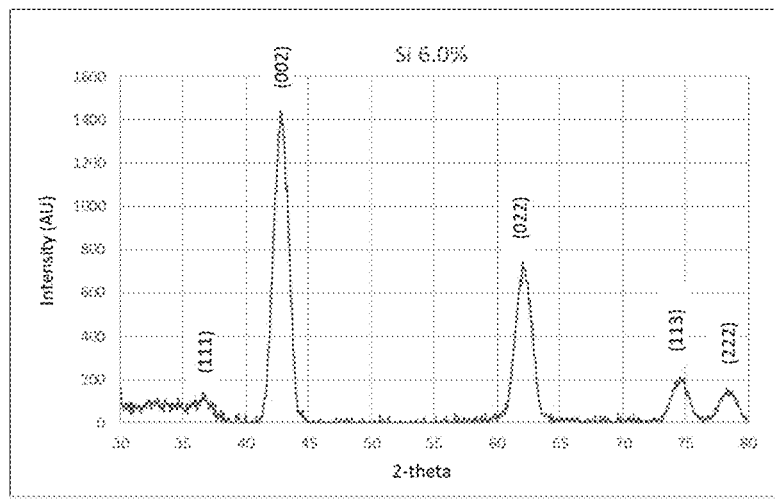
Figure 31H:
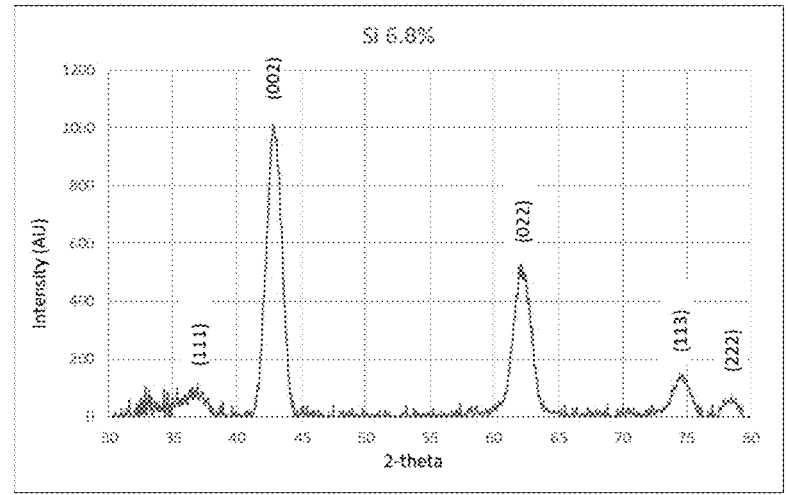
Figure 31I:
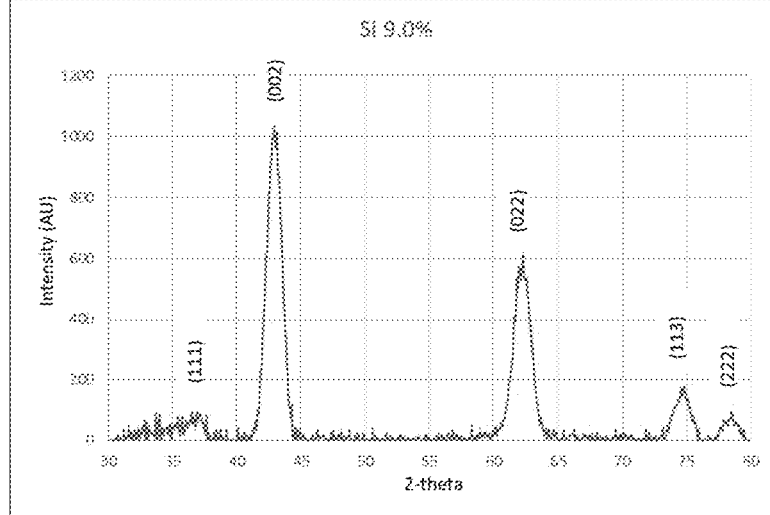

FIG. 30 is a graph illustrating the tunability of the Si content of a TiSiN thin film by tuning by the precursor exposure times and/or the ratio of the number of first deposition phases and the number of second deposition phases, according to embodiments. The x-axis plots the m:n ratio and the y-axis plots the Si content in the TiSiN thin films as measured by X-ray photoelectron spectroscopy (XPS). Three curves showing decreasing Si content with increasing m/n ratio correspond to Si precursor exposure times of 1 sec., 5 sec., and 10 sec., for a fixed Ti precursor exposure time of 1 sec. It can be seen that different combinations of the m/n ratios and the Si precursor exposure times produce TiSiN films having a Si content ranging from about 2.7 to 9 atomic %, which range has been particularly shown to be effective for providing superior mechanical properties.

The areas under certain peaks in grazing incidence X-ray diffraction spectra can be monitored as an indicator of certain structural performance parameters of the TiSiN thin films deposited according to embodiments. In particular, the inventors have discovered that the TiSiN thin films deposited according to embodiments have a crystalline structure such that a grazing incidence X-ray diffraction spectrum of the TiSiN thin film exhibits a ratio (R) of an area of under a (002) peak and a sum of areas under (111) and (222) peaks that can be monitored as an indicator of certain structural performance parameters of the TiSiN thin films. Without being bound to any theory, the ratio R can be associated with preferential (002) texturing of the nanocrystalline domains of the TiSiN thin films. FIGS. 31A-31I are experimentally measured grazing incidence X-ray diffraction (XRD) spectra of TiSiN thin films having different Si content.

Figure 32:
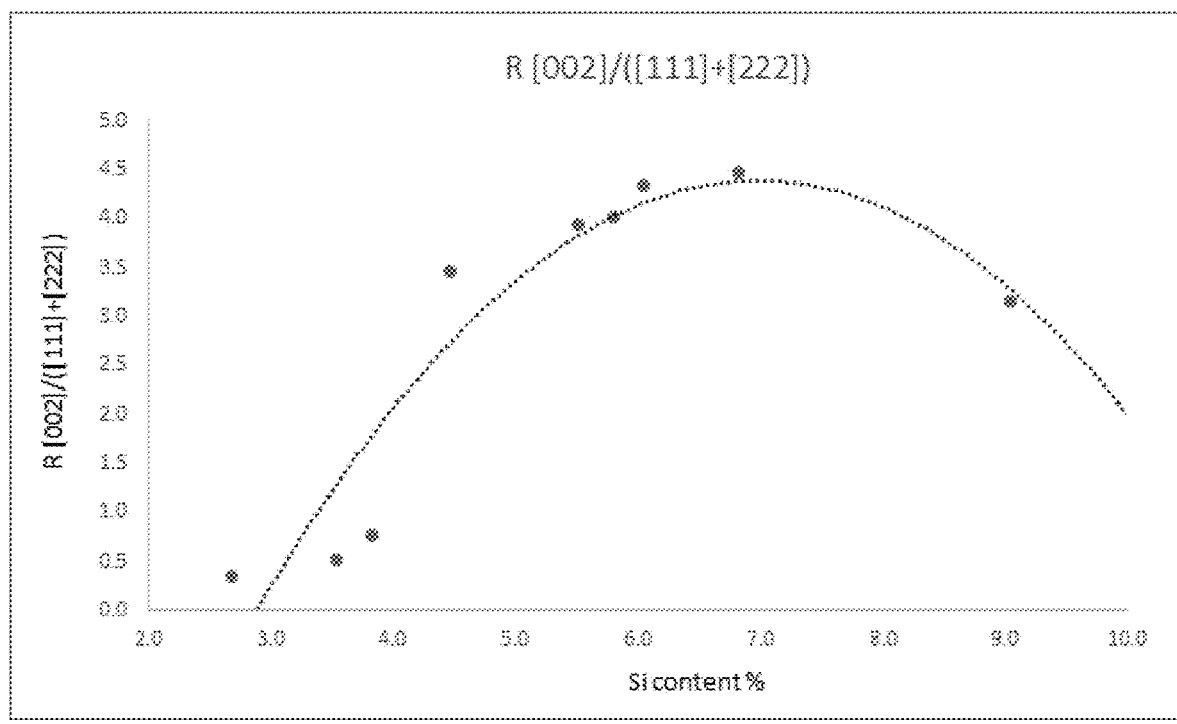
FIG. 32 is a graph illustrating a ratio (R) of an area of under a (002) peak and a sum of areas under (111) and (222) peaks as a function of Si content measured from TiSiN thin films, according to embodiments.

FIG. 32 is a graph summarizing the XRD spectra shown in FIGS. 31A-31I. The results of the ratios (R) of TiSiN thin films having different Si content is summarized below in TABLE. 1. According to various embodiments, the ratio (R) of an area of under a (002) peak and a sum of areas under (111) and (222) peaks of TiSiN thin films having Si content exceeding 2.7 atomic % can exceed 0.4, 1.0, 2.0, 3.0, 4.0, 4.5 or has a value in a range defined by any of these values. As illustrated, the R ratio peaks at a value around 4.5 for a TiSiN thin film having a Si content of about 7 atomic % and unexpectedly falls thereafter. The inventors have found that higher values of the R ratio can be correlated to improved hardness and modulus, as described below.

TABLE 1

X-ray Peak Areas and Ratios Versus Si Content in TiSiN

| Si Content | Average Crystallite Size | Area under [111] | Area under [002] | Area under [022] | Area under [113] | Area under [222] | R = [002]/ ([111] + [222]) |
|---|---|---|---|---|---|---|---|
| 2.7 | 63 | 1635 | 644 | 817 | 330 | 162 | 0.4 |
| 3.5 | 62 | 1224 | 745 | 483 | 348 | 228 | 0.5 |
| 3.8 | 60 | 907 | 912 | 411 | 350 | 278 | 0.8 |
| 4.5 | 59 | 245 | 1208 | 618 | 204 | 104 | 3.5 |
| 5.5 | 58 | 182 | 1388 | 656 | 233 | 170 | 4.0 |
| 5.8 | 58 | 159 | 1226 | 644 | 207 | 146 | 4.0 |
| 6.0 | 57 | 183 | 1411 | 744 | 213 | 143 | 4.3 |
| 6.8 | 56 | 117 | 987 | 559 | 163 | 104 | 4.5 |
| 9.0 | 54 | 108 | 1038 | 627 | 187 | 220 | 3.2 |

Figure 33:
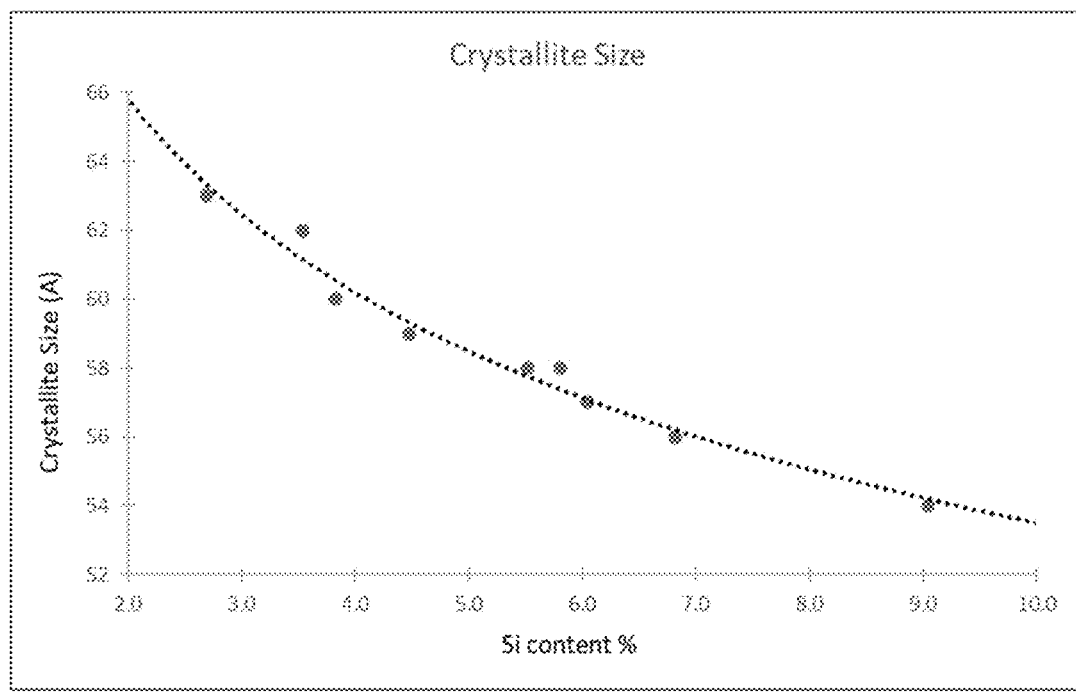
FIG. 33 is a graph of estimated average nanocrystalline grain size as a function of Si content calculated from measured grazing incidence X-ray diffraction (XRD) spectra of FIGS. 31A-31I.

FIG. 33 is a graph of estimated average nanocrystalline grain size as a function of Si content calculated from measured grazing incidence X-ray diffraction (XRD) spectra shown in FIGS. 31A-31I. The average grain size has been calculated using the broadened peaks of the XRD spectra using the Scherrer method known in the art. The TiSiN thin films have a nanocrystalline structure having an average grain size that is less than about 6.5 nm, 6.0 nm, 5.5 nm, 5.0 nm or a value in a range defined by any of these values. The inventors have found that smaller grain size can be correlated to improved hardness and modulus for grain size greater than about 5.5 nm corresponding to about 7 atomic % Si, as described below.

Figure 34:
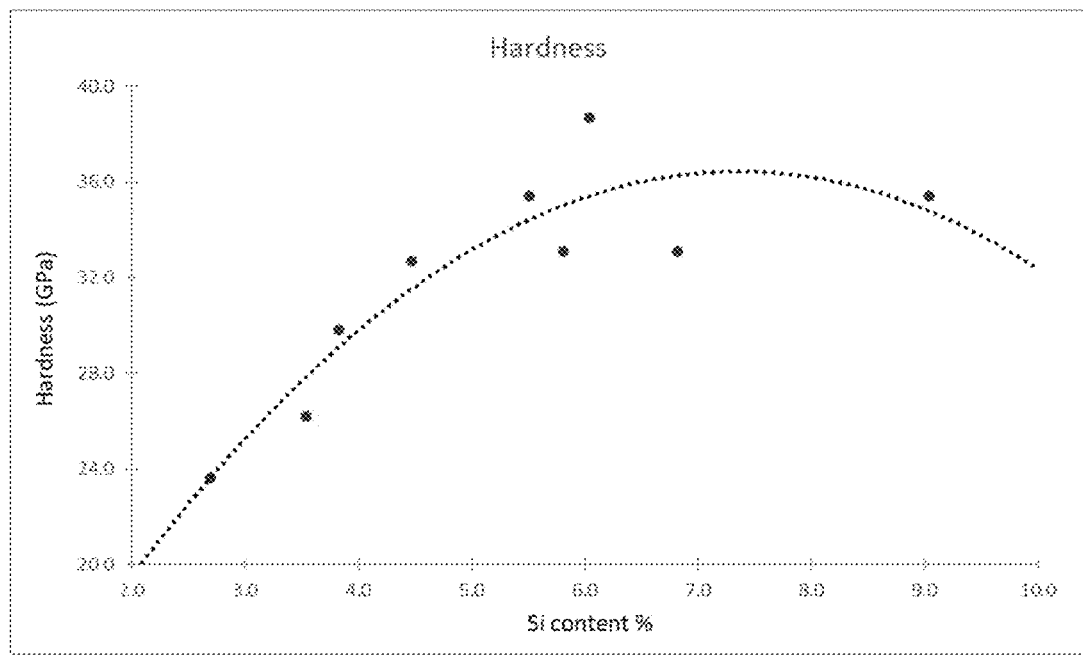
FIG. 34 is a graph of hardness values as a function of Si content measured on TiSiN thin films, according to embodiments.
Figure 35:
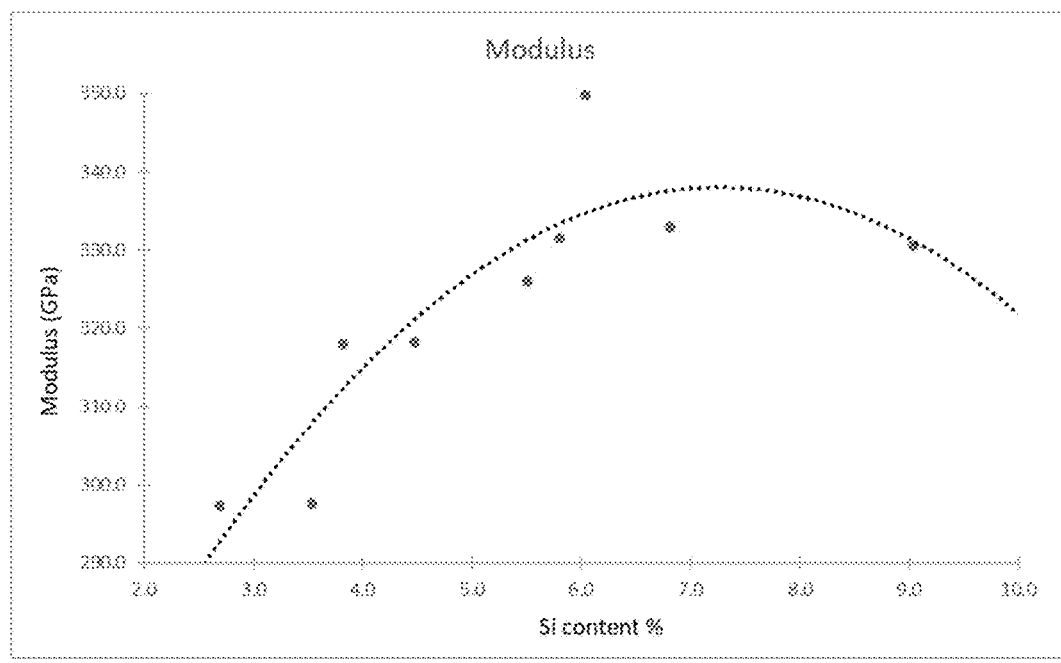
FIG. 35 is a graph of modulus values as a function of Si content TiSiN thin films, according to embodiments.

FIG. 34 is a graph of hardness values as a function of Si content measured on TiSiN thin films corresponding to the process conditions illustrated in FIG. 30. FIG. 35 is a graph of modulus values as a function of Si content TiSiN thin films corresponding to the process conditions illustrated in FIG. 30. The hardness and modulus values were measured using a nanoindentation technique. As illustrated, the hardness and modulus values are generally proportional to and follow the same general trend as the R ratio (FIG. 32). As illustrated, the peaks of the hardness and modulus values generally coincide with the peak of the R ratio and peaks for a TiSiN thin film having a Si content of about 7 atomic % and unexpectedly falls thereafter. In addition, the hardness and modulus values are generally inversely proportional to the grain size down to the grain size of about 5.5 nm corresponding to about 7 atomic % Si.

Without being bound to any theory, the increasing hardness and modulus may be related to a grain-boundary hardening effect, where increasing the Si content leads to smaller grain sizes, and hence higher density of grain boundaries. The grain boundaries may interact with each other to form a dense three-dimensional network of grain boundaries. Under such conditions, movement of grains under external force become extremely restricted because of the three-dimensional network of the grain boundaries, thereby resulting in higher hardness and modulus values. However, as illustrated, this effect peaks around the Si content of 7 atomic %, above which the hardness and modulus actually decreases. Without being bound to any theory, this may be attributable to an increasing fraction of the amorphous phase, which can reduce the grain boundary hardening effect. Thus, increasing the Si content to improve the hardness and modulus values may be effective up to a critical value of about 7 atomic %. According to various embodiments, the TiSiN thin films according to embodiments have a Si content exceeding any of the values listed in TABLE 1 to achieve the modulus and hardness disclosed herein. In a particular embodiment, the Si content does not exceed 7%.

Figure 25B:
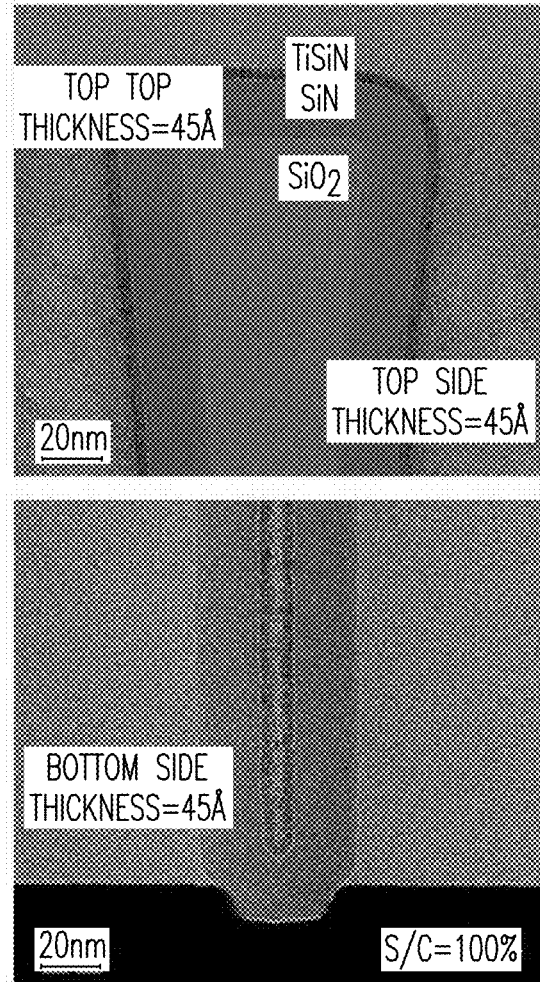
Figure 36:
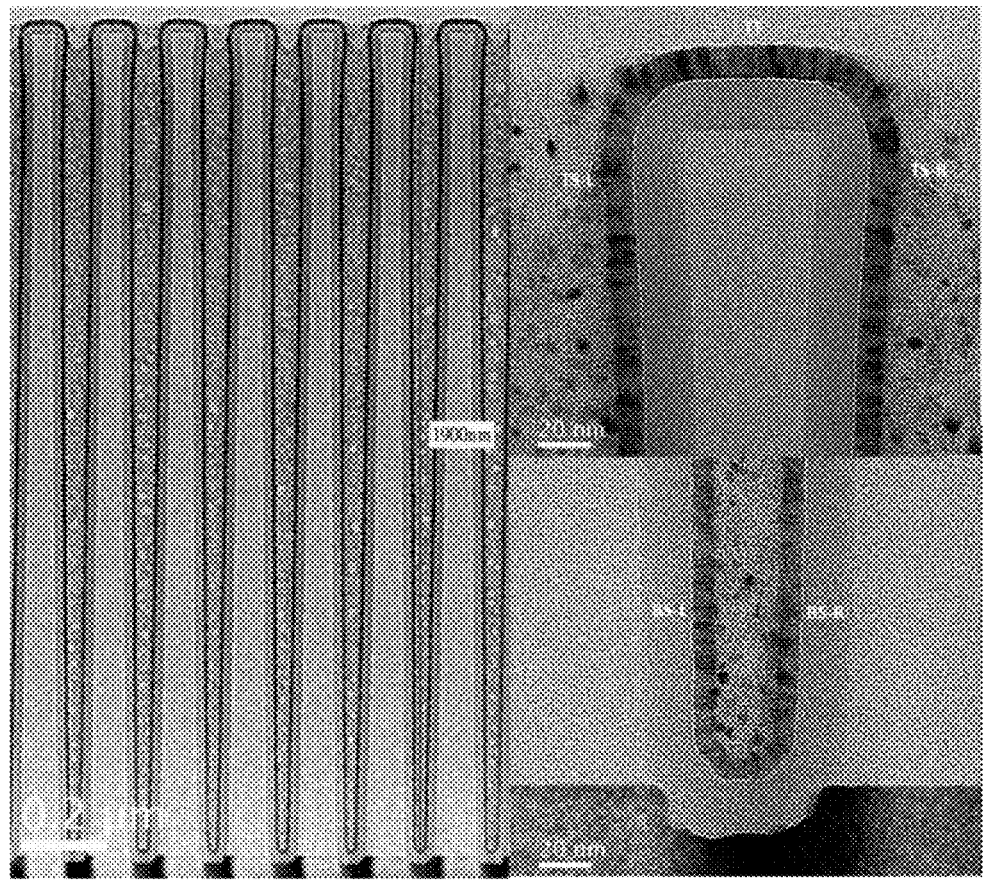
FIG. 36 show lower and higher resolution cross-sectional transmission electron micrographs obtained from high aspect ratio structures lined with a TiSiN thin film according to embodiments.

FIG. 36 show lower and higher resolution cross-sectional transmission electron micrographs obtained from high aspect ratio structures lined with a TiSiN thin film according to embodiments. the high aspect ratio structures are similar to those described above with respect to FIGS. 25A-25B. According to embodiments, TiSiN thin films with high modulus and hardness has described herein also show excellent uniformity and step coverage, which can exceed >85% as measured using cross-sectional TEM images of a high aspect ratio structure as shown in FIG. 36. As one example method of measuring step coverage, distances indicated as (top portion top surface) TT, (top portion left side surface) TS-L, (top portion right side surface) TS-R, (bottom portion left side surface) BS-L and BS-R (bottom portion right side surface) were measured by averaging over multiple measurements using an image processing software program. For the particular high aspect ratio structure shown in FIG. 36 the measure values were: TT=12.87 nm, TS-L=11.96 nm, TS-R=11.81 nm, BS-L=10.67 nm, BS-R=11.11 nm. The step coverage was calculated as: SC=(BS-L+BS-R)/(TS-L+TS-R)=21.78 nm/23.77 nm=92%. Alternatively, the step coverage can be calculated as: (BS-L+BS-R)2/(TT)=10.89/12.87 nm/23.77 nm=85%.

Figure 37A:
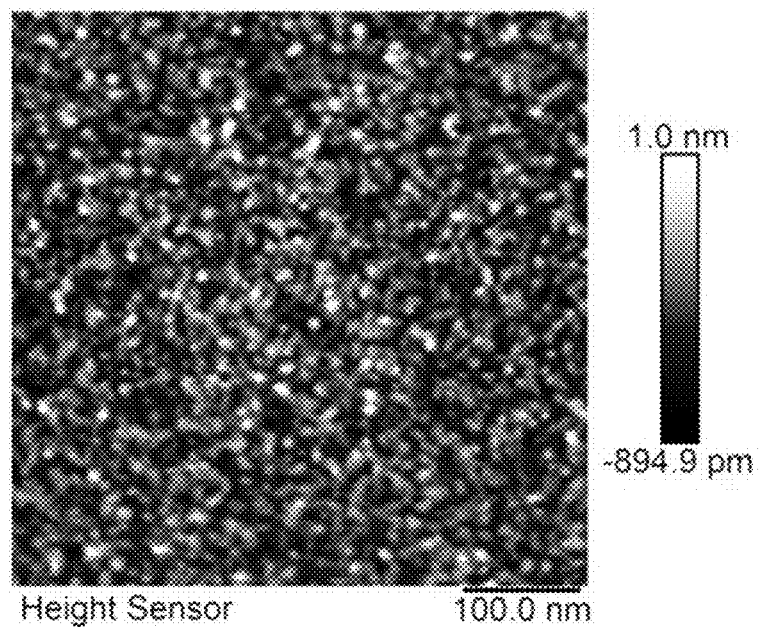
FIG. 37A is an atomic force microscope image of a TiSiN thin film deposited according to embodiments.
Figure 37B:
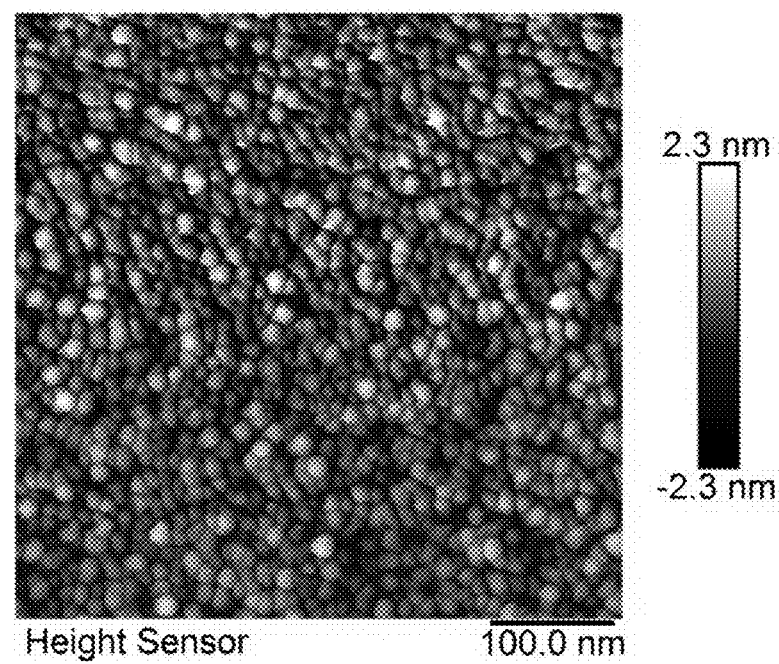
FIG. 37B is an atomic force microscope image of a TiN thin film as a comparative example.

The TiSiN diffusion barrier deposited for high modulus and hardness according to embodiments can have a root-mean square (RMS) surface roughness value that is less than 0.4 nm, 0.3 nm, 0.2 nm, 0.1 nm, or a value in a range defined by any of these values or a lower value. The reduced RMS roughness can in turn improve the conformality of the diffusion barrier layers. FIG. 37A is an atomic force microscope image of a TiSiN thin film deposited according to embodiments. The measured RMS roughness was 0.27 nm. FIG. 37B is an atomic force microscope image of a TiN thin film as a comparative example. For the TiN thin film having a comparable thickness, the RMS roughness was substantially higher at 0.67 nm.

ADDITIONAL EMBODIMENTS I

1. A method of forming a diffusion barrier, the method comprising:
   forming a thin film comprising one or both of TiSiN or TiAlN by exposing a semiconductor substrate to a plurality of vapor deposition cycles at a pressure in a reaction chamber greater than 1 torr, wherein the vapor deposition cycles comprise exposures to a titanium (Ti) precursor, exposures to a nitrogen (N) precursor and exposures to one or both of a silicon (Si) precursor or an aluminum (Al) precursor,
   wherein the semiconductor substrate comprises a surface topography such that a ratio of a surface area of the semiconductor substrate exposed to the one or more vapor deposition cycles to a surface area of a corresponding unpatterned semiconductor substrate exceeds 2.

2. The method of Embodiment 1, wherein the surface topography comprises a plurality of trenches or vias having an aspect ratio exceeding 5.

3. The method of Embodiment 2, wherein the number and dimensions of the trenches or vias is such that the ratio of the surface areas exceeds 20.

4. The method of Embodiment 1, wherein forming the thin film comprises exposing the semiconductor substrate to one or more vapor deposition cycles at a pressure in the reaction chamber of 3-10 torr.

5. The method of Embodiment 1, wherein one or more of the Ti precursor, the N precursor and the Si or Al precursor is a liquid at room temperature and atmospheric pressure.

6. The method of Embodiment 1, wherein exposing the semiconductor substrate to the one or more vapor deposition cycles comprises:
   exposing the semiconductor substrate to a plurality of first deposition phases, wherein each of the first deposition phases comprises the exposure to the Ti precursor and the exposure to the N precursor; and
   exposing the semiconductor substrate to a plurality of second deposition phases, wherein each of the second deposition phases comprises the exposure to one or both of the Si precursor or the Al precursor.

7. The method of Embodiment 6, wherein the at least one of the second deposition phases further comprises a further exposure to the N precursor.

8. The method of Embodiment 6, wherein a ratio of a number of the first the deposition phases to a number of the second deposition phases is such that the thin is at least partially amorphous.

9. The method of Embodiment 8, wherein the ratio of the number of the first deposition phases to the number of the second deposition phases is equal to or less than 15:1.

10. The method of Embodiment 8, wherein the thin film comprises TiSiN having a silicon concentration exceeding about 10 atomic %.

11. The method of Embodiment 6, wherein a number of the first deposition phases and a number of the second deposition phases are such that the thin film is substantially homogenous in a layer depth direction.

12. The method of Embodiment 11, wherein the number of the first deposition phases or the number of the second deposition phases do not exceed about 50 cycles.

13. The method of Embodiment 1, wherein the thin film comprises TiSiN, and wherein the Si precursor is a compound selected from the group consisting of $SiH_4$, $Si_2H_6$, $SiH_2Cl_2$, $SiH_3Cl$, $Si_2Cl_6$ and $Si_3Cl_8$.

14. The method of Embodiment 1, wherein the thin film comprises TiAlN, and wherein the Al precursor is a compound selected from the group consisting of tri-methyl aluminum, tri-iso-butyl-aluminum and tris (dimethylamido) aluminum.

15. The method of Embodiment 1, wherein exposing the semiconductor substrate to the vapor deposition cycles is performed at a substrate temperature of 450° C. to 650° C.

16. A method of forming a diffusion barrier, comprising:
   providing a semiconductor substrate comprising a plurality openings formed thereon, wherein the openings comprise a dielectric sidewall surface and an aspect ratio exceeding 5; and
   lining surfaces of the openings with a diffusion barrier layer comprising one or both of TiSiN or TiAlN that is at least partially amorphous by exposing the semiconductor substrate to a plurality of vapor deposition cycles, wherein the vapor deposition cycles comprise exposures to a titanium (Ti) precursor, exposures to a nitrogen (N) precursor and exposures to one or both of a silicon (Si) precursor or an aluminum (Al) precursor.

17. The method of Embodiment 16, wherein the aspect ratios of the openings exceed 5.

18. The method of Embodiment 17, wherein lining surfaces of the openings comprises conformally lining such that a ratio of thicknesses of the diffusion barrier layer formed on lower 25% of a height of the openings and upper 25% of the height of the openings exceeds 0.6.

19. The method of Embodiment 16, wherein the number and dimensions of the openings is such that a ratio of a surface area of the semiconductor substrate exposed to the one or more vapor deposition cycles to a surface area of a corresponding unpatterned semiconductor substrate exceeds 2.

20. The method of Embodiment 16, wherein lining surfaces of openings comprises exposing the semiconductor substrate to the vapor deposition cycles at a pressure in a reaction chamber of 3-10 torr.

21. The method of Embodiment 16, wherein the openings further comprise an exposed semiconductor bottom surface.

22. The method of Embodiment 16, wherein exposing the semiconductor substrate to the vapor deposition cycles comprises:
   exposing the semiconductor substrate to a plurality of first deposition phases, wherein the first deposition phases comprise the exposures to the Ti precursor and the exposures to the N precursor; and
   exposing the semiconductor substrate to a plurality of second deposition phases, wherein the second deposition phases comprise the exposures to one or both of the Si precursor or the Al precursor.

23. The method of Embodiment 22, wherein the second deposition phases further comprise a further exposure to the N precursor.

24. The method of Embodiment 22, wherein a ratio of a number of the first deposition phases to a number of the second deposition phases is such that the diffusion barrier layer is at least partially amorphous.

25. The method of Embodiment 24, wherein the ratio of the number of the first deposition phases to the number of the second deposition phases is 2:3, 3:2, 5:4, 7:3, 7:5, 7:1, 10:1 or 15:1.

26. The method of Embodiment 22, wherein a number of the first deposition phases and a number of the second deposition phases are such that the diffusion barrier layer is substantially homogenous in a layer depth direction.

27. The method of Embodiment 26, wherein the number of the first deposition phases or the number of the second deposition phases do not exceed about 50 cycles.

28. The method of Embodiment 22, wherein a number of the first deposition phases and a number of the second deposition phases are such that the diffusion barrier layer has a nanolaminate structure.

29. The method of Embodiment 16, wherein a root mean square surface roughness of the diffusion barrier layer is less than about 5% on the basis of an average thickness of the diffusion barrier layer.

30. The method of Embodiment 16, wherein the diffusion barrier layer comprises TiSiN, and wherein the Si precursor is a compound selected from the group consisting of $SiH_4$, $Si_2H_6$, $SiH_2Cl_2$, $SiH_3Cl$, $Si_2Cl_6$ and $Si_3Cl_8$.

31. The method of Embodiment 16, wherein the diffusion barrier layer comprises TiAlN, and wherein the Al precursor is a compound selected from the group consisting of tri-methyl aluminum, tri-iso-butyl-aluminum and tris (dimethylamido) aluminum.

32. The method of Embodiment 16, wherein exposing the semiconductor substrate to the vapor deposition cycles is performed at a substrate temperature of 450° C. to 650° C.

33. A method of forming a thin film, the method comprising:
   forming a thin film comprising one or both of TiSiN or TiAlN by exposing a semiconductor substrate to a plurality of vapor deposition cycles at a pressure in a reaction chamber greater than 5 torr, wherein the vapor deposition cycles comprise exposures to a titanium (Ti) precursor, exposures to a nitrogen (N) precursor and exposures to one or both of a silicon (Si) precursor or an aluminum (Al) precursor.

34. The method of Embodiment 33, wherein the pressure in the reaction chamber is less than 10 torr.

35. The method of Embodiment 33, wherein the semiconductor substrate comprises a surface topography such that a ratio of a surface area of the semiconductor substrate exposed to the one or more vapor deposition cycles to a surface area of a corresponding unpatterned semiconductor substrate exceeds 2.

36. The method of Embodiment 35, wherein the semiconductor substrate comprises a plurality trenches or vias formed thereon, wherein the trenches or vias comprise a dielectric sidewall surface and an aspect ratio exceeding 5.

37. The method of Embodiment 33, wherein exposing the semiconductor substrate to the one or more vapor deposition cycles comprises:
   exposing the semiconductor substrate to a plurality of first deposition phases, wherein the first deposition phases comprise the exposure to the Ti precursor and the exposure to the N precursor; and
   exposing the semiconductor substrate to a plurality of second deposition phases, wherein the second deposition phases comprise the exposure to one or both of the Si precursor or the Al precursor.

38. The method of Embodiment 37, wherein the second deposition phases further comprise a further exposure to the N precursor.

39. The method of Embodiment 37, wherein a ratio of a number of the first deposition phases to a number of the second deposition phases is such that the thin film is at least partially amorphous.

40. The method of Embodiment 39, wherein the ratio of the number of the first deposition phases to the number of the second deposition phases is equal to or less than 15:1.

41. The method of Embodiment 37, wherein a number of the first deposition phases and a number of the second deposition phases are such that the thin film is substantially homogenous in a layer depth direction.

42. The method of Embodiment 41, wherein the number of the first deposition phases and the number of the second deposition phases do not exceed about 50 cycles.

43. The method of Embodiment 33, wherein the thin film comprises TiSiN, and wherein the Si precursor is a compound selected from the group consisting of $SiH_4$, $Si_2H_6$, $SiH_2Cl_2$, $SiH_3Cl$, $Si_2Cl_6$ and $Si_3Cl_8$.

44. The method of Embodiment 33, wherein the thin film comprises TiAlN, and wherein the Al precursor is a compound selected from the group consisting of tri-methyl aluminum, tri-iso-butyl-aluminum and tris (dimethylamido) aluminum.

45. The method of Embodiment 33, wherein exposing the semiconductor substrate to the vapor deposition cycles is performed at a substrate temperature of 450° C. to 650° C.

46. A semiconductor structure, comprising:
   a semiconductor substrate comprising a plurality trenches or vias formed thereon, wherein the trenches or vias comprise a dielectric sidewall surface and an aspect ratio exceeding 5; and
   a diffusion barrier layer comprising one or both of TiSiN or TiAlN conformally lining surfaces of the trenches or vias, wherein the diffusion barrier layer is at least partially amorphous.

47. The semiconductor structure of Embodiment 46, wherein the aspect ratio of the trenches or vias exceeds 5.

48. The semiconductor structure of Embodiment 47, wherein the diffusion barrier layer conformally lining the surfaces is such that a ratio of thicknesses of the diffusion barrier layer formed on lower 25% of a height of the trenches or vias and upper 25% of the height of the trenches or vias exceeds 0.6.

49. The semiconductor structure of Embodiment 46, wherein the area density of the trenches or vias is such that a ratio of a surface area on which the diffusion barrier layer is formed on to a surface area of a corresponding unpatterned semiconductor substrate exceeds 2.

50. The semiconductor structure of Embodiment 49, wherein the ratio of the surface areas exceeds 100.

51. The semiconductor structure of Embodiment 46, wherein the diffusion barrier is substantially fully amorphous.

52. The semiconductor structure of Embodiment 46, wherein the diffusion barrier layer is substantially homogenous in a layer depth direction 53. The semiconductor structure of Embodiment 46, wherein the diffusion barrier layer has a nanolaminate structure.

54. The semiconductor structure of Embodiment 46, wherein a root mean square surface roughness of the diffusion barrier layer is less than about 5% on the basis of an average thickness of the diffusion barrier layer.

55. The semiconductor structure of Embodiment 46, wherein the diffusion barrier layer comprises TiSiN having a silicon concentration exceeding about 10 atomic %.

56. The semiconductor structure of Embodiment 46, wherein the trenches or vias further comprise a semiconductor bottom surface.

57. The semiconductor structure of Embodiment 46, wherein the trenches or vias are is filled with tungsten or copper.

58. The semiconductor structure of Embodiment 46, wherein the diffusion barrier has a thickness of about 1-10 nm.

59. The semiconductor structure of Embodiment 46, wherein the trenches or vias have a width of about 10-1000 nm.

60. The semiconductor structure of Embodiment 23, wherein the diffusion barrier layer has an electrical resistivity less than about 1600 $\mu\Omega$-cm.

ADDITIONAL EMBODIMENTS II

1. A method of forming a diffusion barrier comprising TiSiN, the method comprising:
    exposing a semiconductor substrate to one or more first deposition phases alternating with one or more second deposition phases,
    wherein exposing the semiconductor substrate to the one or more first deposition phases comprises alternatingly exposing the semiconductor substrate to a titanium (Ti) precursor and a nitrogen (N) precursor, and
    wherein exposing the semiconductor substrate to the one or more second deposition phases comprises sequentially exposing the semiconductor substrate to the Ti precursor and a silicon (Si) precursor without an intervening exposure to the N precursor therebetween, followed by exposing the semiconductor substrate to the N precursor.

2. A method of forming a diffusion barrier comprising TiSiN, the method comprising:
    exposing a semiconductor substrate to one or more first deposition phases alternating with one or more second deposition phases,
    wherein exposing the semiconductor substrate to the one or more first deposition phases comprises alternatingly exposing the semiconductor substrate to a titanium (Ti) precursor and a nitrogen (N) precursor, and
    wherein exposing the semiconductor substrate to the one or more second deposition phases comprises sequentially exposing the semiconductor substrate to the Ti precursor, followed by a silicon (Si) precursor, followed by the N precursor.

3. A method of forming a diffusion barrier comprising TiSiN, the method comprising:
    exposing a semiconductor substrate to one or more first deposition phases alternating with one or more second deposition phases,
    wherein exposing the semiconductor substrate to the one or more first deposition phases comprises alternatingly exposing the semiconductor substrate to a titanium (Ti) precursor and a nitrogen (N) precursor,
    wherein exposing the semiconductor substrate to the one or more second deposition phases comprises exposing the semiconductor substrate to the Ti precursor for a Ti precursor exposure duration, followed by a silicon (Si) precursor for a Si precursor exposure duration, followed by the N precursor, and
    wherein a ratio of the Si precursor exposure duration to the Ti precursor exposure duration is between 2 and 130.

4. The method of any one of the above Embodiments, wherein the diffusion barrier formed using the method has a resistivity of 2000 $\mu\Omega$·cm or lower.

5. The method of any one of the above Embodiments, wherein the diffusion barrier formed using the method has a resistivity that is lower by at least 500 $\mu\Omega$·cm compared to a diffusion barrier formed using the same method except for exposing the semiconductor substrate to the Ti precursor as part of the one or more second deposition phases.

6. The method of any one of the above Embodiments, wherein the semiconductor substrate comprises an opening having an aspect ratio exceeding 50, and wherein forming the diffusion barrier comprises lining surfaces of the opening such that a ratio of a thicknesses of the diffusion barrier formed on lower 25% of a height of the opening and upper 25% of the height of the opening exceeds 0.9.

7. The method of any one of the above Embodiments, wherein exposing the semiconductor substrate to the one or more first deposition phases comprises exposing the semiconductor substrate to the N precursor as a last precursor of the one or more first deposition phases.

8. The method of any one of the above Embodiments, wherein exposing the semiconductor substrate to the one or more second deposition phases comprises exposing the semiconductor substrate to the Ti precursor as a first precursor of the one or more second deposition phases.

9. The method of any one of the above Embodiments, an exposure of the semiconductor substrate to the Ti precursor as the first precursor in the second deposition phase immediately follows an exposure of the semiconductor substrate to the N precursor as a last precursor in the first deposition phase without an intervening exposure to then precursor.

10. The method of any one of the above Embodiments, wherein a ratio of exposure times of exposing the semiconductor substrate to the Si precursor and exposing the semiconductor substrate to the Ti precursor in the second deposition phases exceeds 2.

11. The method of any one of the above Embodiments, wherein a ratio of exposure times of exposing the semiconductor substrate to the Si precursor and exposing the semiconductor substrate to the Ti precursor in the second deposition phases is less than 130.

12. The method of any one of the above Embodiments, wherein a ratio of exposure times of exposing the semiconductor substrate to the Si precursor and exposing the semiconductor substrate to the Ti precursor in the second deposition phases is between 2 and 130.

13. The method of any one of the above Embodiments, wherein a ratio of exposure times of exposing the semiconductor substrate to the Ti precursor in the second deposition phases and exposing the semiconductor substrate to the Ti precursor in the first deposition phases is between 3 and 34.

14. The method of any one of the above Embodiments, wherein a ratio of exposure times of exposing the semiconductor substrate to the N precursor in the second deposition phases and exposing the semiconductor substrate to the N precursor in the first deposition phases is between 5 and 50.

15. The method of any one of the above Embodiments, wherein an exposure time of exposing the semiconductor to the Si precursor exceeds 3 sec., and an exposure time of exposing the semiconductor to the Ti precursor in the second deposition phases is shorter than 2 sec.

16. The method of any one of the above Embodiments, wherein exposing the semiconductor substrate to the one or more first deposition phases and the one or more second deposition phases comprises exposing at a pressure in a reaction chamber greater than 1 torr.

17. The method of any one of the above Embodiments, wherein the semiconductor substrate comprises a surface topography such that a ratio of a surface area of the semiconductor substrate exposed to the one or more first deposition phases and the one or more second deposition phases to a surface area of a corresponding unpatterned semiconductor substrate exceeds 2.

18. The method of Embodiment 17, wherein the surface topography comprises a plurality of trenches or vias having an aspect ratio exceeding 5.

19. The method of Embodiments 17 or 18, wherein the number and dimensions of the trenches or vias is such that the ratio of the surface areas exceeds 20.

20. The method of any one of the above Embodiments, wherein exposing the semiconductor substrate to the one or more first deposition phases and the one or more second deposition phases comprises exposing at a pressure in the reaction chamber of 3-10 torr.

21. The method of any one of the above Embodiments, wherein a ratio of a number of the first deposition phases to a number of the second deposition phases is such that the diffusion barrier is at least partially amorphous.

22. The method of any one of the above Embodiments, wherein a ratio of a number of the first deposition phases to a number of the second deposition phases is greater than 3.

23. The method of any one of the above Embodiments, wherein a ratio of a number of the first deposition phases to a number of the second deposition phases is 3-60.

24. The method of any one of the above Embodiments, wherein the diffusion barrier comprises TiSiN having a silicon concentration exceeding 5 atomic %.

25. The method of any one of the above Embodiments, wherein the diffusion barrier comprises TiSiN having a silicon concentration of 5-30 atomic %.

26. The method of any one of the above Embodiments, wherein the Si precursor is a compound selected from the group consisting of $SiH_4$, $Si_2H_6$, $SiH_2Cl_2$, $SiH_3Cl$, $Si_2Cl_6$ and $Si_3Cl_8$.

27. The method of any one of the above Embodiments, wherein the Ti precursor comprises $TiCl_4$.

28. The method of any one of the above Embodiments, wherein the N precursor is $NH_3$.

29. The method of any one of the above Embodiments, wherein exposing the semiconductor substrate to the vapor deposition cycles is performed at a substrate temperature of 400° C. to 600° C.

30. The method of any one of the above Embodiments, wherein a number of the first deposition phases and a number of the second deposition phases are such that the diffusion barrier layer is substantially homogenous in a layer depth direction.

31. The method of Embodiment 30, wherein the number of the first deposition phases and the number of the second deposition phases do not exceed about 50.

32. The method of any one of the above Embodiments, wherein a number of the first deposition phases and a number of the second deposition phases are such that the diffusion barrier layer has a nanolaminate structure comprising TiN layers alternating with TiSiN layers.

33. The method of Embodiment 32, wherein the number of one or both of the first deposition phases and the number of the second deposition phases exceeds about 50.

34. The method of Embodiments 32 or 33, wherein a thickness of one or both of the TiN layers and the TiSiN layers exceed 1.5 nm.

35. The method of any one of Embodiments 32-34, wherein the nanolaminate comprises a TiSiN layer between TiN layers.

36. The method of any one of the above Embodiments, wherein the semiconductor substrate comprises a plurality openings formed thereon, wherein the openings comprise a dielectric sidewall surface and an aspect ratio exceeding 5; and wherein forming the diffusion barrier comprises lining surfaces of the openings.

37. The method of Embodiment 36, wherein lining surfaces of the openings comprises conformally lining such that a ratio of thicknesses of the diffusion barrier layer formed on lower 25% of a height of the openings and upper 25% of the height of the openings exceeds 0.8.

38. The method of Embodiment 37, wherein the Si precursor is $SiH_2Cl_2$, and the ratio exceeds 83%.

39. The method of Embodiment 37, wherein the Si precursor is $SiH_3Cl$, and the ratio exceeds 86%.

40. The method of Embodiment 37, wherein the Si precursor is $Si_3Cl_8$, and the ratio exceeds 86%.

41. The method of any one of Embodiments 38-40, wherein the aspect ratio exceeds 50.

42. The method of any one of the above Embodiments, wherein the number and dimensions of the openings is such that a ratio of a surface area of the semiconductor substrate exposed to the one or more vapor deposition cycles to a surface area of a corresponding unpatterned semiconductor substrate exceeds 2.

43. The method of any one of the above Embodiments, wherein lining surfaces of openings comprises exposing the semiconductor substrate to the vapor deposition cycles at a pressure in a reaction chamber of 3-10 torr.

44. The method of any one of the above Embodiments, wherein the openings further comprise an exposed semiconductor bottom surface.

45. The method of any one of the above Embodiments, wherein the one or more first deposition phases do not overlap with one or more second deposition phases.

46. The method of any one of the above Embodiments, wherein exposing the semiconductor to one or more of the Ti precursor, the Si precursor and the N precursor during the one or more second deposition phases comprises undersaturating a surface of the semiconductor substrate.

47. The method of Embodiment 42, wherein the diffusion barrier comprising TiSiN, relative to a reference diffusion barrier comprising TiSiN obtained using a same method except for under-saturating, has a resistivity that is higher by more than 10%.

48. A nanolaminate comprising TiN-rich regions or layers alternating with Si-rich and/or Al-rich regions or layers or SiN/AlN-rich regions or layers.

ADDITIONAL EMBODIMENTS III

1. A method of forming a diffusion barrier, the method comprising:
    forming a diffusion barrier comprising TiSiN having a modulus exceeding 290 GPa and a Si content exceeding 2.7 atomic % by exposing a semiconductor substrate to one or more first deposition phases alternating with one or more second deposition phases,
    wherein exposing the semiconductor substrate to the one or more first deposition phases comprises alternatingly exposing the semiconductor substrate to a titanium (Ti) precursor and a nitrogen (N) precursor, and
    wherein exposing the semiconductor substrate to the one or more second deposition phases comprises sequentially exposing the semiconductor substrate to the Ti precursor, followed by a silicon (Si) precursor, followed by the N precursor.

2. A method of forming a diffusion barrier, the method comprising:
    forming a diffusion barrier comprising TiSiN having a hardness exceeding 20 GPa and a Si content exceeding 2.7 atomic % by exposing a semiconductor substrate to one or more first deposition phases alternating with one or more second deposition phases,
    wherein exposing the semiconductor substrate to the one or more first deposition phases comprises alternatingly exposing the semiconductor substrate to a titanium (Ti) precursor and a nitrogen (N) precursor, and
    wherein exposing the semiconductor substrate to the one or more second deposition phases comprises sequentially exposing the semiconductor substrate to the Ti precursor, followed by a silicon (Si) precursor, followed by the N precursor.

3. A method of forming a diffusion barrier, the method comprising:
    forming a diffusion barrier comprising TiSiN having a crystalline texture such that a grazing incidence X-ray diffraction spectrum of the diffusion barrier exhibits a ratio of an area of under a (002) peak and a sum of areas under (111) and (222) peaks exceeding 0.4 and a Si content exceeding 2.7 atomic % by exposing a semiconductor substrate to one or more first deposition phases alternating with one or more second deposition phases,
    wherein exposing the semiconductor substrate to the one or more first deposition phases comprises alternatingly exposing the semiconductor substrate to a titanium (Ti) precursor and a nitrogen (N) precursor, and
    wherein exposing the semiconductor substrate to the one or more second deposition phases comprises sequentially exposing the semiconductor substrate to the Ti precursor, followed by a silicon (Si) precursor, followed by the N precursor.

4. A method of forming a diffusion barrier, the method comprising:
    forming a diffusion barrier comprising TiSiN having a nanocrystalline structure having an average grain size that is less than about 6.5 nm and a Si content exceeding 2.7% by exposing a semiconductor substrate to one or more first deposition phases alternating with one or more second deposition phases,
    wherein exposing the semiconductor substrate to the one or more first deposition phases comprises alternatingly exposing the semiconductor substrate to a titanium (Ti) precursor and a nitrogen (N) precursor, and
    wherein exposing the semiconductor substrate to the one or more second deposition phases comprises exposing sequentially exposing the semiconductor substrate to the Ti precursor, followed by a silicon (Si) precursor, followed by the N precursor.

5. The method of any one of the above Embodiments, wherein the diffusion barrier has the Si content of 2.7-9 atomic %.

6. The method of any one of the above Embodiments, wherein the diffusion barrier has the Si content of 2.7-7 atomic %.

7. The method of any one of the above Embodiments, wherein the diffusion barrier has a modulus of 290-350 GPa.

8. The method of any one of the above Embodiments, wherein the diffusion barrier has a hardness of 20-40 GPa.

9. The method of any one of the above Embodiments, wherein the diffusion barrier has a crystalline texture such that a grazing incidence X-ray spectrum exhibits a ratio of an area of under a (002) peak and a sum of areas under (111) and (222) peaks of 0.4-4.5.

10. The method of any one of the above Embodiments, wherein the diffusion barrier has a nanocrystalline structure having an average grain size of about 5.0-6.5 nm, 11. The method of any one of the above Embodiments, wherein exposing the semiconductor substrate to the one or more second deposition phases comprises sequentially exposing the semiconductor substrate to the Ti precursor and a silicon (Si) precursor without an intervening exposure to the N precursor therebetween, followed by exposing the semiconductor substrate to the N precursor.

12. The method of any one of the above Embodiments, wherein exposing the semiconductor substrate to the one or more second deposition phases comprises sequentially exposing the semiconductor substrate to the Ti precursor as a first precursor, followed by a silicon (Si) precursor, followed by the N precursor as a last precursor.

13. The method of any one of the above Embodiments, wherein exposing the semiconductor substrate to the one or more second deposition phases comprises exposing the semiconductor substrate to the Ti precursor for a Ti precursor exposure duration, followed by a silicon (Si) precursor for a Si precursor exposure duration, followed by the N precursor, and wherein a ratio of the Ti precursor exposure duration to the Si precursor exposure duration is 0-1.

14. The method of any one of the above Embodiments, wherein exposing the semiconductor substrate to the one or more second deposition phases comprises exposing the semiconductor substrate to the Ti precursor for a Ti precursor exposure duration of 0-1 sec., followed by a silicon (Si) precursor for a Si precursor exposure duration of 1-10 sec.

15. The method of any one of the above Embodiments, wherein a ratio of a number of the first deposition phases to a number of the second deposition phases is greater than 10.

16. The method of any one of the above Embodiments, wherein a ratio of a number of the first deposition phases to a number of the second deposition phases is 10-50.

17. The method of any one of the above Embodiments, wherein the semiconductor substrate comprises an opening having an aspect ratio exceeding 5, and wherein forming the diffusion barrier comprises lining surfaces of the opening such that a ratio of a thicknesses of the diffusion barrier formed on lower 25% of a height of the opening and upper 25% of the height of the opening exceeds 0.80.

18. The method of any one of the above Embodiments, wherein exposing the semiconductor substrate to the one or more first deposition phases comprises exposing the semiconductor substrate to the N precursor as a last precursor.

19. The method of any one of the above Embodiments, wherein exposing the semiconductor substrate to the one or more second deposition phases comprises exposing the semiconductor substrate to the Ti precursor as a first precursor.

20. The method of any one of the above Embodiments, an exposure of the semiconductor substrate to the Ti precursor as the first precursor of the second deposition phase immediately follows an exposure of the semiconductor substrate to the N precursor as a last precursor of the first deposition phase without an intervening exposure to the N precursor.

21. The method of any one of the above Embodiments, wherein exposing the semiconductor substrate to the one or more first deposition phases and the one or more second deposition phases comprises exposing at a pressure in a reaction chamber greater than 1 torr.

22. The method of any one of the above Embodiments, wherein the semiconductor substrate comprises a surface topography such that a ratio of a surface area of the semiconductor substrate exposed to the one or more first deposition phases and the one or more second deposition phases to a surface area of a corresponding unpatterned semiconductor substrate exceeds 2.

23. The method of Embodiment 22, wherein the surface topography comprises a plurality of trenches or vias having an aspect ratio exceeding 5.

24. The method of Embodiments 22 or 23, wherein the number and dimensions of the trenches or vias is such that the ratio of the surface areas exceeds 20.

25. The method of any one of the above Embodiments, wherein exposing the semiconductor substrate to the one or more first deposition phases and the one or more second deposition phases comprises exposing at a pressure in the reaction chamber of 3-10 torr.

26. The method of any one of the above Embodiments, wherein a ratio of a number of the first deposition phases to a number of the second deposition phases is such that the diffusion barrier is at least partially amorphous.

27. The method of any one of the above Embodiments, wherein the Si precursor is a compound selected from the group consisting of $SiH_4$, $Si_2H_6$, $SiH_2Cl_2$, $SiH_3Cl$, $Si_2Cl_6$ and $Si_3Cl_8$.

28. The method of any one of the above Embodiments, wherein the Ti precursor comprises $TiCl_4$.

29. The method of any one of the above Embodiments, wherein the N precursor comprises $NH_3$.

30. The method of any one of the above Embodiments, wherein exposing the semiconductor substrate to the vapor deposition cycles is performed at a substrate temperature of 400° C. to 600° C.

31. The method of any one of the above Embodiments, wherein a number of the first deposition phases and a number of the second deposition phases are such that the diffusion barrier layer is substantially homogenous in a layer depth direction.

32. The method of any one of the above Embodiments, wherein the semiconductor substrate comprises a plurality openings formed thereon, wherein the openings comprise a dielectric sidewall surface and an aspect ratio exceeding 5, and wherein forming the diffusion barrier comprises lining surfaces of the openings.

33. The method of Embodiment 32, wherein lining the surfaces of the openings comprises conformally lining such that a ratio of thicknesses of the diffusion barrier layer formed on lower 25% of a height of the openings and upper 25% of the height of the openings exceeds 0.8.

34. The method of Embodiments 32 or 33, wherein the number and dimensions of the openings is such that a ratio of a surface area of the semiconductor substrate exposed to the one or more vapor deposition cycles to a surface area of a corresponding unpatterned semiconductor substrate exceeds 2.

35. The method of any one of Embodiments 32-34, wherein lining the surfaces of openings comprises exposing the semiconductor substrate to the vapor deposition cycles at a pressure in a reaction chamber of 3-10 torr.

36. The method of any one of Embodiments 32-35, wherein the openings further comprise an exposed semiconductor bottom surface.

37. A semiconductor structure, comprising:
a semiconductor substrate comprising a plurality trenches or vias formed thereon, wherein the trenches or vias comprise a dielectric sidewall surface and an aspect ratio exceeding 5; and
a diffusion barrier layer comprising TiSiN conformally lining surfaces of the trenches or vias, wherein the diffusion barrier layer has a Si content of 2.7-9 atomic % and a modulus of 290-350 GPa.

38. A semiconductor structure, comprising:
a semiconductor substrate comprising a plurality trenches or vias formed thereon, wherein the trenches or vias comprise a dielectric sidewall surface and an aspect ratio exceeding 5; and
a diffusion barrier layer comprising TiSiN conformally lining surfaces of the trenches or vias, wherein the diffusion barrier layer has a Si content of 2.7-9 atomic % and a hardness of 20-40 GPa.

39. A semiconductor structure, comprising:
a semiconductor substrate comprising a plurality trenches or vias formed thereon, wherein the trenches or vias comprise a dielectric sidewall surface and an aspect ratio exceeding 5; and
a diffusion barrier layer comprising TiSiN conformally lining surfaces of the trenches or vias, wherein the diffusion barrier layer has a Si content of 2.7-9 atomic % and a crystalline texture such that a grazing incidence X-ray spectrum exhibits a ratio of an area of under a (002) peak and a sum of areas under (111) and (222) peaks of 0.4-4.5.

40. A semiconductor structure, comprising:
a semiconductor substrate comprising a plurality trenches or vias formed thereon, wherein the trenches or vias comprise a dielectric sidewall surface and an aspect ratio exceeding 5; and
a diffusion barrier layer comprising TiSiN conformally lining surfaces of the trenches or vias, wherein the diffusion barrier layer has a Si content of 2.7-9 atomic % and a nanocrystalline structure having an average grain size of about 5.0-6.5 nm.

41. The semiconductor structure of any one of Embodiments 37-40, wherein the Si content is 2.7-7 atomic %.

42. The semiconductor structure of any one of Embodiments 37-41, wherein the aspect ratio of the trenches or vias exceeds 10.

43. The semiconductor structure of any one of Embodiments 37-42, wherein the diffusion barrier layer conformally lining the surfaces is such that a ratio of thicknesses of the diffusion barrier layer formed on lower 25% of a height of the trenches or vias and upper 25% of the height of the trenches or vias exceeds 0.8.

44. The semiconductor structure any one of Embodiments 37-43, wherein the area density of the trenches or vias is such that a ratio of a surface area on which the diffusion barrier layer is formed on to a surface area of a corresponding unpatterned semiconductor substrate exceeds 2.

45. The semiconductor structure of any one of Embodiments 37-44, wherein the ratio of the surface areas exceeds 100.

46. The semiconductor structure of any one of Embodiments 37-45, wherein a root mean square surface roughness of the diffusion barrier layer is less than about 0.3 nm.

47. The semiconductor structure of any one of Embodiments 37-46, wherein the trenches or vias further comprise a semiconductor bottom surface.

48. The semiconductor structure of any one of Embodiments 37-47, wherein the trenches or vias are is filled with tungsten or copper.

49. The semiconductor structure of any one of Embodiments 37-48, wherein the diffusion barrier has a thickness of about 1-10 nm.

50. The semiconductor structure of any one of Embodiments 37-49, wherein the trenches or vias have a width of about 10-1000 nm.

51. The semiconductor structure of any one of Embodiments 37-50, wherein the diffusion barrier layer has an electrical resistivity less than about 1600 $\mu\Omega$-cm.

Although the present invention has been described herein with reference to the specific embodiments, these embodiments do not serve to limit the invention and are set forth for illustrative purposes. It will be apparent to those skilled in the art that modifications and improvements can be made without departing from the spirit and scope of the invention.

Such simple modifications and improvements of the various embodiments disclosed herein are within the scope of the disclosed technology, and the specific scope of the disclosed technology will be additionally defined by the appended claims.

In the foregoing, it will be appreciated that any feature of any one of the embodiments can be combined or substituted with any other feature of any other one of the embodiments.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number, respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while features are presented in a given arrangement, alternative embodiments may perform similar functionalities with different components and/or sensor topologies, and some features may be deleted, moved, added, subdivided, combined, and/or modified. Each of these features may be implemented in a variety of different ways. Any suitable combination of the elements and acts of the various embodiments described above can be combined to provide further embodiments. The various features and processes described above may be implemented independently of one another, or may be combined in various ways. All possible combinations and subcombinations of features of this disclosure are intended to fall within the scope of this disclosure.

What is claimed is:

1. A method of forming a diffusion barrier comprising TiSiN, the method comprising:
    exposing a semiconductor substrate to one or more first deposition phases alternating with and without overlapping with one or more second deposition phases,
    wherein exposing the semiconductor substrate to the one or more first deposition phases comprises alternatingly exposing the semiconductor substrate to a titanium (Ti) precursor and a nitrogen (N) precursor, and
    wherein exposing the semiconductor substrate to the one or more second deposition phases comprises sequentially exposing the semiconductor substrate to the Ti precursor and a silicon (Si) precursor without an intervening exposure to the N precursor therebetween, followed by exposing the semiconductor substrate to the N precursor.

2. The method of claim 1, wherein exposing the semiconductor substrate to the first deposition phases comprises exposing the semiconductor substrate to the N precursor as a last precursor of each of the first deposition phases.

3. The method of claim 2, wherein exposing the semiconductor substrate to the second deposition phases comprises exposing the semiconductor substrate to the Ti precursor as a first precursor of each of the second deposition phases.

4. The method of claim 3, wherein exposing the semiconductor substrate to the Ti precursor as the first precursor of each of the second deposition phases immediately follows exposing the semiconductor substrate to the N precursor as the last precursor of an immediately preceding first deposition phase without an intervening exposure to any other precursor.

5. The method of claim 4, wherein exposing the semiconductor to one or more of the Ti precursor, the Si precursor and the N precursor during the one or more second deposition phases comprises under-saturating a surface of the semiconductor substrate.

6. The method of claim 1, wherein the method is carried out without aid of a plasma.

7. The method of claim 6, wherein exposing the semiconductor substrate to the one or more first deposition phases and the one or more second deposition phases comprises exposing at a pressure in a reaction chamber greater than 1 torr.

8. The method of claim 1, wherein a ratio of exposure times of exposing the semiconductor substrate to the Si precursor and exposing the semiconductor substrate to the Ti precursor in the second deposition phases is between 2 and 130.

9. The method of claim 1, wherein a ratio of exposure times of exposing the semiconductor substrate to the Ti precursor in the second deposition phases and exposing the semiconductor substrate to the Ti precursor in the first deposition phases is between 3 and 34.

10. The method of claim 1, wherein a ratio of exposure times of exposing the semiconductor substrate to the N precursor in the second deposition phases and exposing the semiconductor substrate to the N precursor in the first deposition phases is between 5 and 50.

11. A method of forming a diffusion barrier comprising TiSiN, the method comprising:
exposing a semiconductor substrate to one or more first deposition phases alternating with and without overlapping with one or more second deposition phases,
wherein exposing the semiconductor substrate to the one or more first deposition phases comprises alternatingly exposing the semiconductor substrate to a titanium (Ti) precursor and a nitrogen (N) precursor, and
wherein exposing the semiconductor substrate to the one or more second deposition phases comprises sequentially exposing the semiconductor substrate to the Ti precursor, followed by a silicon (Si) precursor, followed by the N precursor.

12. The method of claim 11, wherein the method is carried out without aid of a plasma.

13. The method of claim 12, wherein exposing the semiconductor substrate to the one or more first deposition phases and the one or more second deposition phases comprises exposing at a pressure in a reaction chamber greater than 1 torr.

14. The method of claim 11, wherein exposing the semiconductor substrate to the first deposition phases comprises exposing the semiconductor substrate to the N precursor as a last precursor of each of the first deposition phases.

15. The method of claim 14, wherein exposing the semiconductor substrate to the second deposition phases comprises exposing the semiconductor substrate to the Ti precursor as a first precursor of each of the second deposition phases.

16. The method of claim 15, wherein exposing the semiconductor substrate to the Ti precursor as the first precursor of each of the second deposition phases immediately follows exposing the semiconductor substrate to the N precursor as the last precursor of an immediately preceding first deposition phase without an intervening exposure to any other precursor.

17. The method of claim 16, wherein exposing the semiconductor to one or more of the Ti precursor, the Si precursor and the N precursor during the one or more second deposition phases comprises under-saturating a surface of the semiconductor substrate.

18. The method of claim 17, wherein exposing the semiconductor to one or more of the Ti precursor, the Si precursor and the N precursor during the one or more second deposition phases comprises under-saturating a surface of the semiconductor substrate.

19. The method of claim 11, wherein the semiconductor substrate comprises an opening having an aspect ratio exceeding 50, and wherein forming the diffusion barrier comprises lining surfaces of the opening such that a ratio of a thicknesses of the diffusion barrier formed on lower 25% of a height of the opening and upper 25% of the height of the opening exceeds 0.9.

20. The method of claim 11, wherein the diffusion barrier formed using the method has a resistivity of 2000 μΩ·cm or lower.

21. The method of claim 11, wherein the diffusion barrier formed using the method has a resistivity that is lower by at least 500 μΩ·cm compared to a diffusion barrier formed using a same method except for exposing the semiconductor substrate to the Ti precursor as part of the one or more second deposition phases.

22. The method of claim 11, wherein an exposure time of exposing the semiconductor to the Si precursor exceeds 3 sec., and an exposure time of exposing the semiconductor to the Ti precursor in the second deposition phases is shorter than 2 sec.

23. The method of claim 11, wherein exposing the semiconductor substrate to the one or more first deposition phases and the one or more second deposition phases comprises exposing at a pressure in a reaction chamber greater than 1 torr.

* * * * *